(12) United States Patent
Seshita et al.

(10) Patent No.: US 11,336,239 B2
(45) Date of Patent: May 17, 2022

(54) HIGH-FREQUENCY AMPLIFIER CIRCUIT

(71) Applicants: Kabushiki Kaisha Toshiba, Tokyo (JP); Toshiba Electronic Devices & Storage Corporation, Tokyo (JP)

(72) Inventors: Toshiki Seshita, Kawasaki Kanagawa (JP); Yasuhiko Kuriyama, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 112 days.

(21) Appl. No.: 16/883,203

(22) Filed: May 26, 2020

(65) Prior Publication Data

US 2020/0382080 A1    Dec. 3, 2020

(30) Foreign Application Priority Data

May 27, 2019  (JP) .............................. JP2019-098614
Jul. 12, 2019  (JP) .............................. JP2019-130390

(51) Int. Cl.
*H03F 1/22*     (2006.01)
*H03F 3/195*    (2006.01)
(Continued)

(52) U.S. Cl.
CPC ............. *H03F 3/195* (2013.01); *H03F 3/193* (2013.01); *H03G 3/3036* (2013.01); *H03F 1/223* (2013.01);
(Continued)

(58) Field of Classification Search
CPC ... H03F 1/22; H03F 1/223; H03F 3/68; H03F 3/72
(Continued)

(56) References Cited

U.S. PATENT DOCUMENTS 8,928,415 B2  1/2015 Cha et al.
10,033,332 B2  7/2018 Seshita et al.
(Continued)

FOREIGN PATENT DOCUMENTS

JP    2004-128704 A    4/2004
JP    2004-172956 A    6/2004
(Continued)

*Primary Examiner* — Khanh V Nguyen
(74) *Attorney, Agent, or Firm* — Allen & Overy LLP

(57) ABSTRACT

A high-frequency amplifier circuit has a source-grounded first transistor that amplifies a high-frequency input signal, a gate-grounded second transistor that further amplifies the amplified signal, a first inductor and a first reference voltage node, a second inductor connected between a first node and a second reference voltage node, a third transistor that is connected between the first node and a drain of the second transistor, is turned on at the time of selecting the first mode to transmit the amplified signal to the first node, and is turned off when selecting a second mode to disconnect the first node from the drain of the second transistor, a bypass path that bypasses the high-frequency input signal from an input node of the high-frequency input signal to the first node at the time of selecting the second mode, and a bypass switching circuit that is connected on the bypass path.

20 Claims, 57 Drawing Sheets

(51) Int. Cl.
*H03G 3/30* (2006.01)
*H03F 3/193* (2006.01)

(52) U.S. Cl.
CPC .. *H03F 2200/294* (2013.01); *H03F 2200/451* (2013.01)

(58) Field of Classification Search
USPC .................................. 330/51, 284, 295, 311
See application file for complete search history.

(56) References Cited

U.S. PATENT DOCUMENTS

| | | | |
|---|---|---|---|
| 10,256,775 | B2 | 4/2019 | Seshita et al. |
| 10,411,658 | B2 | 9/2019 | Seshita et al. |
| 2009/0298455 | A1* | 12/2009 | Takeuchi .................. H03F 3/72 455/296 |
| 2018/0145648 | A1* | 5/2018 | Ye .............................. H03F 3/72 |
| 2018/0167039 | A1 | 6/2018 | Seshita et al. |
| 2020/0389133 | A1* | 12/2020 | Hiraoka .................. H03F 3/195 |

FOREIGN PATENT DOCUMENTS

| | | |
|---|---|---|
| JP | 4095398 B2 | 6/2008 |
| JP | 2009-100025 A | 5/2009 |
| JP | 2014-27501 A | 2/2014 |
| JP | 2017-143540 A | 8/2017 |
| JP | 2018-42029 A | 3/2018 |
| JP | 2018-98768 A | 6/2018 |
| JP | 2018-201069 A | 12/2018 |

\* cited by examiner

| MODE | VDD_LNA (V) | VB1 (V) | VB2 (V) | BYP (V) | xBYP (V) |
|---|---|---|---|---|---|
| AMPLIFICATION MODE | 1.8 | 0.55 | 1.33 | 0 | 1.8 |
| BYPASS MODE | 0 | 0 | 0 | 1.8 | 0 |

FIG. 2

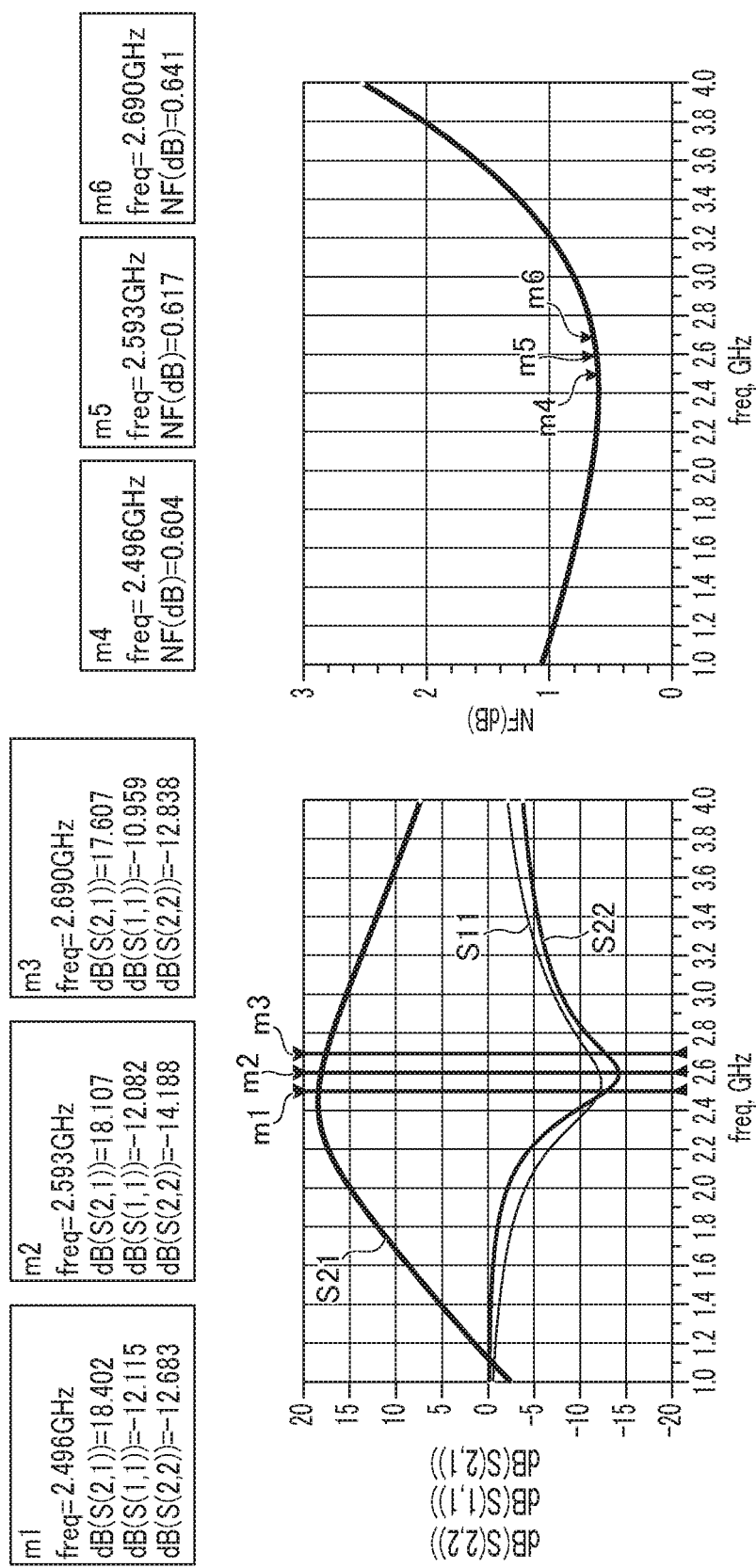

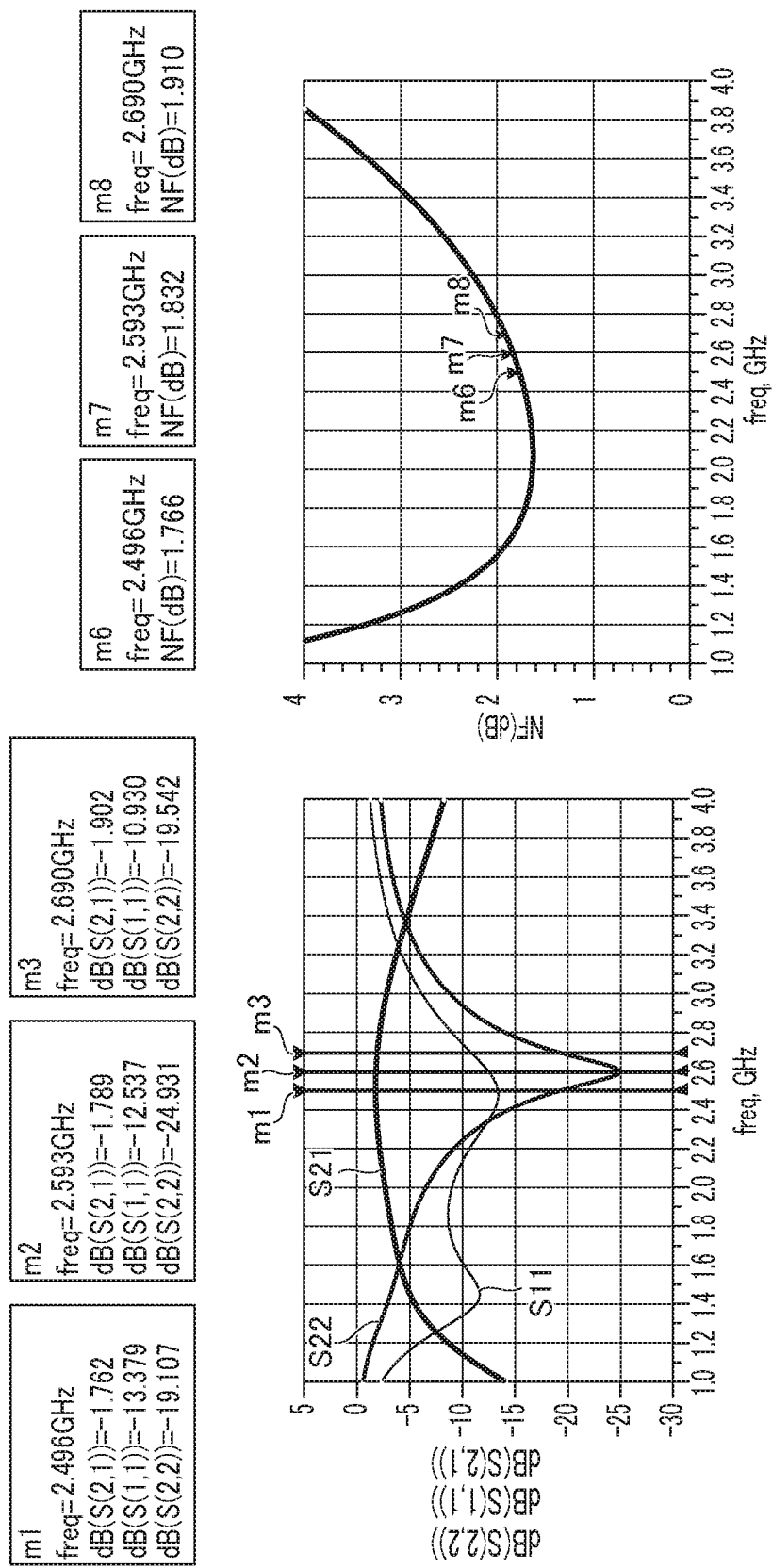

VDD=1.8V

| Vcont (V) | MODE | VDD_LNA (V) | VB1 (V) | VB2 (V) |
|---|---|---|---|---|
| 1.8 | AMPLIFICATION MODE | 1.8 | 0.55 | 1.33 |
| 0 | BYPASS MODE | 0 | 0 | 0 |

FIG.19

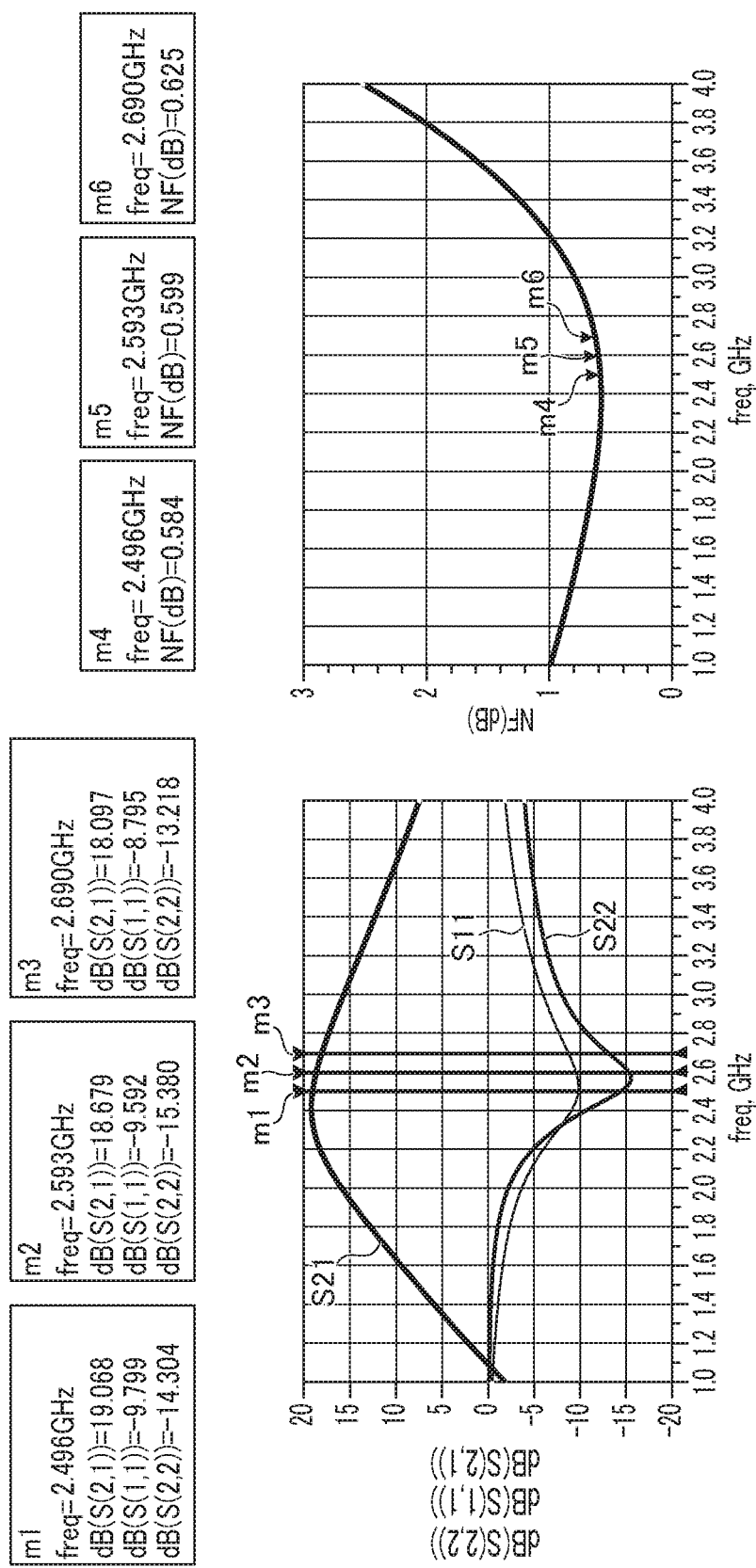

| OPERATION MODE | ACTIVE OUTPUT | VDD_LNA (V) | VB1 (V) | VB21 (V) | VB22 (V) | BYP (V) | xBYP (V) | BYP1 (V) | BYP2 (V) | Cont1 (V) | Cont2 (V) |
|---|---|---|---|---|---|---|---|---|---|---|---|
| SINGLE OUTPUT AMPLIFICATION MODE | OUT1 | 1.8 | 0.55 | 1.33 | 0 | 0 | 1.8 | 0 | 0 | 1.8 | 0 |
| | OUT2 | 1.8 | 0.55 | 0 | 1.33 | 0 | 1.8 | 0 | 0 | 0 | 1.8 |
| SPLIT OUTPUT AMPLIFICATION MODE | OUT1 & OUT2 | 1.8 | 0.55 | 1.33 | 1.33 | 0 | 1.8 | 0 | 0 | 1.8 | 1.8 |
| SINGLE OUTPUT BYPASS MODE | OUT1 | 0 | 0 | 0 | 0 | 1.8 | 0 | 1.8 | 0 | 0 | 0 |
| | OUT2 | 0 | 0 | 0 | 0 | 1.8 | 0 | 0 | 1.8 | 0 | 0 |

ABOVE POTENTIALS ARE EXAMPLES

FIG.24

| OPERATION MODE | ACTIVE OUTPUT | VB1 | VB21 | VB22 | BYP | xBYP | BYP1 | BYP2 | Cont1 | Cont2 |
|---|---|---|---|---|---|---|---|---|---|---|
| SINGLE OUTPUT AMPLIFICATION MODE | OUT1 | ON | ON | OFF | L | H | L | L | H | L |
| SINGLE OUTPUT AMPLIFICATION MODE | OUT2 | ON | OFF | ON | L | H | L | L | L | H |
| SPLIT OUTPUT AMPLIFICATION MODE | OUT1 & OUT2 | ON | ON | ON | L | H | L | L | H | H |
| SINGLE OUTPUT BYPASS MODE | OUT1 | OFF | OFF | OFF | H | L | H | L | L | L |
| SINGLE OUTPUT BYPASS MODE | OUT2 | OFF | OFF | OFF | H | L | L | H | L | L |

FIG.26

| OPERATION MODE | ACTIVE OUTPUT | VDD_LNA (V) | VB1 (V) | VB21 (V) | VB22 (V) | BYP (V) | xBYP (V) | BYP1 (V) | BYP2 (V) | Cont1 (V) | Cont2 (V) |
|---|---|---|---|---|---|---|---|---|---|---|---|
| SINGLE OUTPUT AMPLIFICATION MODE | OUT1 | 1.8 | 0.55 | 1.33 | 0 | 0 | 1.8 | 0 | 0 | 1.8 | 0 |
| | OUT2 | 1.8 | 0.55 | 0 | 1.33 | 0 | 1.8 | 0 | 0 | 0 | 1.8 |
| SPLIT OUTPUT AMPLIFICATION MODE | OUT1 & OUT2 | 1.8 | 0.55 | 1.33 | 1.33 | 0 | 1.8 | 0 | 0 | 1.8 | 1.8 |
| SINGLE OUTPUT BYPASS MODE | OUT1 | 0 | 0 | 0 | 0 | 1.8 | 0 | 1.8 | 0 | 0 | 0 |
| | OUT2 | 0 | 0 | 0 | 0 | 1.8 | 0 | 0 | 1.8 | 0 | 0 |

ABOVE POTENTIALS ARE EXAMPLES

FIG.28

| OPERATION MODE | ACTIVE OUTPUT | VDD_LMA (V) | VB1 (V) | VB21 (V) | VB22 (V) | BYP (V) | xBYP (V) | BYP1 (V) | BYP2 (V) | Cont1 (V) | Cont2 (V) | SPLT (V) | xSPLT (V) |
|---|---|---|---|---|---|---|---|---|---|---|---|---|---|
| SINGLE OUTPUT AMPLIFICATION MODE | OUT1 | 1.8 | 0.55 | 1.33 | 0 | 0 | 1.8 | 0 | 0 | 1.8 | 0 | 0 | 1.8 |
| SINGLE OUTPUT AMPLIFICATION MODE | OUT2 | 1.8 | 0.55 | 0 | 1.33 | 0 | 1.8 | 0 | 0 | 0 | 1.8 | 0 | 1.8 |
| SPLIT OUTPUT AMPLIFICATION MODE | OUT1 & OUT2 | 1.8 | 0.55 | 1.33 | 1.33 | 0 | 1.8 | 0 | 0 | 1.8 | 1.8 | 1.8 | 0 |
| SINGLE OUTPUT BYPASS MODE | OUT1 | 0 | 0 | 0 | 0 | 1.8 | 0 | 1.8 | 0 | 0 | 0 | 0 | 1.8 |
| SINGLE OUTPUT BYPASS MODE | OUT2 | 0 | 0 | 0 | 0 | 1.8 | 0 | 0 | 1.8 | 0 | 0 | 0 | 1.8 |
| SPLIT OUTPUT BYPASS MODE | OUT1 & OUT2 | 0 | 0.0 | 0.0 | 0.0 | 1.8 | 0 | 1.8 | 0 | 0 | 0 | 1.8 | 0 |

ABOVE POTENTIALS ARE EXAMPLES

FIG.30

| MODE | ACTIVE INPUT | VDD_LNA | VB11 | VB12 | Cont1 | Cont2 | BYP1 | xBYP1 | BYP2 | xBYP2 |
|---|---|---|---|---|---|---|---|---|---|---|
| GAIN MODE | LNAin1 | 1.8V | 0.55V | 0V | H | L | L | H | L | H |
| | LNAin2 | 1.8V | 0V | 0.55V | L | H | L | H | L | H |
| MODE | LNAin1 | 0V | 0V | 0V | L | L | H | L | L | H |
| | LNAin2 | 0V | 0V | 0V | L | L | L | H | H | L |

FIG.35

| MODE | VDD_LNA (V) | VB1 (V) | VB2 (V) | G1 (V) | xG1 (V) | G2 (V) | xG2 (V) | G3 (V) | xG3 (V) | BYP (V) | xBYP (V) |
|---|---|---|---|---|---|---|---|---|---|---|---|
| G0 | 1.8 | 0.55 | 1.34 | 0 | 1.8 | 0 | 1.8 | 0 | 1.8 | 0 | 1.8 |
| G1 | 1.8 | 0.55 | 1.34 | 1.8 | 0 | 0 | 1.8 | 0 | 1.8 | 0 | 1.8 |
| G2 | 1.8 | 0.50 | 1.30 | 0 | 1.8 | 1.8 | 0 | 0 | 1.8 | 0 | 1.8 |
| G3 | 1.8 | 0.50 | 1.30 | 0 | 1.8 | 0 | 1.8 | 1.8 | 0 | 0 | 1.8 |
| BYPASS | 0 | 0 | 0 | 0 | 1.8 | 0 | 1.8 | 0 | 1.8 | 1.8 | 0 |

VALUES OF VB1 AND VB2 ARE EXAMPLES

FIG.42

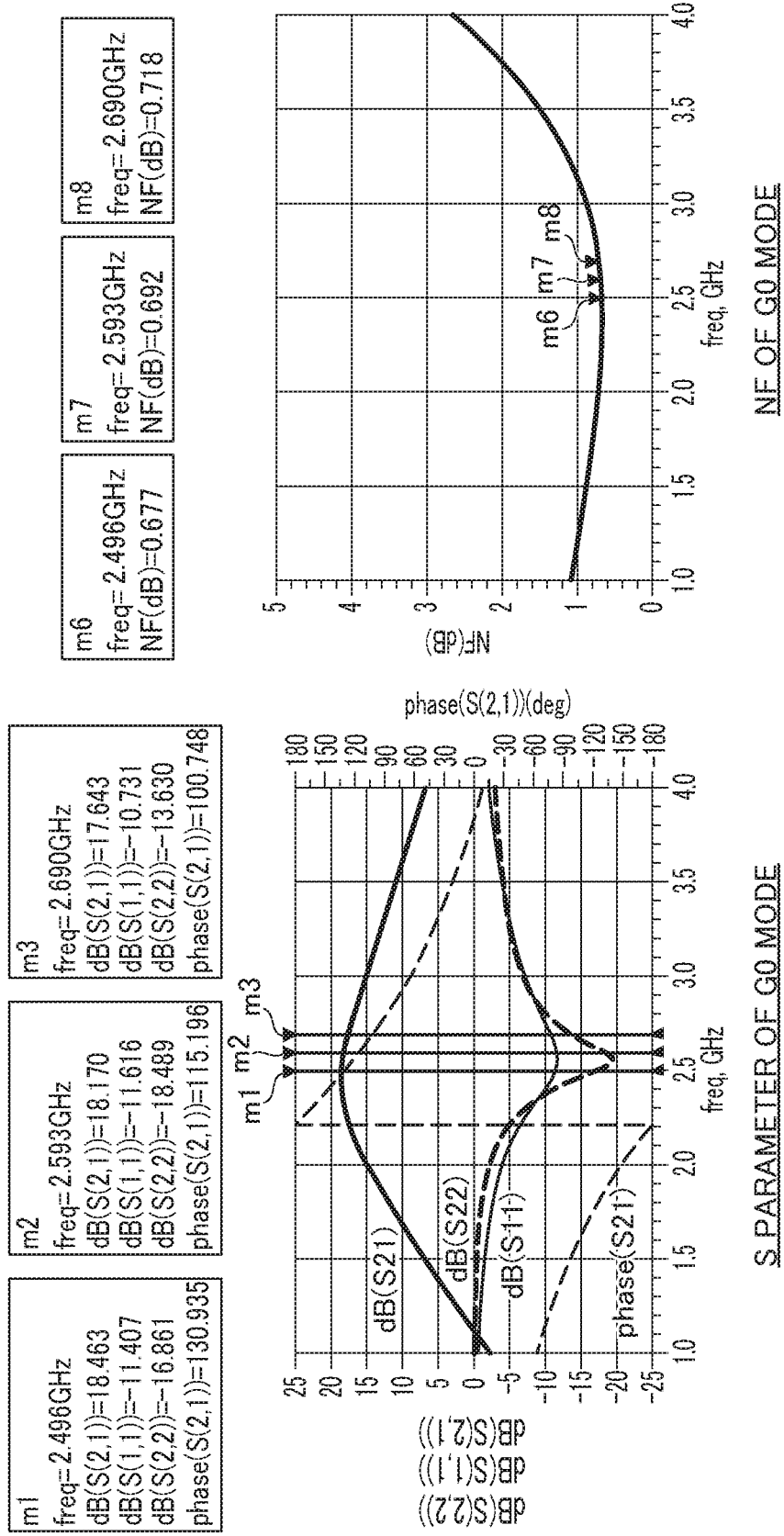
FIG. 43A S PARAMETER OF G0 MODE
FIG. 43B NF OF G0 MODE

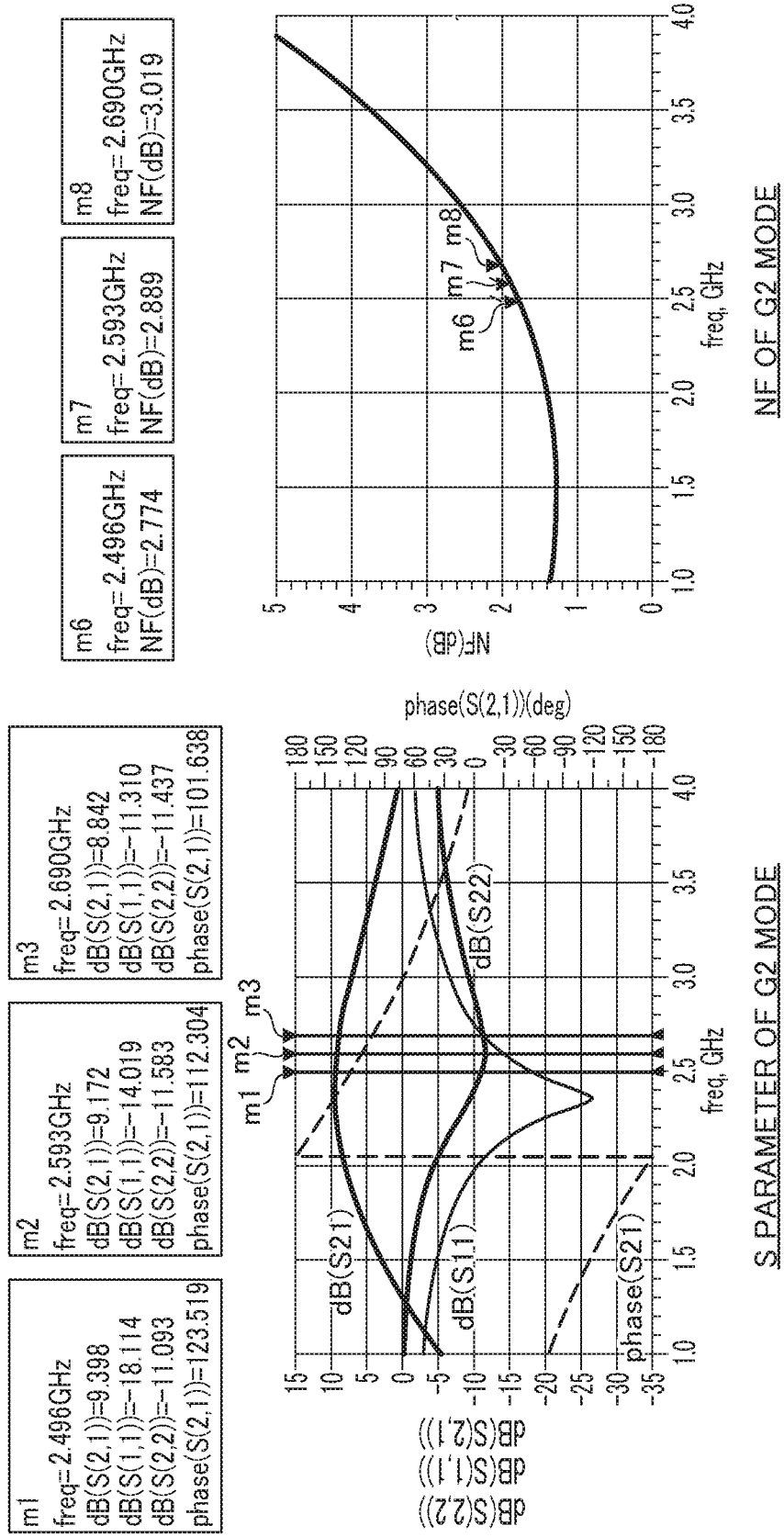

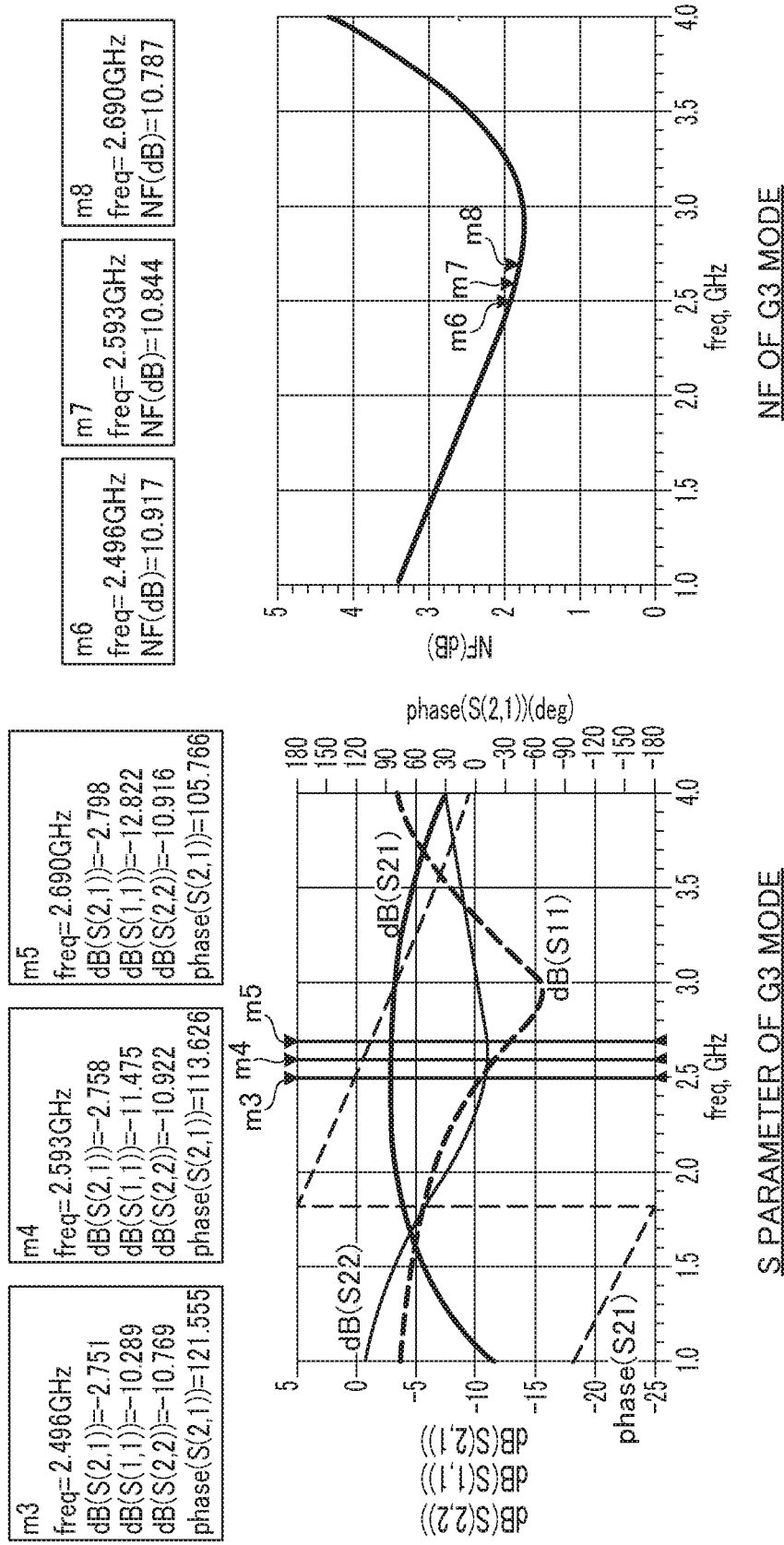

NF OF G3 MODE

S PARAMETER OF G3 MODE

| MODE | Idd_lna (mA) | S21 (dB) CENTER OF BAND | NF (dB) CENTER OF BAND | S11 (dB) WITHIN BAND | S22 (dB) WITHIN BAND | IP1 dB (dBm) fcenter | IIP3 (dBm) fcenter |
|---|---|---|---|---|---|---|---|
| G0 | 6.5 | 18 | 0.8 | ≤-10 | ≤-10 | -15 | -16 |
| G1 | 6.5 | 15 | 0.9 | ≤-10 | ≤-10 | -15 | -10 |
| G2 | 5.0 | 9 | 3.4 | ≤-10 | ≤-10 | -7 | 0 |
| G3 | 3.5 | -3 | 11 | ≤-10 | ≤-10 | 5 | 12 |
| BYPASS | 0.00 | -3 | 3.0 | ≤-10 | ≤-10 | 8 | 15 |

MAXIMUM PHASE DIFFERENCE (deg) BETWEEN GAIN MODES ≤10

GENERAL REQUIREMENT SPECIFICATIONS

FIG.50

| MODE | Idd_lna (mA) | S21 (dB) CENTER OF BAND | NF (dB) CENTER OF BAND | S11 (dB) WITHIN BAND | S22 (dB) WITHIN BAND | IP1 dB (dBm) fcenter | IIP3 (dBm) fcenter | S21 PHASE (deg) 2.496GHz | S21 PHASE (deg) 2.690GHz |
|---|---|---|---|---|---|---|---|---|---|
| G0 | 6.25 | 18.2 | 0.69 | -10.7 | -13.6 | -13.8 | -0.6 | 130.9 | 100.7 |
| G1 | 6.25 | 15.2 | 0.75 | -12.7 | -12.3 | -10.8 | 1.4 | 128.8 | 103.3 |
| G2 | 3.49 | 9.2 | 2.89 | -11.3 | -11.1 | -2.7 | 6.2 | 123.5 | 101.6 |
| G3 | 3.49 | -2.8 | 10.8 | -10.3 | -10.8 | 9.8 | 12.2 | 121.6 | 105.8 |
| BYPASS | 0.00 | -2.1 | 2.2 | -11.6 | -16.5 | 9.9 | 20.2 | — | — |

| MAXIMUM PHASE DIFFERENCE (deg) BETWEEN GAIN MODES |
|---|
| 9.4 |

IIP3 IS VALUE WHEN Pin = -50 dBm

SUMMARY OF SIMULATION RESULTS

FIG.51

| GAIN MODE | VB1 (V) | Rd (Ω) | Cout (pF) | G2 | G3 | xG3 |
|---|---|---|---|---|---|---|
| G0 | 0.55 | 5000 | 0.65 | L | L | H |
| G1 | 0.55 | 338 | 0.65 | L | L | H |
| G2 | 0.50 | 150 | 0.80 | H | L | H |
| G3 | 0.48 | 300 | 0.80 | L | H | L |

FIG.56

HIGH-FREQUENCY AMPLIFIER CIRCUIT

CROSS REFERENCE TO RELATED APPLICATIONS

This application is based upon and claims the benefit of priority from the prior Japanese Patent Applications No. 2019-98614 filed on May 27, 2019, and No. 2019-130390 filed on Jul. 12, 2019, the entire contents of which are incorporated herein by reference.

FIELD

Embodiments described herein relate generally to a high-frequency amplifier circuit.

BACKGROUND

In recent years, an examination on replacement of a high-frequency low-noise amplifier (LNA) from an SiGe bipolar process (hereinafter, referred to as a SiGe process) with a silicon on insulator (SOI) CMOS process (hereinafter, referred to as an SOI process) has been conducted. Since the SOI process is less expensive than the SiGe process and a parasitic capacitance of a MOS transistor formed in the SOI process is small, a power loss of a high-frequency signal is small. Thus, when the SOI process is used, a high-frequency switch and the high-frequency low-noise amplifier can be formed on the same SOI substrate without deteriorating electrical characteristics, and can be formed into one chip. Accordingly, integration can be improved.

BRIEF DESCRIPTION OF THE DRAWINGS

FIG. 2 is a diagram illustrating a specific example of voltages generated by a bias circuit;

FIG. 6A is a diagram illustrating S parameters in an amplification mode of an LNA according to a second embodiment, and FIG. 6B is a diagram illustrating noise figures NF in the amplification mode of the LNA according to the second embodiment;

FIG. 13A is a diagram illustrating S parameters in the bypass mode of the LNA of FIG. 10, and FIG. 13B is a diagram illustrating noise figures NF in the bypass mode of the LNA of FIG. 10;

FIG. 19 is a diagram illustrating a voltage VDD_LNA and voltage value of bias voltages for modes of the LNA of FIG. 18;

FIG. 20A is a diagram illustrating S parameters in the amplification mode of the LNA of FIG. 18, and FIG. 20B is a diagram illustrating noise figures NF in the amplification mode of the LNA of FIG. 18;

FIG. 24 is a diagram illustrating bias voltages and voltage values of bias signals in modes of the LNA of FIG. 23;

FIG. 26 is a diagram illustrating bias voltages and voltage values of bias signals in modes of the LNA of FIG. 25;

FIG. 28 is a diagram illustrating bias voltages and voltage values of bias signals in modes of the LNA of FIG. 27;

FIG. 30 is a diagram illustrating the bias voltages and the voltage value of the bias signal in modes of the LNA 1 of FIG. 29;

FIG. 35 is a diagram illustrating bias voltages and voltage values of bias signals in modes of the LNA of FIG. 34;

FIG. 42 is a diagram illustrating voltage values input to gates of transistors of FIGS. 40 and 41 in first to fourth gain modes and a bypass mode;

FIGS. 43A and 43B are diagrams illustrating simulation results of S parameters and NFs in a G0 mode;

FIGS. 45A and 45B are diagrams illustrating simulation results of S parameters and NFs in a G2 mode;

FIGS. 46A and 46B are diagrams illustrating simulation results of S parameters and NFs in a G3 mode;

FIG. 50 is a diagram representing general requirement specifications for the gain modes;

FIG. 51 is a diagram representing simulation results of the present embodiment;

FIG. 56 is a diagram illustrating various values set in the LNA of FIG. 55; and

DETAILED DESCRIPTION

Figure 1:
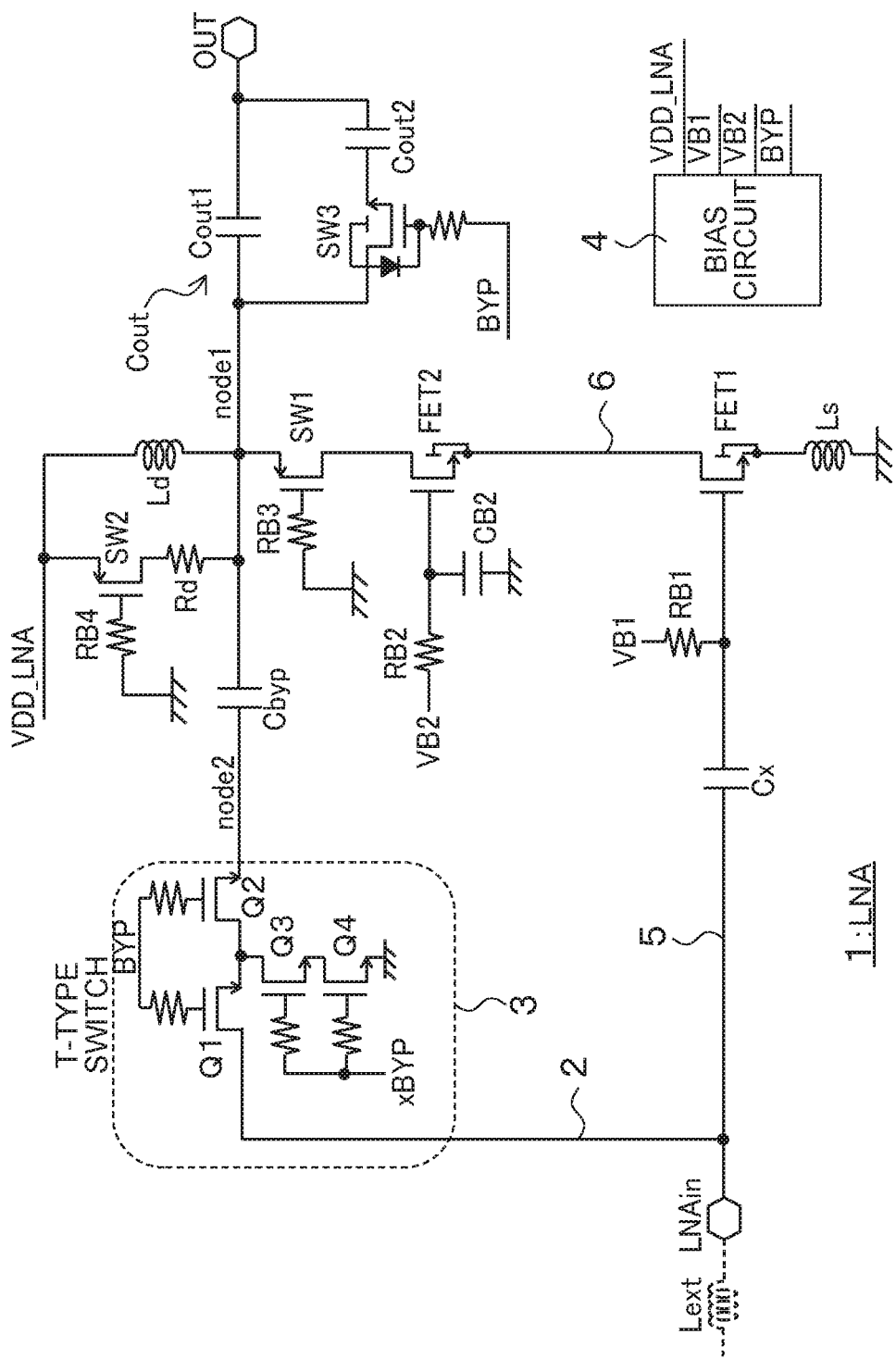
FIG. 1 is a circuit diagram of a high-frequency low-noise amplifier circuit according to a first embodiment.

According to one embodiment, a high-frequency amplifier circuit has:

a source-grounded first transistor that amplifies a high-frequency input signal at the time of selecting a first mode;

a gate-grounded second transistor that further amplifies the signal amplified by the first transistor;

a first inductor that is connected between a source of the first transistor and a first reference voltage node;

a second inductor that is connected between a first node through which the signal amplified by the second transistor passes and a second reference voltage node at the time of selecting the first mode;

a third transistor that is connected between the first node and a drain of the second transistor, is turned on at the time of selecting the first mode to transmit the signal amplified by the second transistor to the first node, and is turned off at the time of selecting a second mode to disconnect the first node from the drain of the second transistor;

a bypass path that bypasses the high-frequency input signal from an input node of the high-frequency input signal to the first node at the time of selecting the second mode; and a bypass switching circuit that is connected on the bypass path, blocks the high-frequency input signal from the bypass path at the time of selecting the first mode, and conducts the high-frequency input signal onto the bypass path at the time of selecting the second mode, wherein the bypass switching circuit comprises a fourth transistor and a fifth transistor that are cascode-connected on the bypass path, and a sixth transistor that is connected between a connection node between the fourth transistor and the fifth transistor, and the first reference voltage node, the fourth transistor and the fifth transistor are turned off at the time of selecting the first mode, and are turned on at the time of selecting the second mode, and the sixth transistor is turned on at the time of selecting the first mode, and is turned off at the time of selecting the second mode.

Hereinafter, embodiments will be described with reference to the drawings. Although some components will be omitted, changed, or simplified for the sake of easy understanding and convenience in illustration in the present specification and the accompanying drawings, the technical contents which can expect the same functions will also be included in the present embodiment and be interpreted. In the drawings attached to the present specification, scales and vertical and horizontal dimension ratios are appropriately changed and exaggerated from actual scales and dimension ratios for the sake of illustration and easy understanding.

First Embodiment

FIG. 1 is a circuit diagram of a high-frequency low-noise amplifier circuit (hereinafter, referred to as an LNA) 1 according to a first embodiment. The LNA 1 of FIG. 1 can be disposed on, for example, an SOI substrate. A peripheral circuit of the LNA 1, for example, an antenna switch and the LNA 1 may be arranged on the same SOI substrate. For example, the LNA 1 of FIG. 1 is used in a wireless device such as a mobile phone or a smartphone, but is used regardless of the purpose of use and the implementation location. The LNA 1 of FIG. 1 can arbitrarily switch between an amplification mode (gain mode or first mode) for amplifying a high-frequency input signal and a bypass mode (second mode) for bypassing the high-frequency input signal without amplifying the signal. A plurality of gain modes for finely adjusting a gain of the amplification mode may be provided. In the present specification, the LNA 1 capable of switching between two modes of the amplification mode and the bypass mode will be described as the simplest configuration.

The LNA 1 of FIG. 1 includes a source-grounded transistor (first transistor) FET1, a gate-grounded transistor (second transistor) FET2, an inductor (first inductor) Ls, an inductor (second inductor) Ld, a transistor (third transistor)

SW1, an output matching resistor Rd, an output matching capacitor Cout, a bypass path 2, a bypass switching circuit 3, and a bias circuit 4.

An input signal path 5 is connected to a gate of the transistor FET1. An input node LNAin to which a high-frequency input signal is input and a capacitor Cx are connected on the input signal path 5. An external inductor Lext is externally connected to the input node LNAin, and the high-frequency input signal is input to the input node LNAin via the external inductor Lext. In the present embodiment, it is assumed that the LNA 1 of FIG. 1 is formed on the SOI substrate to be formed into a chip, and since there is no space enough to form the external inductor Lext within the chip, the external inductor is externally attached. When there is a sufficient space within the chip, the external inductor Lext may be built in the chip.

The high-frequency input signal input to the input node LNAin via the external inductor Lext is input to the gate of the transistor FET1 via the capacitor Cx. The capacitor Cx is provided in order to cut a DC component of the high-frequency input signal. A bias voltage VB1 is supplied to the input signal path 5 via a resistive element RB1. The bias voltage VB1 is generated by the bias circuit 4.

A source of the transistor FET1 is grounded, and the inductor Ls is connected between the source of the transistor FET1 and a first reference voltage node GND. In the present specification, the first reference voltage node GND is set to a ground potential (0 V), but may be a fixed voltage other than 0 V.

The transistor FET2 is cascode-connected to the transistor FET1. More specifically, a drain of the transistor FET1 is connected to a source of the transistor FET2. A bias voltage VB2 is input to a gate of the transistor FET2 via a resistive element RB2. The bias voltage VB2 is generated by the bias circuit 4. A capacitor CB2 is connected between the gate of the transistor FET2 and the first reference voltage node GND. Since both a capacitance of the capacitor CB2 and a resistance value of the resistor RB2 are sufficiently large, the transistor FET2 functions as a gate-grounded amplifier.

A drain of a transistor SW1 functioning as a signal propagation switch is connected to a drain of the transistor FET2. The transistor SW1 according to the first embodiment is a p-type MOSFET, and a resistive element RB3 is connected between a gate thereof and GND. A source of the transistor SW1 is connected to a first node node1. One ends of the inductor Ld, the output matching resistor Rd, a capacitor (third capacitor) Cbyp, and the output matching capacitor Gout, and a source of a transistor SW3 are connected to the first node node1. In the present specification, a path from the first node node1 to the first reference voltage node GND through the transistors SW1, FET2, and FET1, and the inductor Ls is referred to as an amplified signal path 6.

The transistor SW1 is turned on in the amplification mode to transmit a signal amplified by the transistor FET2 to the first node node1, and is turned off in the bypass mode to disconnect the first node node1 from the drain of the transistor FET2. Accordingly, in the bypass mode, the amplified signal path 6 formed by the transistors FET1 and FET2 is disconnected from the first node node1, and there is no concern that the high-frequency input signal that has passed through the bypass path 2 leaks to the amplified signal path 6.

The output matching resistor Rd is connected in parallel with the inductor Ld when a transistor SW2 is turned on, and is opened when the transistor SW2 is turned off. The transistor SW2 is a p-type MOSFET, and a resistive element RB4 is connected between a gate thereof and GND. A source of the transistor SW2 is connected to a second reference voltage node VDD_LNA. The second reference voltage node VDD_LNA is 1.8 V in the amplification mode, and is 0 V in the bypass mode. Therefore, the transistor SW2 is turned on in the amplification mode, and is turned off in the bypass mode. Therefore, the output matching resistor Rd and the inductor Ld are connected in parallel in the amplification mode, and only the inductor Ld is connected between the first node node1 and the second reference voltage node VDD_LNA in the bypass mode.

The output matching capacitor Cout includes a capacitor (first capacitor) Cout1 connected between the first node node1 and an output node OUT. The transistor SW3 and a capacitor (second capacitor) Cout2 are connected in series with both ends of the capacitor Cout1. The transistor SW3 is turned on in the bypass mode, and is turned off in the amplification mode. Thus, the capacitor Cout1 and the capacitor Cout2 are connected in parallel between the first node node1 and the output node in the bypass mode, and only the capacitor Cout1 is connected between the first node node1 and the output node in the amplification mode. As stated above, a capacitance of the output matching capacitor Cout is changed between the amplification mode and the bypass mode.

The LNA 1 of FIG. 1 includes the bypass path 2 that bypasses the high-frequency input signal from the input node LNAin to the first node node1 in the bypass mode. In the bypass mode, the high-frequency input signal is transmitted to the output node OUT through the bypass path 2 and the first node node1 without being amplified by the transistors FET1 and FET2.

The bypass switching circuit 3 is connected on the bypass path 2. The bypass switching circuit 3 blocks the high-frequency input signal from the bypass path 2 in the amplification mode, and bypasses the high-frequency input signal such that the high-frequency input signal passes through the bypass path 2 in the bypass mode.

More specifically, the bypass switching circuit 3 can be a T-type switch including at least three transistors Q1 to Q3. The transistor (fourth transistor) Q1 and the transistor (fifth transistor) Q2 are cascode-connected on the bypass path 2. The transistor Q3 (sixth transistor) is a shunt switch, and is connected between a connection node between the transistors Q1 and Q2 and the first reference voltage node GND. Although it has been described in FIG. 1 that a shunt switch in which two transistors Q3 and Q4 are cascode-connected is provided between the connection node between the transistors Q1 and Q2 and the first reference voltage node GND, only the transistor Q3 may be connected. One measure for evaluating linearity is a 1 dB input compression point (IP1 dB). IP1 dB represents an input power level at which the gain is decreased by 1 dB, and when the high-frequency input signal is bypassed, IP1 dB is desirably as large as possible. IP1 dB can be improved by increasing the number of stages of transistors cascode-connected between the connection node between the transistors Q1 and Q2 and the first reference voltage node GND.

A bypass signal BYP is input to gates of the transistors Q1 and Q2. Therefore, the transistors Q1 and Q2 are turned on in the bypass mode, and conduct the high-frequency input signal from the input node LNAin to the bypass path 2. An inverted signal xBYP of the bypass signal is input to gates of the transistors Q3 and Q4. Therefore, even though the transistor Q3 is turned on in the amplification mode and the high-frequency input signal leaks from the transistor Q1 in the turned-off state, since the transistors Q3 and Q4 are turned on, the high-frequency input signal passes through the transistors Q3 and Q4, and flows to the first reference voltage node GND. Therefore, there is no concern that the high-frequency input signal propagates on the bypass path 2 in the amplification mode.

The bias circuit 4 generates the bias voltages VB1 and VB2. The resistors RB1 and RB2 connected to the gates of the transistors FET1 and FET2 are provided in order to prevent the high-frequency input signal from being introduced to the bias circuit 4. FIG. 2 is a diagram illustrating a specific example of the voltages generated by the bias circuit 4. As illustrated in FIG. 2, in the amplification mode, the bias voltage VB1 is set to, for example, 0.55 V, the bias voltage VB2 is set to, for example, 1.33 V, the second reference voltage VDD_LNA is set to, for example, 1.8 V, and the bypass signal BYP is set to, for example, 0 V. In the bypass mode, the bias voltages VB1 and VB2 and the second reference voltage VDD_LNA are all set to 0 V, and the bypass signal BYP is set to 1.8 V.

As stated above, the LNA 1 of FIG. 1 disconnects the bypass path 2 by the bypass switching circuit 3 in the amplification mode. Therefore, the high-frequency input signal input to the input node LNAin is input to the gate of the transistor FET1, and is amplified. The amplified signal output from the drain of the transistor FET1 is further amplified by the transistor FET2. In the amplification mode, since the transistor SW1 is turned on, the amplified signal of the transistor FET2 is transmitted to the first node node1, s impedance-matched by the inductor Ld, the output matching resistor Rd, and the output matching capacitor Cout, and is output from the output node.

Meanwhile, in the LNA 1 of FIG. 1, in the bypass mode, the transistors Q1 and Q2 within the bypass switching circuit 3 are turned on, and the transistors Q3 and Q4 are turned off. Thus, the high-frequency input signal from the input node LNAin passes through the transistors Q1 and Q2 within the bypass switching circuit 3, and propagates on the bypass path 2. In the bypass mode, the transistor SW1 is turned off. Thus, the amplified signal path 6 that is enable in the amplification mode is disconnected from the first node node1. Accordingly, even when the high-frequency signal having a large signal amplitude propagates through the bypass path 2, there is no concern that the transistors FET1 and FET2 are erroneously operated due to the influence.

Figures 3A, 3B:
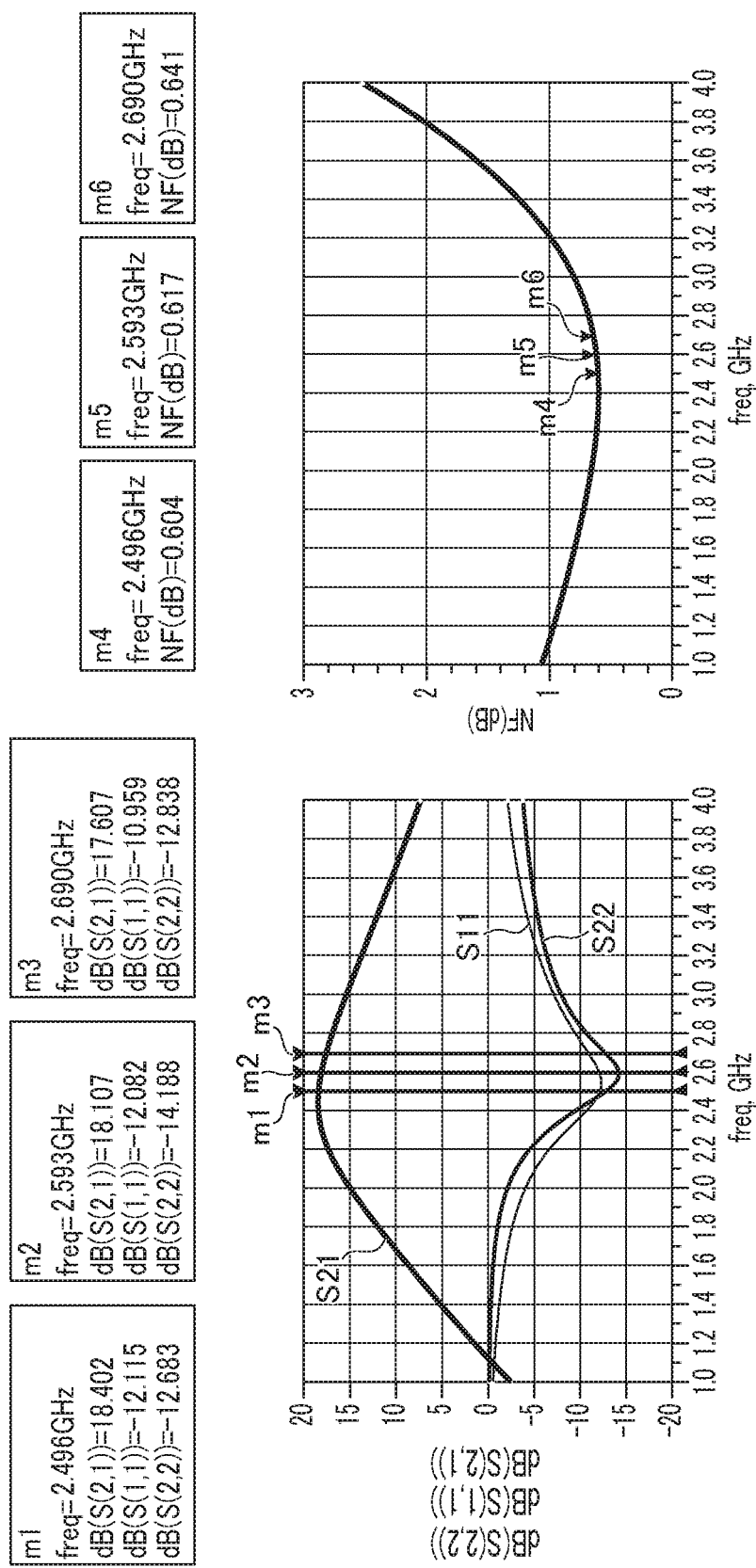
FIG. 3A is a diagram illustrating S parameters in an amplification mode of an LNA of FIG. 1.
FIG. 3B is a diagram illustrating noise figures NF in the amplification mode of the LNA in FIG. 1.
Figures 4A, 4B:
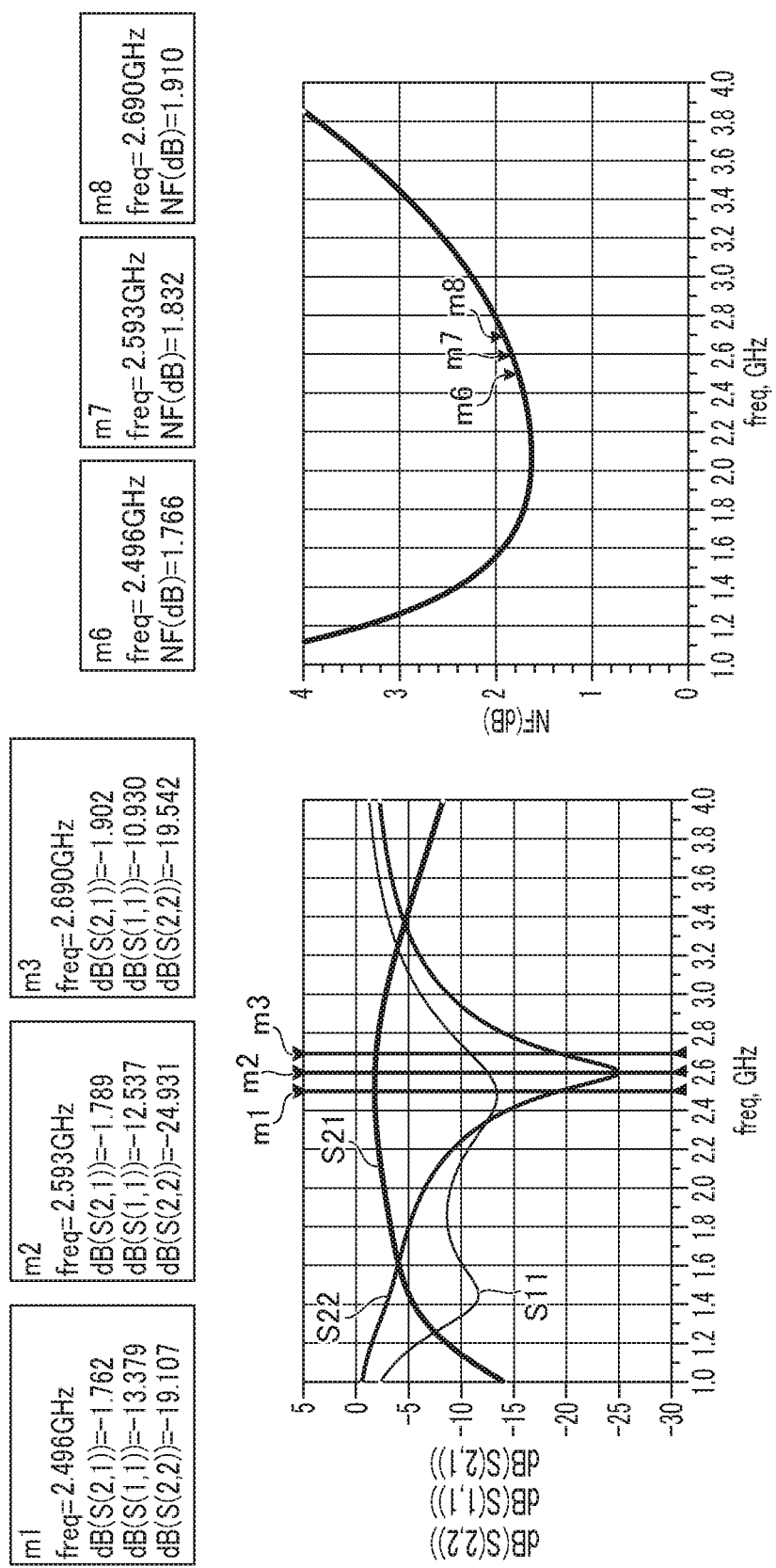
FIG. 4A is a diagram illustrating S parameters in a bypass mode of the LNA of FIG. 1.
FIG. 4B is a diagram illustrating noise figures NF in the bypass mode of the LNA in FIG. 1.
Figure 5:
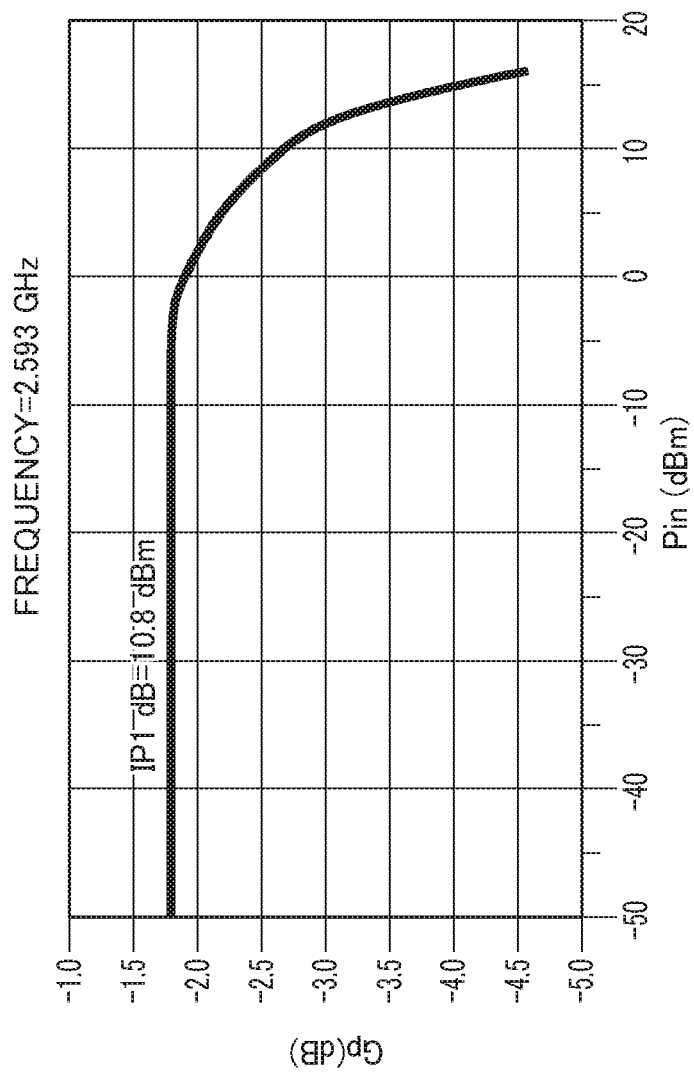
FIG. 5 is a diagram illustrating a relationship between an input power and a gain in the bypass mode of the LNA of FIG. 1.

FIGS. 3A to 5 are diagrams illustrating simulation results for the LNA 1 of FIG. 1. FIG. 3A is a diagram illustrating S parameters in the amplification mode of the LNA 1 of FIG. 1, and FIG. 3B is a diagram illustrating noise figures NF in the amplification mode of the LNA 1 of FIG. 1. FIG. 4A is a diagram illustrating S parameters in the bypass mode of the LNA 1 of FIG. 1, and FIG. 4B is a diagram illustrating noise figures NE in the bypass mode of the LNA 1 of FIG. 1. A horizontal axis of these diagrams is a frequency [GHz]. A vertical axis in FIGS. 3A and 4A is an S parameter value [dB], and a vertical axis in FIGS. 3B and 4B is a noise figure NF [dB]. FIGS. 3A and 3B illustrate simulation results when a current Idd_Ina flowing in the amplified signal path 6 is 6 mA. Since FIGS. 4A and 4B are in the bypass mode, the current Idd_Ina is inevitably 0 mA. FIG. 5 illustrates a relationship between an input power and a gain in the bypass mode at a frequency of 2.593 GHz.

In these diagrams, marks are attached to 2.496 GHz, 2.593 GHz, and 2.690 GHz which are frequency bands of band 41 which is one of Long Term Evolution (LTE) bands. The LNA 1 according to the present embodiment is designed on the assumption that the LNA is used in the frequency band of the band 41.

As illustrated in FIGS. 3A and 3B, the gain is about 18 dB and the noise figure NF is 0.641 dB in the used frequency band (2.496 GHz to 2.69 GHz). The worst values within the used frequency band of S11 and S22 are favorable at −10.9 dB and −12.6 dB, respectively. The reason why such a favorable noise figure NF can be obtained is that it is not necessary to provide the bypass switch at a previous stage of the LNA 1. In the LNA 1 of FIG. 1, a bias current flowing through the transistor FET1 in the amplification mode is about 6 mA.

As illustrated in FIGS. 4A and 4B, an insertion loss in the bypass mode is 2.0 dB or less, the noise figure NF is 2 dB or less, S11 is −10.9 dB or less, and S22 is −19.1 dB or less.

FIG. 5 is a diagram illustrating a relationship between an input power Pin and a gain Gp in the bypass mode of the LNA 1 of FIG. 1. In FIG. 5, a horizontal axis represents an input power Pin [dBm], and a vertical axis represents a gain Gp [dB]. In FIG. 5, IP1 dB is 10.8 dBm which exceeds the general requirement of 10 dB, and is a favorable result.

As described above, since the LNA 1 according to the first embodiment includes the bypass switching circuit 3 in which the T-type switch is included within the bypass path 2, it is not necessary to provide the bypass switch at the previous stage of the LNA 1, and thus, the noise figure NF can be improved. The bypass switching circuit 3 includes the shunt switch including the transistors Q3 and Q4 connected between the bypass path 2 and the first reference voltage node GND in addition to the transistors Q1 and Q2 connected on the bypass path 2. Due to the use of this shunt switch, there is no concern that the high-frequency input signal propagates through the bypass path 2 in the amplification mode, and the isolation between the input node LNAin and the first node node1 is improved.

Second Embodiment

An LNA 1 according to the second embodiment has the same circuit configuration as the LNA 1 of FIG. 1, but is different from the LNA 1 of FIG. 1 in that the capacitance of each of the capacitor Cbyp, the capacitor Cout1, and the capacitor Cout2 satisfies the following Inequality (1).

$$1.5 \leq Cbyp/(Cout1+Cout2) \leq 2 \quad (1)$$

As described above, in the present embodiment, the capacitance of each of the capacitors Cout1, Cout2, and Cbyp is set such that a value obtained by dividing the capacitance of the capacitor Cbyp on the bypass path 2 by a total capacitance value of the capacitors Cout1 and Cout2 constituting the output matching capacitor Cout is 1.5 or more and 2 or less.

FIGS. 6A to 9 are diagrams illustrating simulation results for the LNA 1 according to the second embodiment. FIG. 6A is a diagram illustrating S parameters in the amplification mode of the LNA 1 according to the second embodiment, and FIG. 6B is a diagram illustrating noise figures NF in the amplification mode of the LNA 1 according to the second embodiment. FIG. 7A is a diagram illustrating S parameters in the bypass mode of the LNA 1 according to the second embodiment, and FIG. 7B is a diagram illustrating noise figures NF in the bypass mode of the LNA 1 according to the second embodiment. A horizontal axis of these diagrams is a frequency [GHz]. A vertical axis in FIGS. 6A and 7A is an S parameter value [dB], and a vertical axis in FIGS. 6B and 7B is a noise figure NF [dB].

Figures 7A, 7B:
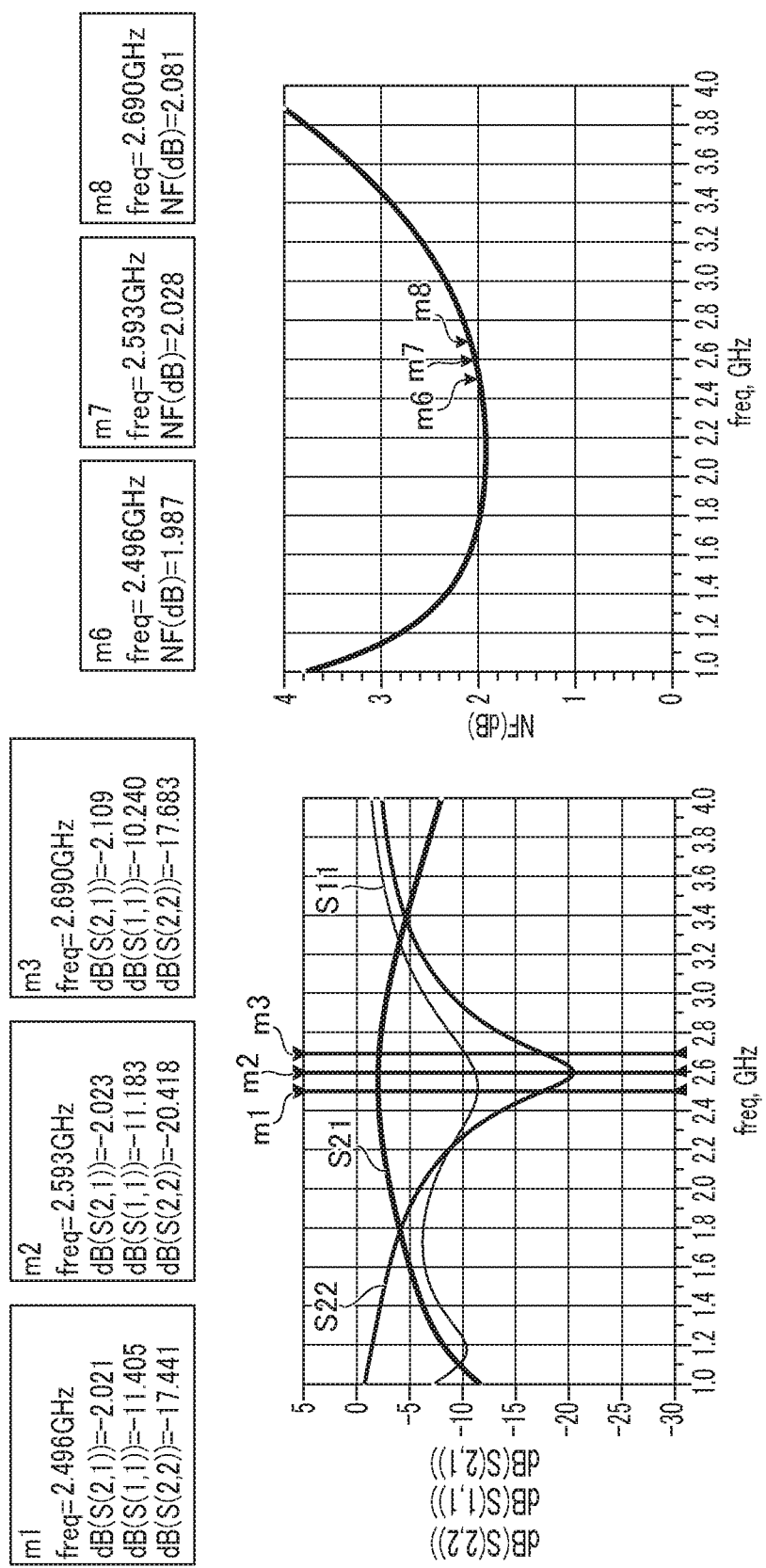
FIG. 7A is a diagram illustrating S parameters in a bypass mode of the LNA according to the second embodiment.
FIG. 7B is a diagram illustrating noise figures NF in the bypass mode of the LNA according to the second embodiment.
Figure 8:
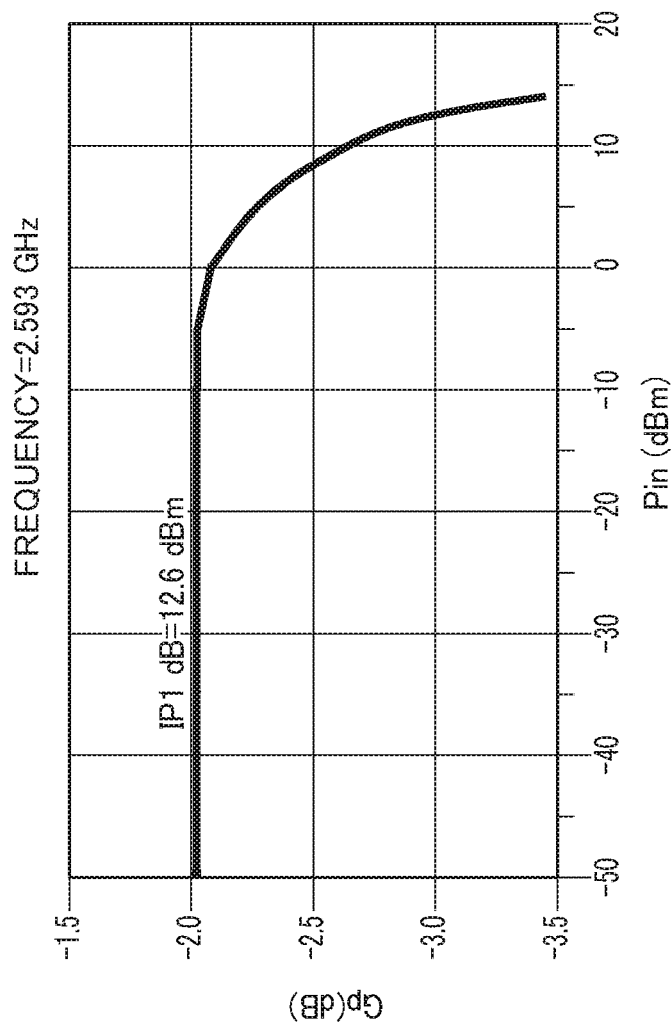
FIG. 8 is a diagram illustrating a relationship between an input power and a gain in the bypass mode of the LNA according to the second embodiment.

FIG. 8 is a diagram illustrating a relationship between an input power Pin and a gain Gp in the bypass mode of the LNA 1 according to the second embodiment. In FIG. 8, a horizontal axis represents an input power Pin [dBm], and a vertical axis represents a gain Gp [dB], In FIG. 8, IP1 dB is 12.6 dBm which exceeds the general requirement of 10 dB, and is a favorable result. The used frequency band (2.496 GHz to 2.69 GHz) in FIGS. 6 and 7 is the same as that in FIGS. 3 and 4. FIGS. 6A and 6B illustrate simulation results when a current Idd_Ina flowing in the amplified signal path 6 is 6 mA. Since FIGS. 7A and 7B are in the bypass mode, the current Idd_Ina is inevitably 0 mA. FIG. 8 illustrates a relationship between an input power and a gain in the bypass mode at a frequency of 2.593 GHz. An example in which Cbype=1.6 pF and Cout1+Cout2=0.92 pF are satisfied in the bypass mode is illustrated.

In FIGS. 6A and 6B, the gain is about 18 dB and the noise figure NF is 0.641 dB or less in the used frequency band in the amplification mode. Since it is not necessary to provide the bypass switch at the previous state of the LNA 1, the LNA 1 according to the second embodiment can also obtain the favorable NF. The worst values of S11 and S22 in the used frequency band in the amplification mode are favorable at −10.9 dB and −12.6 dB, respectively.

In FIGS. 7A and 7B, an insertion loss in the bypass mode is 2.11 dB or less, a noise figure NF is 2.1 dB or less, S11 is −10.2 dB or less, and S22 is −17.4 dB or less. These values are all favorable. In FIG. 8, IP1 dB is 12.6 dBm, and has a sufficient margin for 8 dBm which is the general requirement.

As illustrated in FIGS. 7 and 8, the favorable results of S11, S22, and IP1 dB in the bypass mode are the results of careful setting of the capacitors Cbyp and Cout2. The capacitor Cout1 together with the resistive element Rd and the inductor Ld is optimized in the design of the amplification mode. For example, in the LNA 1 used for the present simulation, the capacitor Cout1 was set to 0.57 pF.

Figure 9:
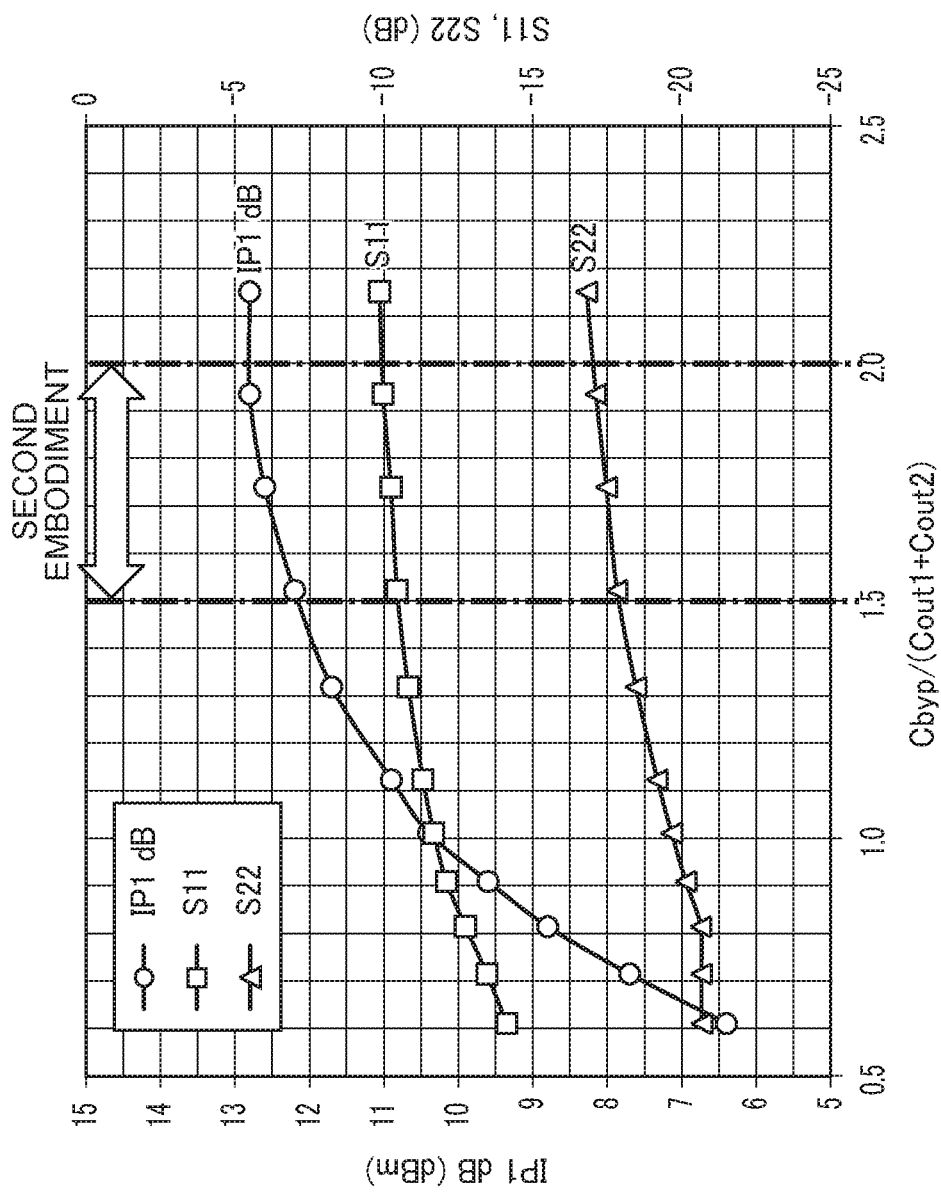
FIG. 9 is a diagram illustrating a relationship between IP1 dB, S11, S22, and Cbyp/(Cout1+Cout2) in the bypass mode.

FIG. 9 is a diagram illustrating a relationship between IP1 dB, S11, S22, and Cbyp/(Cout1+Cout2) in the bypass mode. As described above, Cout1=0.57 pF. IP1 dB is increased when Cbyp/(Cout1+Cout2) is increased, but an increase rate becomes dull when Cbyp/(Cout1+Cout2) exceeds 1.5. IP1 dB is saturated when Cbyp/(Cout1+Cout2) exceeds 2, and S11 exceeds the general requirement value of −10 dB. From the aforementioned result, the capacitors Cbyp, Cout1, and Cout2 are set so as to satisfy Inequality (1) in the present embodiment. It is desirable that S11 and S22 are inherently small. However, when S11 and S22 are small, IP1 dB which is desirably large is also small as illustrated in FIG. 9, As stated above, S11, S22, and IP1 dB are in a trade-off relationship. An arrow range of FIG. 9 is a range in which the capacitance satisfies Inequality (1) described above. The capacitance of each of the capacitors Cbyp, Cout1, and Cout2 is set so as to satisfy Inequality (1), and thus, IP1 dB can be set as large as possible without decreasing S11 and S22.

As described above, in the second embodiment, since the capacitors Cbyp, Cout1, and Cout2 are optimized so as to satisfy Inequality (1), IP1 dB, S11, and S22 in the bypass mode of the LNA 1 can be set to favorable values.

Third Embodiment

Figure 10:
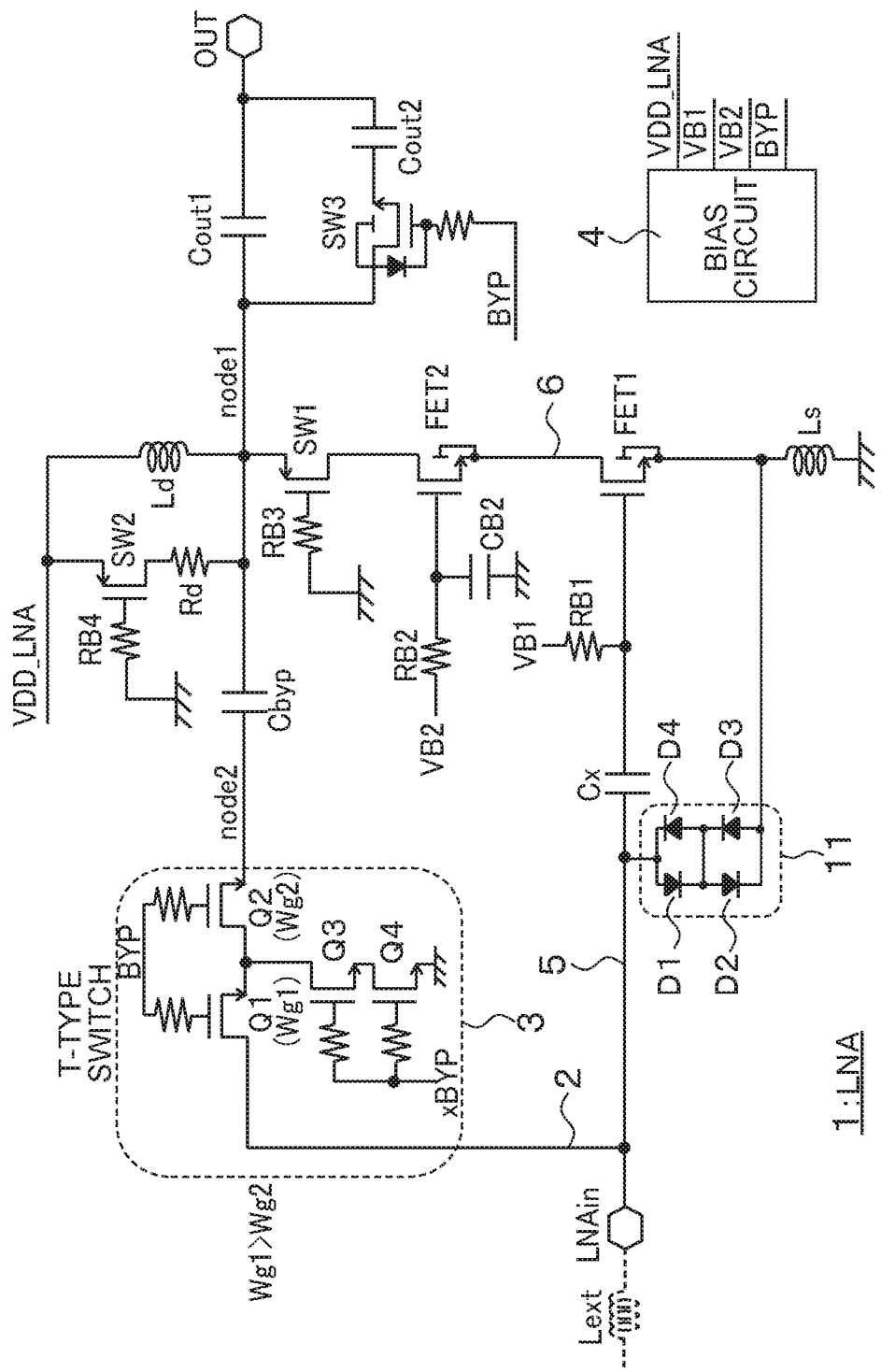
FIG. 10 is a circuit diagram of an LNA according to a third embodiment.

FIG. 10 is a circuit diagram of an LNA 1 according to a third embodiment. In the LNA 1 of FIG. 10, the same reference numerals will be assigned to the circuit components common to the LNA 1 of FIG. 1, and differences will be mainly described below. The LNA 1 of FIG. 10 includes an electrostatic discharge (ESD) protection circuit 11 connected between the input signal path 5 and one end of the inductor Ls. The ESD protection circuit 11 is provided in order to increase ESD resistance against a surge voltage input to the input node LNAin. The ESD protection circuit 11 may be provided in the LNA 1 of FIG. 1.

The ESD protection circuit 11 of FIG. 10 includes two diodes D1 and D2 which are connected in series and have a rectifying action from the input signal path 5 to one end of the inductor Ls, and two diodes D3 and D4 which are connected in series and have a rectifying action from one end of the inductor Ls to the input signal path 5. The number of diodes connected in series is arbitrary.

Normally, one end of the ESD protection circuit 11 is connected to the first reference voltage node GND. However, in the LNA 1 of FIG. 10, one end of the ESD protection circuit 11 is connected to one end of the inductor Ls, specifically, a connection node between one end of the inductor Ls and the source of the transistor FET1 instead of the first reference voltage node GND. One end of the ESD protection circuit 11 is connected to one end side of the inductor Ls instead of the first reference voltage node GND, and thus, S11 can be improved. The ESD protection circuit 11 also functions as a clamp circuit when the high-frequency input signal having the large amplitude is input to the input node LNAin. However, one end of the ESD protection circuit 11 is connected to one end side of the inductor Ls instead of the first reference voltage node GND, and thus, a voltage between the gate and the source of the transistor FET1 can be lowered. Accordingly, it is possible to further prevent the transistor FET1 from being damaged. The ESD protection circuit 11 may be provided in the LNA 1 of FIG. 1.

Figure 11:
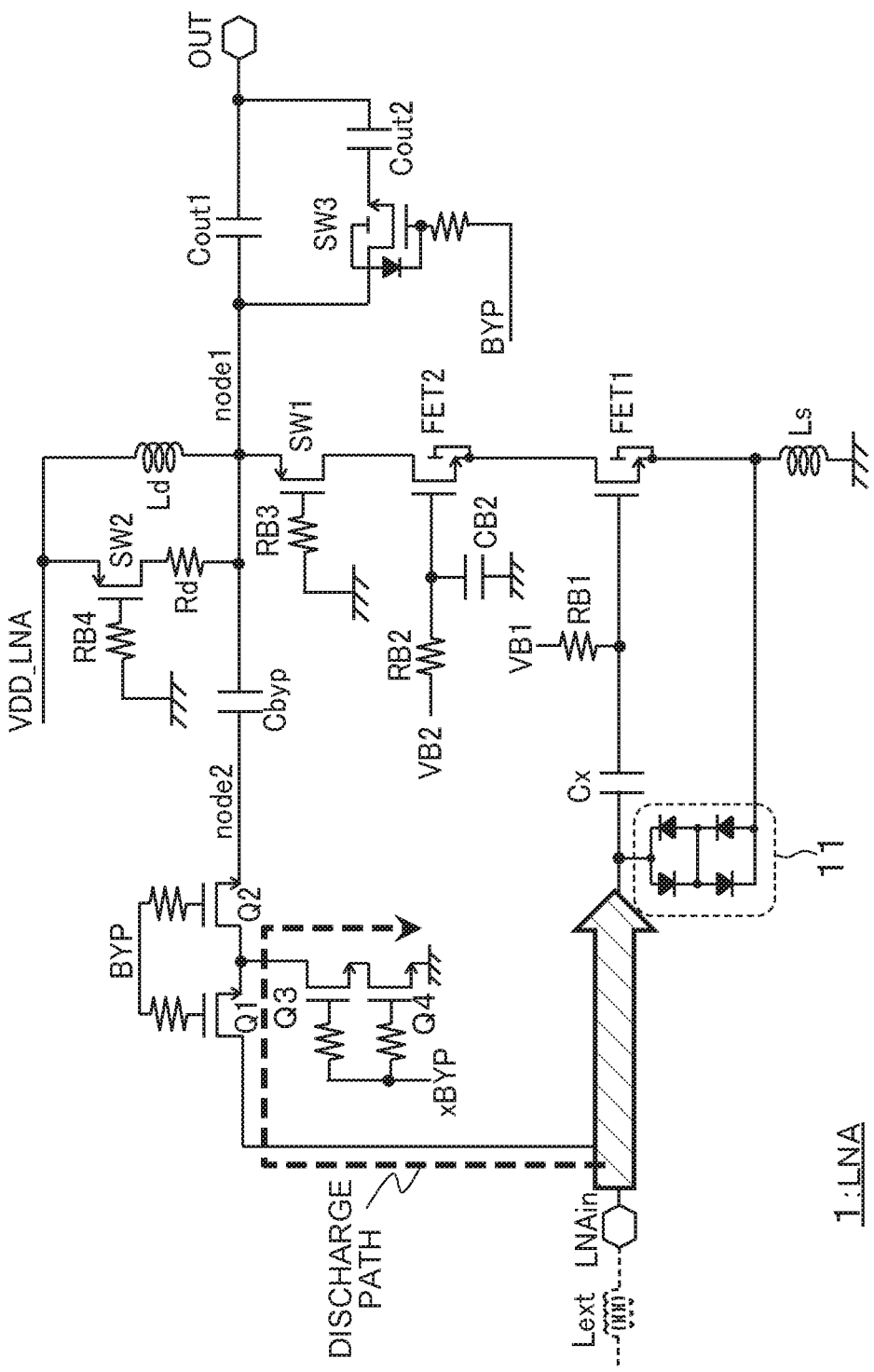
FIG. 11 is a diagram illustrating a scene in which a high-frequency input signal having a large amplitude is input to an input node of the LNA of FIG. 10 in the amplification mode.

In the LNA 1 of FIG. 10, a gate width of the transistor Q1 within the bypass switching circuit 3 including the T-type switch is larger than a gate width of the transistor Q2. As a result, as illustrated in FIG. 11, when the high-frequency input signal having the large amplitude is input to the input node LNAin in the amplification mode, even though the transistor Q1 within the bypass switching circuit 3 breaks down, the transistor Q1 is not damaged, and thus, the high-frequency input signal can flow to the shunt switch including the transistors Q3 and Q4. When the transistor Q1 breaks down and the gate width of the transistor Q1 is not large, there is a concern that the transistor Q1 is damaged. In the present embodiment, when the transistor Q1 breaks down, the current passing through the transistor Q1 can flow to the first reference voltage node GND through the shunt switch including the transistors Q3 and Q4 without damaging the transistor Q1. In the present embodiment, for example, a gate width Wg of the transistor Q1 is set to 1 mm, and a gate width Wg of the transistor Q2 is set to 0.1 mm.

When the gate width Wg of the transistor Q2 is carelessly increased, the bypass path 2 from the amplified signal path 6 through the first node node1 becomes a feedback path in the amplification mode, and a stability coefficient is lowered. Therefore, the gate width Wg of the transistor Q2 needs to be set to a sufficiently small value.

Figures 12A, 12B:
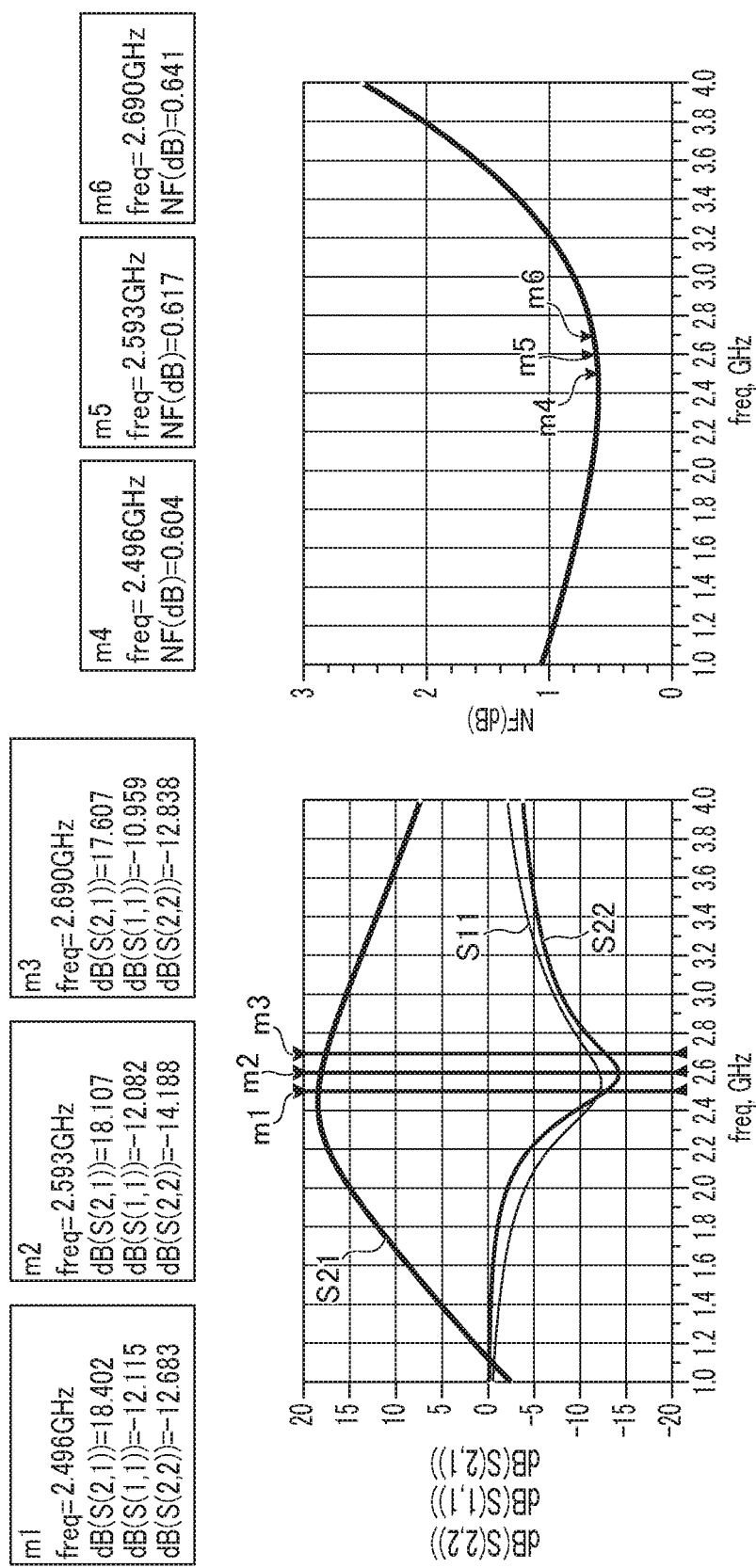
FIG. 12A is a diagram illustrating S parameters in the amplification mode of the LNA of FIG. 10.
FIG. 12B is a diagram illustrating noise figures NF in the amplification mode of the LNA of FIG. 10.

FIGS. 12A and 12B and 13A and 13B are diagrams illustrating simulation results for the LNA 1 according to the third embodiment. FIG. 12A is a diagram illustrating S parameters in the amplification mode of the LNA 1 according to the third embodiment, and FIG. 12B is a diagram illustrating noise figures NF in the amplification mode of the LNA 1 according to the third embodiment. FIG. 13A is a diagram illustrating S parameters in the bypass mode of the LNA 1 according to the third embodiment, and FIG. 13B is a diagram illustrating noise figures NF in the bypass mode of the LNA 1 according to the third embodiment. A horizontal axis of these diagrams is a frequency [GHz]. A vertical axis in FIGS. 12A and 13A is an S parameter value [dB], and a vertical axis in FIGS. 13B and 13B is a noise figure NF [dB].

The used frequency band (2.496 GHz to 2.69 GHz) in FIGS. 12A and 12B and 13A and 13B is the same as that in FIGS. 3 and 4. FIGS. 12A and 12B illustrate the simulation results when the current Idd_Ina flowing through the amplified signal path 6 is 6 mA. Since FIGS. 13A and 13B are in the bypass mode, the current Idd_Ina is inevitably 0 mA.

In FIGS. 12A and 12B, the gain is about 18 d13 and the noise figure NF is 0.641 dB or less in the used frequency band in the amplification mode. Since it is not necessary to provide the bypass switch at the previous state of the LNA 1, the LNA 1 according to the second embodiment can also obtain the favorable NF. The worst values of S11 and S22 in the used frequency band in the amplification mode are favorable at −10.9 dB and −12.6 dB, respectively.

In FIGS. 13A and 13B, an insertion loss in the bypass mode is 2 dB or less, a noise figure NF is 2 dB or less, S11 is −10.9 dB or less, and S22 is −19.1 dB or less. These values are all favorable.

As stated above, in the third embodiment, since the ESD protection circuit 11 is provided, it is possible to increase the ESD resistance when the surge voltage is input to the input node LNAin. Since one end of the ESD protection circuit 11 is connected to the connection node between the source of the transistor FET1 and one end of the inductor Ls instead of the first reference voltage node GND, the gate and the source of the transistor FET1 can be quickly lowered when the surge voltage is input to the input node LNAin, and the transistor FET1 can be prevented from being damaged.

In the third embodiment, since the gate width of the transistor Q1 in the bypass switching circuit 3 including the T-type switch on the bypass path 2 is larger than the gate width of the transistor Q2, even though the high-frequency input signal having the large amplitude is input to the input node LNAin and the transistor Q1 breaks down, the high-frequency input signal can be released to the shunt switch without damaging the transistor Q1. The gate width of the transistor Q2 is decreased, and thus, it is possible to disconnect the feedback path connecting from the amplified signal path 6 to the bypass path 2 via the first node node1 in the amplification mode.

Fourth Embodiment

Figure 14:
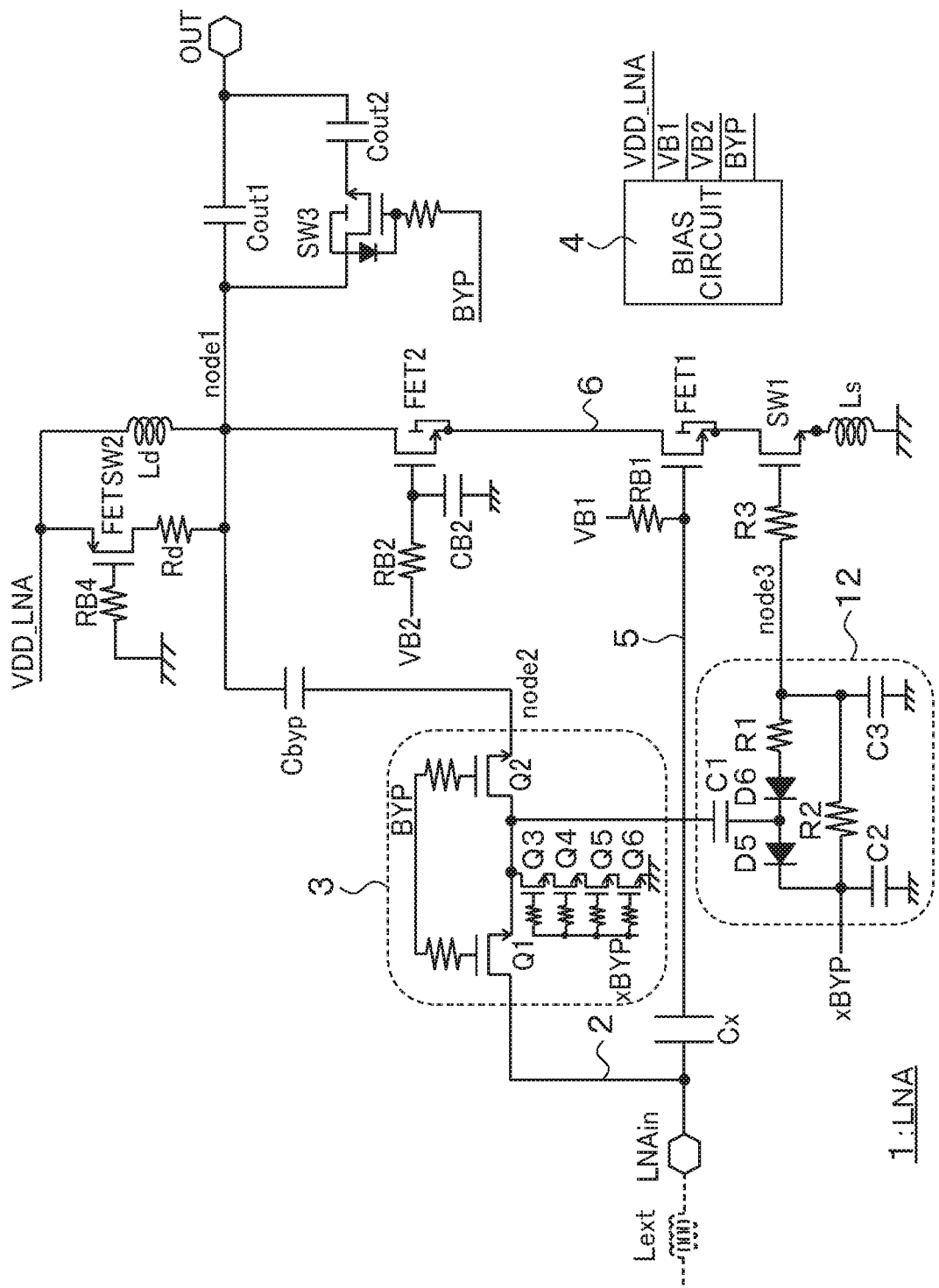
FIG. 14 is a circuit diagram of an LNA according to a fourth embodiment.

FIG. 14 is a circuit diagram of an LNA 1 according to a fourth embodiment. The LNA 1 of FIG. 14 is configured such that a charge pump circuit 12 is added to the LNA 1 of FIG. 1, There is a difference between connection locations of the transistors SW1 of the LNA 1 of FIG. 14 and the LNA 1 of FIG. 11. The LNA 1 of FIG. 14 is different from the LNA 1 of FIG. 11 in that SW1 of FIG. 14 is an n-type MOSFET. The transistor SW1 of FIG. 14 is connected between the source of the transistor FET1 and one end of the inductor Ls. The gate of the transistor SW1 is connected to the output node of the charge pump circuit 12 via the resistor R3.

The charge pump circuit 12 performs a charge pump operation by using the high-frequency input signal as a dock signal. The charge pump circuit 12 performs a charge pump operation in the bypass mode, and stops the charge pump operation in the amplification mode. As described above, the charge pump circuit 12 controls the gate of the transistor SW1.

More specifically, the charge pump circuit 12 includes a capacitor C1, a capacitor C2, a capacitor C3, a diode D5, a diode D6, a resistive element R1, and a resistive element R2. One end of the capacitor C1 is connected to a connection node between the transistors Q1 and Q2 within the bypass switching circuit 3. The other end of the capacitor C1 is connected to an anode of the diode D5 and a cathode of the diode D6. One end of the resistive element R1 is connected to an anode of the diode D6, and the other end of the resistive element R1 is connected to the gate of the transistor SW1 via the resistive element R3. The resistive element R2 is connected between the other end of the resistive element R1 and a cathode of the diode D5. The capacitor C2 is connected between the cathode of the diode D5 and the first reference voltage node GND. The capacitor C3 is connected between the other end of the resistive element R1 and the first reference voltage node GND. The inverted signal xBYP of the bypass signal is input to the cathode of the diode D5.

In the bypass mode, a potential of the connection node between the transistors Q1 and Q2 within the bypass switching circuit 3 is changed according to the amplitude of the high-frequency input signal, and a potential of a connection node between the anode of the diode D5 and the cathode of the diode D6 within the charge pump circuit 12 is accordingly changed. When the potential of the connection node is decreased, the accumulated charges of the capacitor C3 are discharged, current flows to the resistive element R1 and the diode D6, and a potential of the output node node3 of the charge pump circuit 12 is decreased. As stated above, whenever the potential of the connection node between the transistors Q1 and Q2 is decreased, the potential of the output node node3 of the charge pump circuit 12 is decreased, and eventually becomes negative. Therefore, in the bypass mode, the gate of the transistor SW1 is decreased to the negative potential, and the transistor SW1 is reliably turned off. The transistor SW1 is turned off, and thus, the amplified signal path 6 through which the signal amplified by the transistors FET1 and FET2 passes is disconnected. Accordingly, there is no concern that the high-frequency input signal transmitted to the first node node1 through the bypass path 2 flows to the amplified signal path 6, and overflow resistance can be improved.

The bypass switching circuit 3 including the T-type switch within the LNA 1 of FIG. 14 includes a shunt switch including four-stage transistors Q3 to Q6. IP1 dB can be improved by increasing the number of stages of the transistors constituting the shunt switch. The number of stages of the transistors of the shunt switch is arbitrary, and the shunt switch may be constituted by transistors of four stages or more. When it is not necessary to improve IP1 dB, the shunt switch may be constituted by transistors of four stages or less. In the bypass switching circuit 3 within the LNA 1 of FIGS. 1 and 10, IP1 dB can also be improved by setting the number of stages of the transistors constituting the shunt switch to three or more.

Figures 15A, 15B:
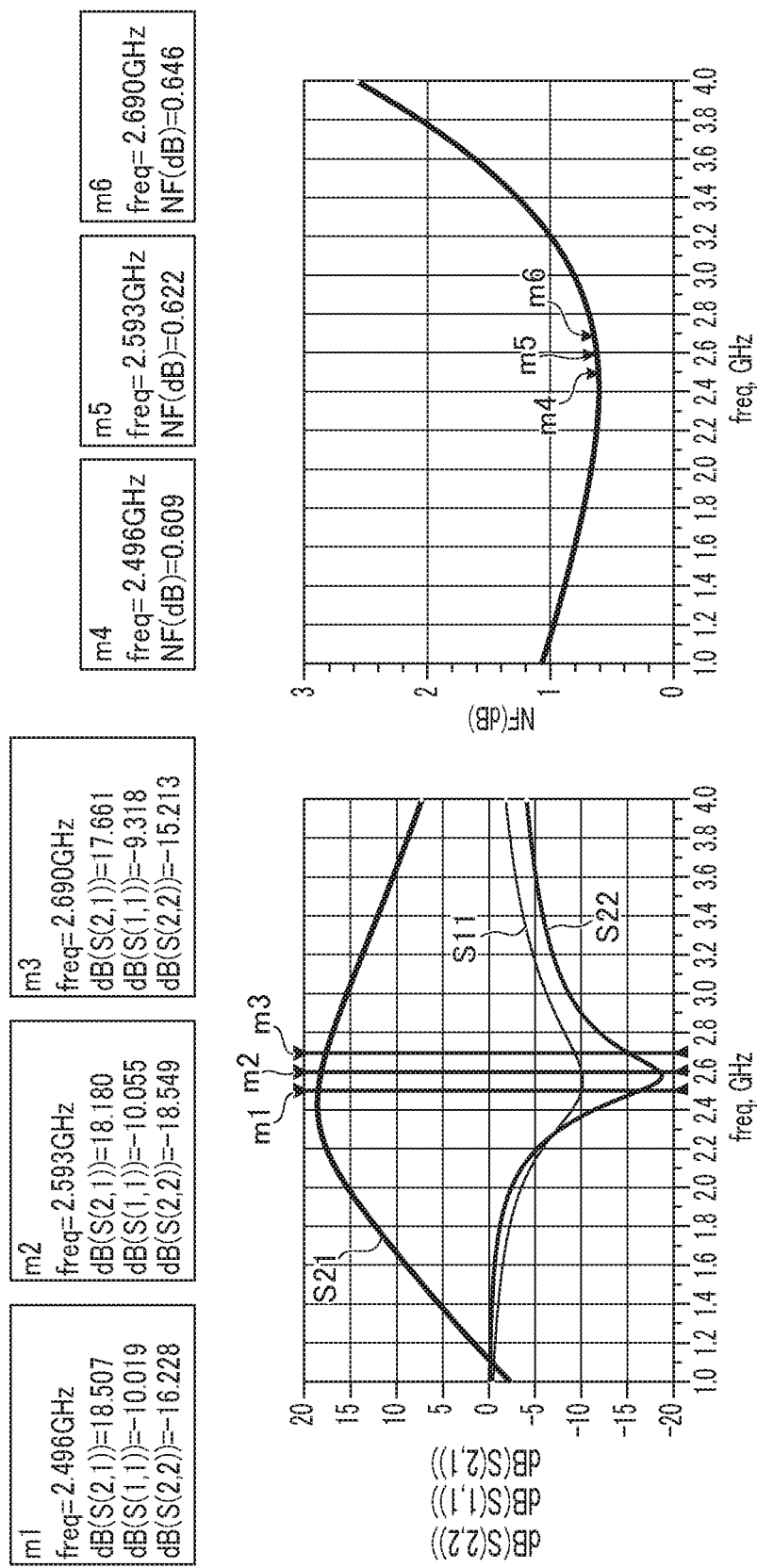
FIG. 15A is a diagram illustrating S parameters in the amplification mode of the LNA of FIG. 14.
FIG. 15B is a diagram illustrating noise figures NF in the amplification mode of the LNA of FIG. 14.
Figures 16A, 16B:
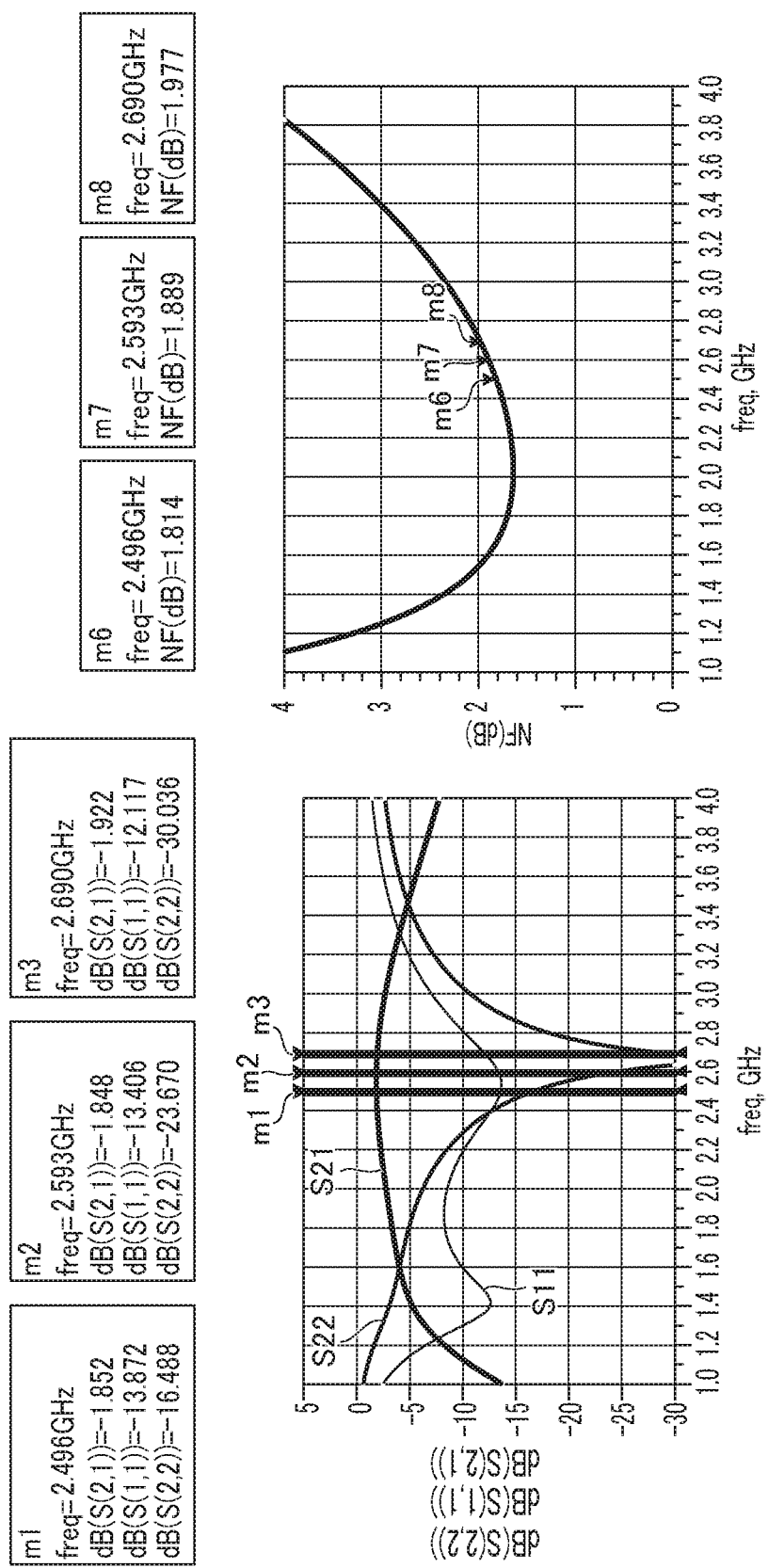
FIG. 16A is a diagram illustrating S parameters in the bypass mode of the LNA of FIG. 14.
FIG. 16B is a diagram illustrating noise figures NF in the bypass mode of the LNA of FIG. 14.
Figure 17:
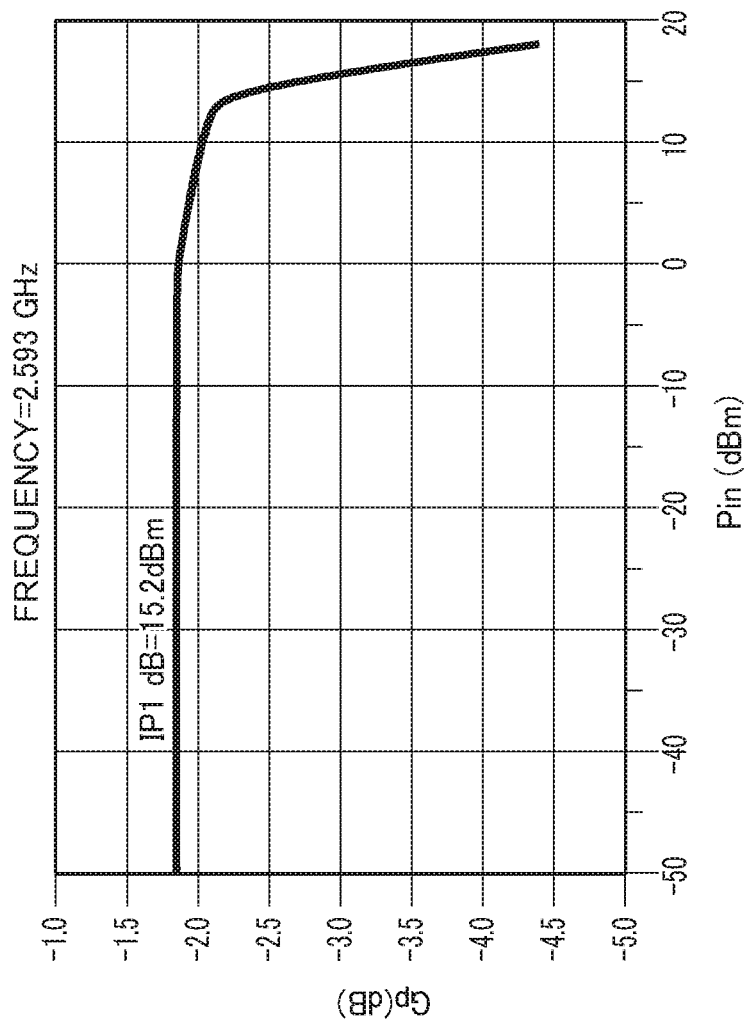
FIG. 17 is a diagram illustrating a relationship between an input power and a gain in the bypass mode of the LNA of FIG. 14.

FIGS. 15 to 17 are diagrams illustrating simulation results for the LNA 1 according to the fourth embodiment. FIG. 15A is a diagram illustrating S parameters in the amplification mode of the LNA 1 according to the fourth embodiment, and FIG. 15B is a diagram illustrating noise figures NF in the amplification mode of the LNA 1 according to the fourth embodiment. FIG. 16A is a diagram illustrating S parameters in the bypass mode of the LNA 1 according to the fourth embodiment, and FIG. 16B is a diagram illustrating noise figures NF in the bypass mode of the LNA 1 according to the fourth embodiment. A horizontal axis of these diagrams is a frequency [GHz]. A vertical axis in FIGS. 15A and 16A is an S parameter value [dB], and a vertical axis in FIGS. 15B and 16B is a noise figure NF [dB].

FIG. 17 is a diagram illustrating a relationship between an input power Pin and a gain Gp in the bypass mode of the LNA 1 according to the fourth embodiment. In FIG. 17, a horizontal axis represents an input power Pin [dBm], and a vertical axis represents a gain Gp [dB]. In FIG. 17, IP1 dB is 15.2 dBm which exceeds the general requirement of 8 dB, and is a favorable result. The used frequency band (2.496 GHz to 2.69 GHz) in FIGS. 15 and 16 is the same as that in FIGS. 3 and 4. FIGS. 15A and 15B illustrate the simulation results when the current Idd_Ina flowing in the amplified signal path 6 is 6 mA. Since FIGS. 16A and 16B are in the bypass mode, the current Idd_Ina is inevitably 0 mA. FIG. 17 illustrates a relationship between an input power and a gain in the bypass mode at a frequency of 2.593 GHz.

In FIGS. 15A and 15B, the gain is about 18 dB and the noise figure NF is 0.646 dB or less in the used frequency band in the amplification mode. Since it is not necessary to provide the bypass switch at the previous state of the LNA 1, the LNA 1 according to the fourth embodiment can also obtain the favorable NF. The worst values of S11 and S22 in the used frequency band in the amplification mode are favorable at −9.3 dB and −15.2 dB, respectively.

In FIGS. 16A and 16B, an insertion loss in the bypass mode is 2 dB or less, a noise figure NF is 2 dB or less, S11 is −12 dB or less, and S22 is −16 dB or less. These values are all favorable.

As described above, in the LNA 1 according to the fourth embodiment, since the charge pump circuit 12 is provided and the gate of the transistor SW1 is set to a negative potential in the bypass mode, the amplified signal path 6 can be reliably disconnected, and IP1 dB can be improved. IP1 dB can be further improved by setting the number of stages of the transistors of the shunt switch within the bypass switching circuit 3 to four or more.

Fifth Embodiment

Figure 18:
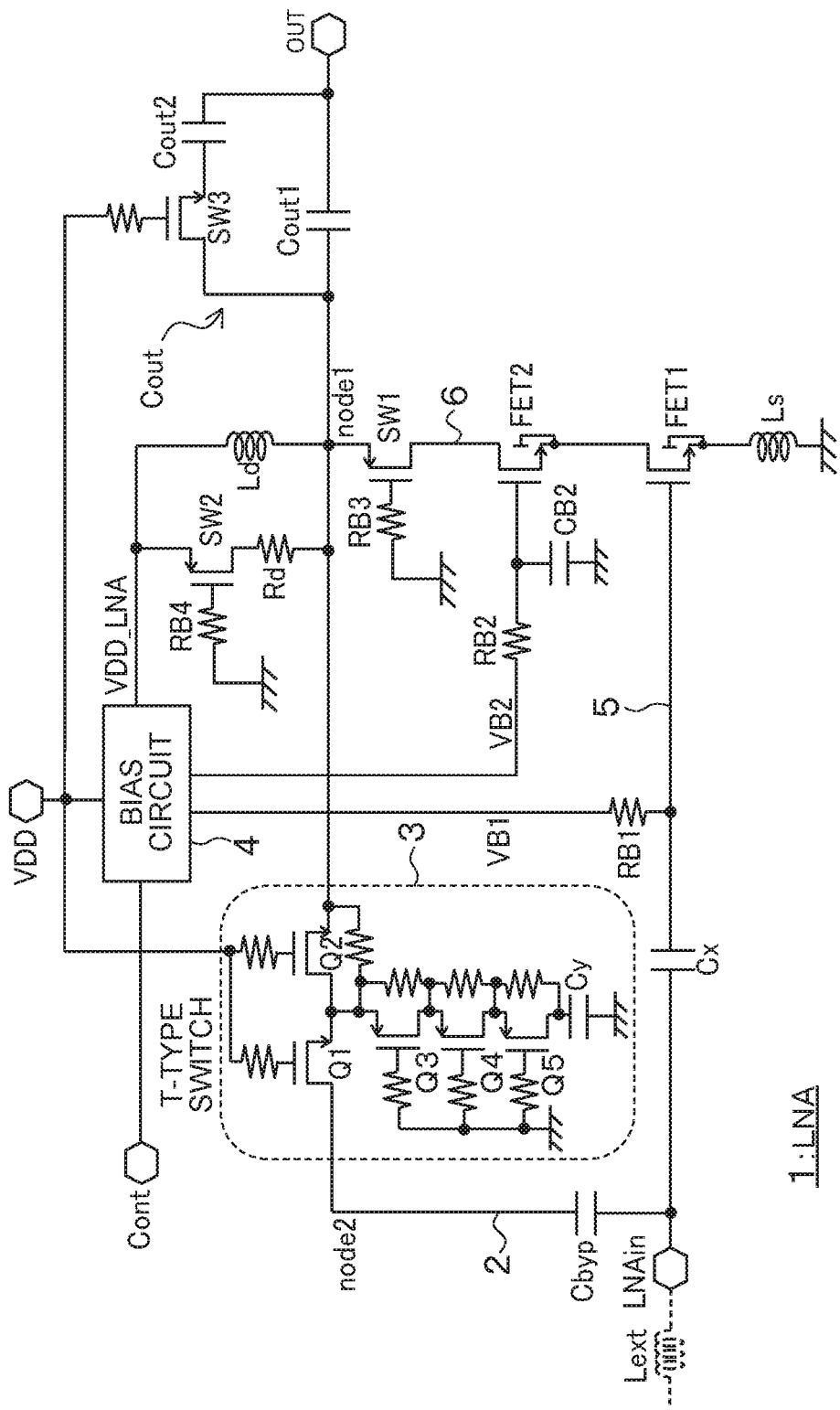
FIG. 18 is a circuit diagram of an LNA according to a fifth embodiment.

FIG. 18 is a circuit diagram of an LNA 1 according to a fifth embodiment. The LNA 1 of FIG. 18 turning on and off each transistor without using bypass signals BYP and xBYP.

The bias circuit 4 in the LNA 1 of FIG. 18 generates the second reference voltage VDD_LNA and the bias voltages VB1 and VB2 from a power supply voltage VDD. The power supply voltage VDD is inputted to the gate of the transistor SW3 for switching whether or not the capacitor Cout2 is connected in parallel with the capacitor Cout1. The transistor SW3 is turned off since the voltage of the first node node1 is 1.8 V in the amplification mode, and is turned on since the voltage of the first node node1 is 0 V in the bypass mode. Therefore, in the bypass mode, the output matching capacitor Cout has a capacitance in which the capacitors Cout1 and Cout2 are connected in parallel.

The shunt switch in the bypass switching circuit 3 on the bypass path 2 includes cascade-connected three-stage transistors Q3 to Q5 and a capacitor Cy. The capacitor Cy is regarded as being short-circuited to the ground node in terms of high frequency.

FIG. 19 is a diagram illustrating the voltage value VDD_LNA and the bias voltages VB1 and VB2 for each mode of the LNA 1 of FIG. 18. The power supply voltage VDD supplied to the bias circuit 4 is, for example, 1.8 V. In the amplification mode, the bias circuit 4 sets the voltage VDD_LNA to 1.8 V, the bias voltage VB1 to 0.55 V, and the bias voltage VB2 to 1.33 V. The bias circuit 4 sets the voltages VDD_LNA, VB1, and VB2 to 0 V in the bypass mode.

In the LNA 1 of FIG. 18, since the bypass signals BYP and xBYP are not provided and the gates of the transistors FET2 to SW3 can be controlled, the circuit configuration can be simplified.

Figures 21A, 21B:
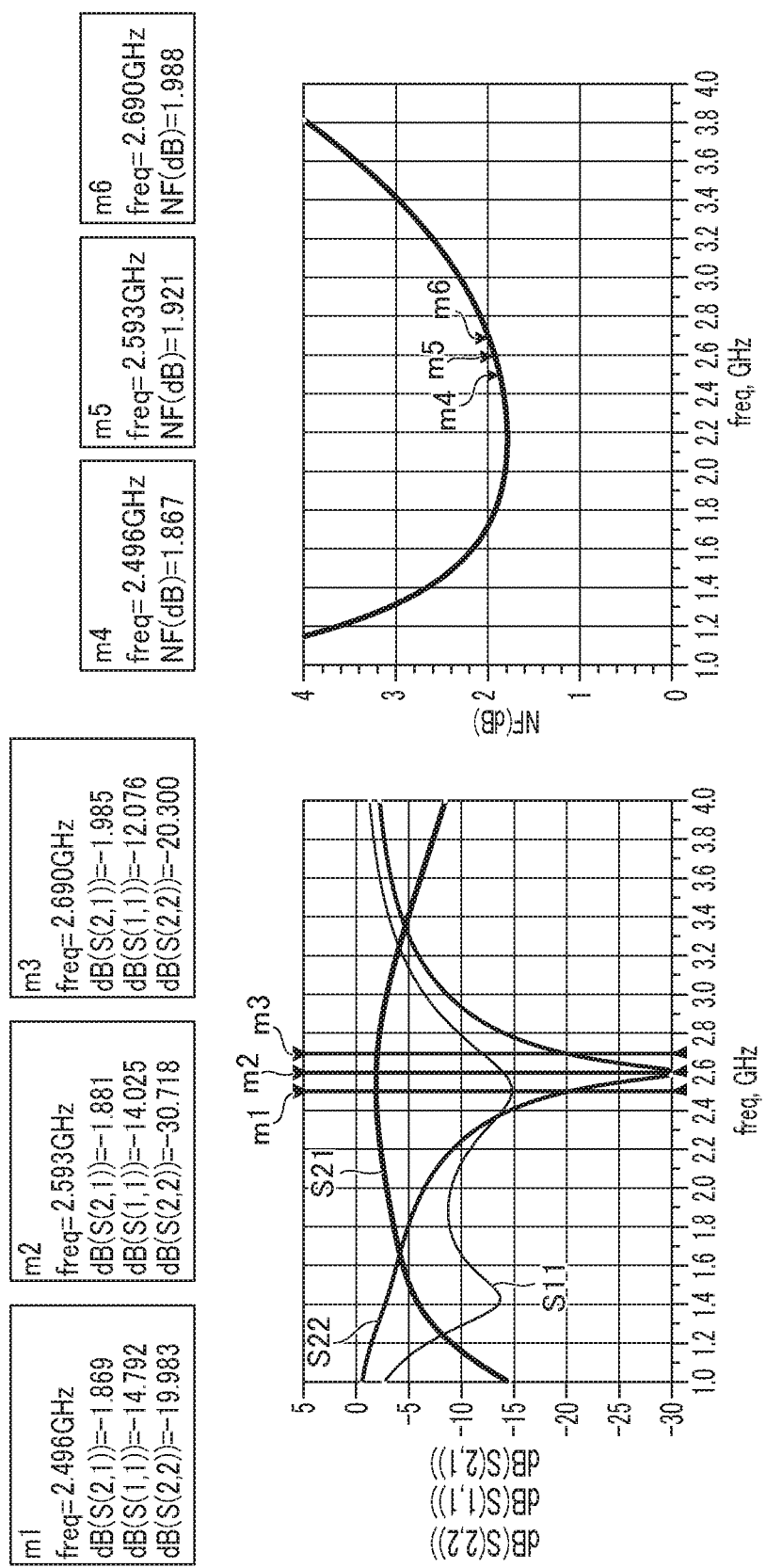
FIG. 21A is a diagram illustrating S parameters in the bypass mode of the LNA of FIG. 18.
FIG. 21B is a diagram illustrating noise figures NF in the bypass mode of the LNA of FIG. 18.
Figure 22:
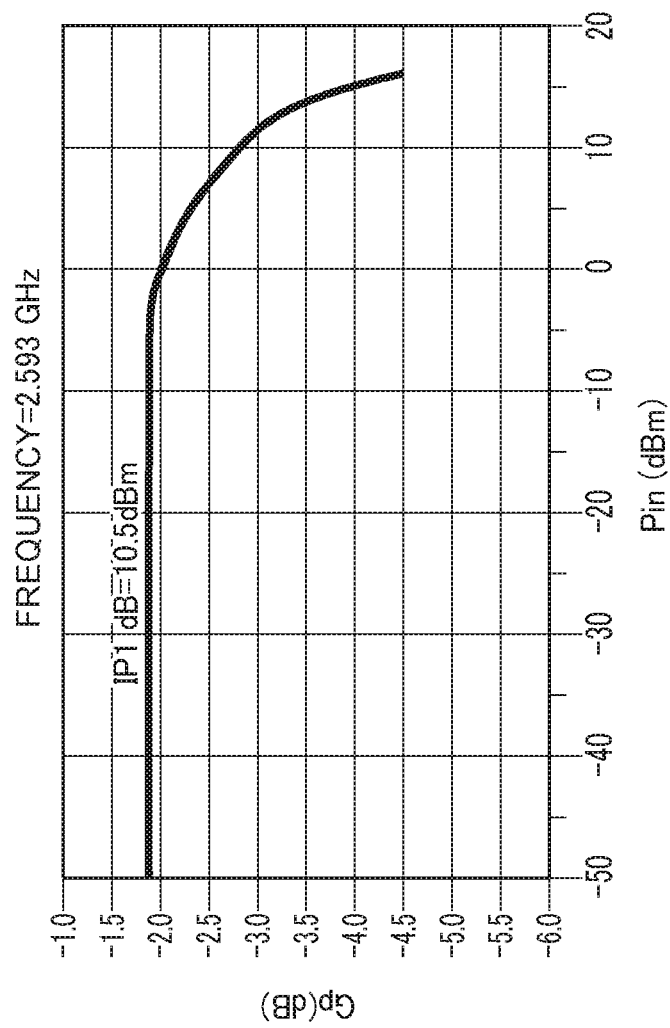
FIG. 22 is a diagram illustrating a relationship between an input power and a gain in the bypass mode of the LNA of FIG. 18.

FIGS. 20 to 22 are diagrams illustrating simulation results for the LNA 1 according to the fifth embodiment. FIG. 20A is a diagram illustrating S parameters in the amplification mode of the LNA 1 according to the fifth embodiment, and FIG. 20B is a diagram illustrating noise figures NF in the amplification mode of the LNA 1 according to the fifth embodiment. FIG. 21A is a diagram illustrating S parameters in the bypass mode of the LNA 1 according to the fifth embodiment, and FIG. 21B is a diagram illustrating noise figures NF in the bypass mode of the LNA 1 according to the fifth embodiment. A horizontal axis of these diagrams is a frequency [GHz]. A vertical axis in FIGS. 20A and 21A is an S parameter value [dB], and a vertical axis in FIGS. 20B and 21B is a noise figure NF [dB].

FIG. 22 is a diagram illustrating a relationship between an input power Pin and a gain Gp in the bypass mode of the LNA 1 according to the fifth embodiment. In FIG. 22, a horizontal axis represents an input power Pin [dBm], and a vertical axis represents a gain Gp [dB]. In FIG. 22, IP1 dB is 10.5 dBm which exceeds the general requirement of 8 dB, and is a favorable result. The used frequency band (2.496 GHz to 2.69 GHz) in FIGS. 20 and 21 is the same as that in FIGS. 3 and 4. FIGS. 20A and 20B illustrate simulation results when the current Idd_Ina flowing through the amplified signal path 6 is 6.2 mA. Since FIGS. 21A and 21B are in the bypass mode, the current Idd_Ina is inevitably 0 mA. FIG. 22 illustrates a relationship between an input power and a gain in the bypass mode at a frequency of 2.593 GHz.

As illustrated in FIGS. 20A and 20B, the gain is about 18 dB and the noise figure NF is 0.625 dB or less in the used frequency band in the amplification mode. Since it is not necessary to provide the bypass switch at the previous state of the LNA 1, the LNA 1 according to the fifth embodiment can also obtain the favorable NF. The worst values of S11 and S22 in the used frequency band in the amplification mode are favorable at −8.8 dB and −13.2 dB, respectively.

In FIGS. 21A and 21B, an insertion loss in the bypass mode is 2 dB or less, a noise figure NF is 2 dB or less, S11 is −12 dB or less, and S22 is −19.9 dB or less. These values are all favorable.

As described above, in the fifth embodiment, since the gates of all the transistors within the LNA 1 are controlled only by the first reference voltage VDD_LNA and the bias voltages VB1 and VB2 generated by the bias circuit 4, the bypass signals BYP and xBYP are unnecessary, and thus, the circuit configuration of LNA 1 can be simplified.

Sixth Embodiment

Figure 23:
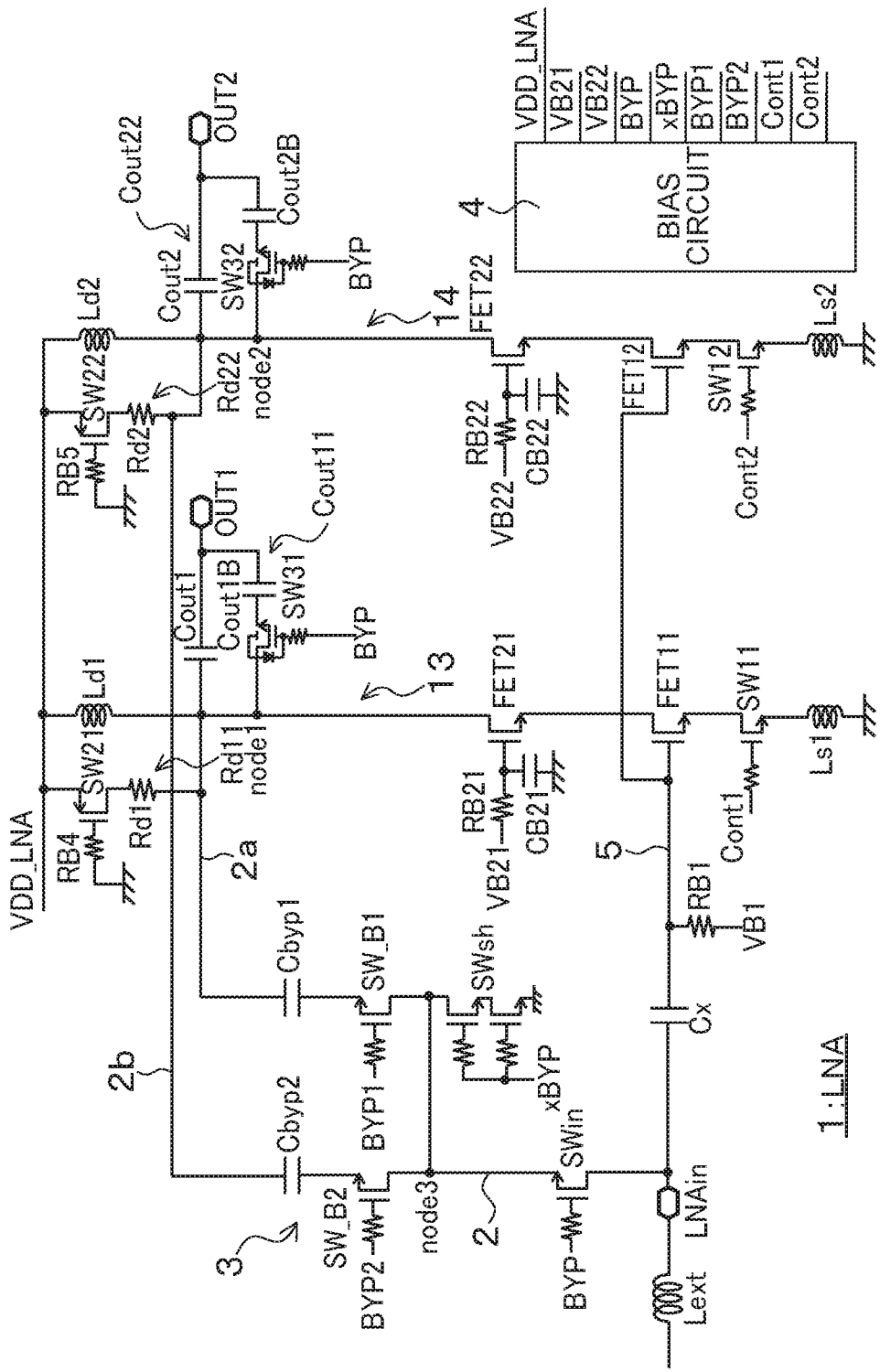
FIG. 23 is a circuit diagram of an LNA according to a sixth embodiment.

FIG. 23 is a circuit diagram of an LNA 1 according to a sixth embodiment. The LNA 1 of FIG. 23 is an LNA 1 compatible with intra-band carrier aggregation, and includes two output nodes OUT1 and OUT2 for one input node LNAin. The LNA 1 of FIG. 23 has a split output amplification mode for outputting high-frequency amplified signals in parallel from two output nodes OUT1 and OUT2, a single output amplification mode for outputting the high-frequency amplified signal from one of the output nodes, and a single output bypass mode for bypassing and outputting the high-frequency input signal from one of the output nodes.

The LNA 1 of FIG. 23 includes a first amplifier 13, a second amplifier 14, a bypass switching circuit 3 on the bypass path 2, and a bias circuit 4.

The first amplifier 13 includes a transistor (first transistor) FET11, a transistor (second transistor) FET21, a transistor (third transistor) SW11, an inductor (first inductor) Ls1, an inductor (second inductor) Ld1, an output matching resistor Rd11, and an output matching capacitor Cout11.

The transistor FET11 is a source-grounded transistor that amplifies the high-frequency input signal input to an input node LNAin. An input signal path 5 is connected to a gate of the transistor FET11. A capacitor Cx is connected on the input signal path 5. A bias voltage VB1 is supplied to the input signal path 5 via a resistive element RB1. The high-frequency input signal input to the input node LNAin is input to the gate of the transistor FET11 through the input signal path 5.

The transistor FET21 is a gate-grounded transistor that further amplifies the signal amplified by the transistor FET11. A bias voltage VB21 is supplied to a gate of the transistor FET21 via a resistive element RB21. A capacitor CB21 is connected between the gate of the transistor FET21 and a first reference voltage node GND. A drain of the transistor FET21 is connected to a first node node1.

One end of the inductor Ld1, one end of the output matching resistor Rd11, and one end of the output matching capacitor Cout11 are connected to the first node node1.

The output matching resistor Rd11 includes a transistor SW21 and a resistive element Rd1 connected in series between a second reference voltage node VDD_LNA and the first node node1. The gate of the transistor SW21 is connected to the first reference voltage node GND via a resistive element RB4.

The output matching capacitor Cout11 includes a capacitor (first capacitor) Cout1 connected between the first node node1 and the output node OUT1, and a transistor (eleventh transistor) SW31 and a capacitor (second capacitor) Cout1B connected in series between the first node node1 and the output node OUT1. A bypass signal BYP is input to a gate of the transistor SW31.

The second amplifier 14 includes a transistor (fourth transistor) FET12, a transistor (fifth transistor) FET22, a transistor (sixth transistor) SW12, an inductor (third inductor) Ls2, an inductor (fourth inductor) Ld2, an output matching resistor Rd22, and an output matching capacitor Cout22.

The transistor FET12 is a source-grounded transistor that amplifies the high-frequency input signal input to the input node LNAin. An input signal path 5 is connected to the gate of the transistor FET12.

The transistor FET22 is a gate-grounded transistor that further amplifies the signal amplified by the transistor FET12. A bias voltage VB22 is supplied to the gate of the transistor FET22 via a resistive element RB22. A capacitor CB22 is connected between the gate of the transistor FET22 and the first reference voltage node GND. A drain of the transistor FET22 is connected to a second node node2.

One end of the inductor Ld2, one end of the output matching resistor Rd22, and one end of the output matching capacitor Cout22 are connected to the second node node2.

The output matching resistor Rd22 includes a transistor SW22 and a resistive element Rd2 connected in series between the second reference voltage node VDD_LNA and the second node node2. A gate of the transistor SW22 is connected to the first reference voltage node GND via a resistive element RB5.

The output matching capacitor Cout22 is a capacitor (third capacitor) Cout2 connected between the second node node2 and the output node, and a transistor (twelfth transistor) SW32 and a capacitor (fourth capacitor) Cout2B connected in series between the second node node2 and the output node. A bypass signal BYP is input to a gate of the transistor SW32.

The bypass switching circuit 3 includes a transistor (seventh transistor) SWin, a transistor (eighth transistor) SW_B1, a transistor (ninth transistor) SW_B2, and a shunt switch (tenth transistor) SWsh.

The transistor SWin is connected between the input node LNAin and a branch node node3. A bypass signal BYP is input to the gate of the transistor SWin.

The transistor SW_B1 and a capacitor Cbyp1 are connected in series between the branch node node3 and the first node node1. A bypass signal BYP1 is input to a gate of the transistor SW_B1. The transistor SW_B2 and a capacitor Cbyp2 are connected in series between the branch node node3 and the second node node2. A bypass signal BYP2 is input to a gate of the transistor SW_B2. Two transistors constituting the shunt switch are cascade-connected between the branch node node3 and the first reference voltage node GND. An inverted signal xBYP of the bypass signal is input to gates of these transistors. The number of stages of the transistors constituting the shunt switch SW_sh may be other than two.

As described above, the bypass switching circuit 3 includes the transistors SW_B1 and SW_B2 respectively connected on branch paths 2a and 2b that branch into two from the branch node node3. The transistor SWin and the shunt switch SWsh are connected on the bypass path 2 before the bypass path branches into these two branch paths 2a and 2b.

FIG. 24 is a diagram illustrating bias voltages and voltage values of the bias signals in each mode of the LNA 1 of FIG. 23. In the single output amplification mode, when the bias voltage VB21=1.33 V and the control signal Cont1=1.8 V are satisfied, the first amplifier 13 amplifies the high-frequency input signal to output the amplified high-frequency input signal from the output node OUT1, and when the bias voltage VB22=1.33 V and the control signal Cont2=1.8 V are satisfied, the second amplifier 14 amplifies the high-frequency input signal to output the amplified high-frequency input signal from the output node OUT2.

In the split output amplification mode, the bias voltages VB21 and VB22 are set to 1.33 V, the control signals Cont1 and Cont2 are set to 1.8 V, and both the first amplifier 13 and the second amplifier 14 amplify the high-frequency input signals, and output the amplified high-frequency input signals from the output nodes OUT1 and OUT2.

In the single output bypass mode, when VDD_LNA is set to 0 V, the bias voltages VB21 and VB22 are set to 0 V, and the bypass signal BYP1=1.8 V is satisfied, the high-frequency input signal is output from the output node OUT1, and when the bypass signal BYP2 is 1.8 V, the high-frequency input signal is output from the output node OUT2.

In the single output amplification mode and the split output amplification mode of the LNA 1 of FIG. 23, since the input impedance is changed, the input matching may be deteriorated. In this case, a matching adjustment circuit (not illustrated) may be provided. As the matching adjustment circuit, for example, it is considered that a variable capacitor is connected between the gates and the sources of the transistors FET11 and FET12.

An operation in the single output bypass mode when the second reference voltage VDD_LNA=0 V and the bypass signals BYP and BYP1=1.8 V are satisfied in the LNA 1 of FIG. 23 will be described. In this case, the high-frequency input signal input to the input node LNAin reaches the first node node1 through the transistor SWin, the transistor SW_B1, and the capacitor Cbyp1, and is output from the output node OUT1 via the parallel circuit of the capacitors Cont1 and Cont2B.

The high-frequency signal at the first node node1 is affected by an inductor Lext on the previous stage side of the input node LNAin and the inductor Ld1 connected in parallel with the output matching resistor Rd11. However, the values of the capacitors Cbyp1 and Cout1B are appropriately set, and thus, input and output reflection losses within the signal band can be suppressed to a predetermined value (for example, 10 dB).

When a function of changing the gain in the amplification mode is provided, the resistive elements Rd1 and Rd2 may be variable resistive elements, and the capacitors Cont1 and Cout2 may be variable capacitors.

As stated above, in the sixth embodiment, the split output amplification mode, the single output amplification mode, and the output bypass mode are provided in the LNA 1 having two output nodes OUT1 and OUT2 for one input node LNAin. The bypass switching circuit 3 provided on the bypass path 2 includes the transistors SW_B1 and SW_B2 respectively connected to the two branch paths 2a and 2b and the transistor SWin and the shunt switch SWsh are connected to the bypass path 2 before the bypass path branches into these branch paths, the number of transistors within the bypass switching circuit 3 can be reduced.

Seventh Embodiment

Figure 25:
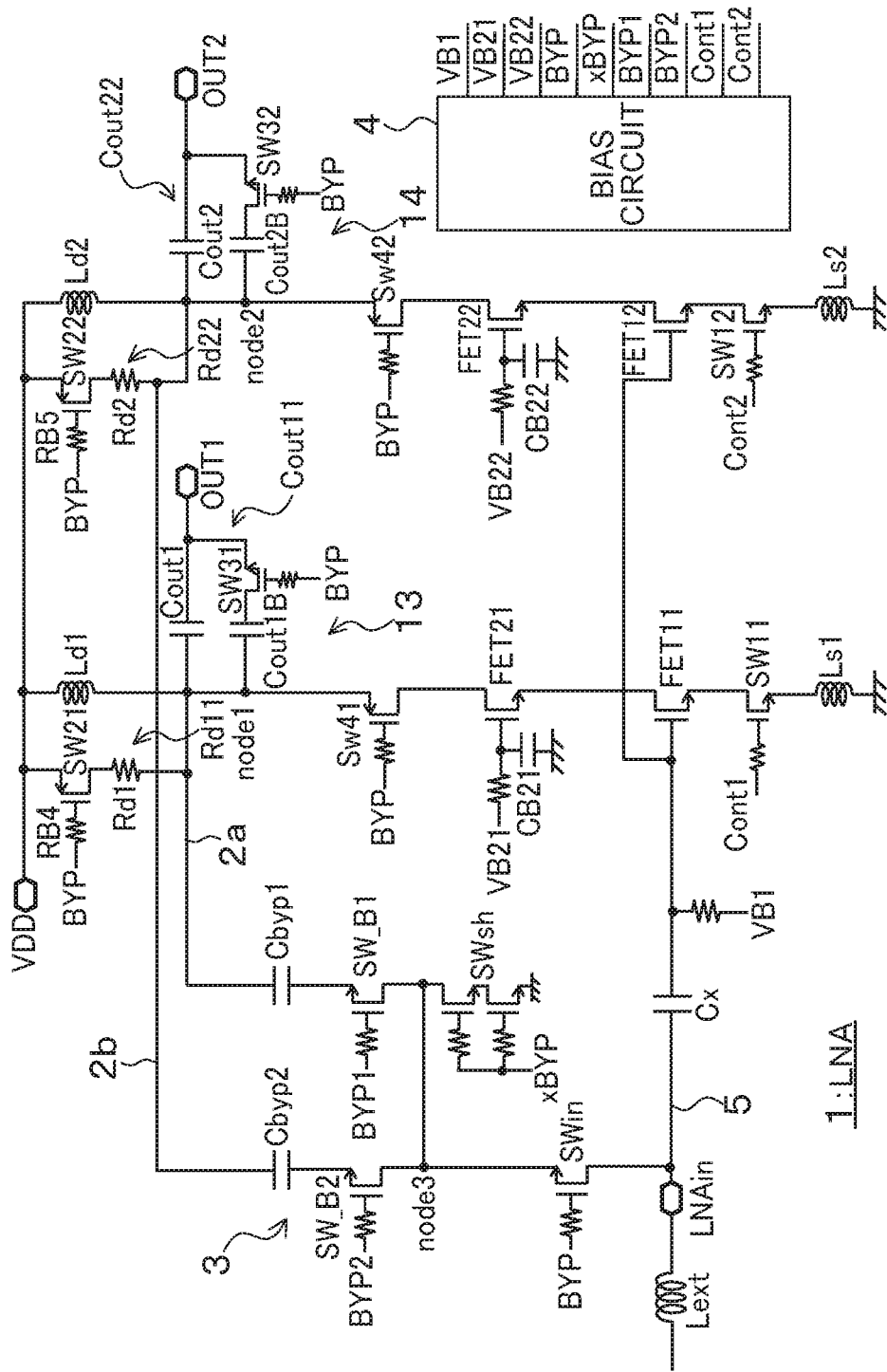
FIG. 25 is a circuit diagram of an LNA according to a seventh embodiment.

FIG. 25 is a circuit diagram of an LNA 1 according to a seventh embodiment. The LNA 1 of FIG. 25 is obtained by adding transistors SW41 and SW42 to the LNA 1 of FIG. 23. The transistor (thirteenth transistor) SW41 is connected between the first node node1 and the drain of the transistor FET21. Similarly, the transistor (fourteenth transistor) SW42 is connected between the second node node2 and the drain of the transistor FET22. The transistors SW41 and SW42 are p-type MOSFETs, and bypass signals BYP are input to gates thereof. The transistors SW41 and SW42 are turned on in the amplification mode, and are turned off in the bypass mode.

The second reference voltage is VDD_LNA in the LNA 1 of FIG. 23, but the second reference voltage is the power supply voltage VDD in the LNA 1 of FIG. 25. In the LNA 1 of FIG. 23, the voltage level of the second reference voltage VDD_LNA is switched between the single output amplification mode or the split output amplification mode and the single output bypass mode. However, it is not necessary to switch the second reference voltage in the LNA 1 of FIG. 25. Thus, the power supply voltage VDD from the outside can be used as the second reference voltage.

In the LNA 1 of FIG. 25, the connection order between the capacitor Cont1B and the transistor SW31 between the first node node1 and the output node OUT1 is opposite to the connection order of the transistor SW31 and the capacitor Cont11B of the LNA 1 of FIG. 23. Thus, the transistor SW31 of FIG. 25 does not need to connect a diode between the body and the gate. The reason why the diode is connected between the body and the gate in the transistor SW31 of FIG. 23 is that when the body is floating and the gate is at a negative potential, since holes are generated in the body and a withstand voltage between the drain and the source is lowered, the holes in the body are extracted. Since the gate is not at the negative potential, the transistor SW31 of FIG. 25 does not need to connect the diode.

The bypass signals BYP are input to the gates of the transistors SW41 and SW42 newly added to the LNA 1 of FIG. 25. Therefore, the transistors SW41 and SW42 are turned on in the single output amplification mode or the split output amplification mode, and are turned off in the single output bypass mode. When the transistor SW41 is turned on, the high-frequency signal amplified by the FET11 and FET21 is output from the output node OUT1 via the first node. Similarly, when the transistor SW42 is turned on, the high-frequency signal amplified by the FET12 and FET22 is output from the output node OUT2 via the second node.

FIG. 26 is a diagram illustrating bias voltages and voltage values of the bias signals in modes of the LNA 1 of FIG. 25. In FIG. 26, ON is a predetermined voltage supplied from a current mirror circuit (not illustrated), and OFF is a ground voltage (for example, 0 V). L is a ground voltage, and H is the power supply voltage VDD. In FIG. 26, it is not necessary to switch the power supply voltage VDD between the single output amplification mode or the split output amplification mode and the single output bypass mode. The bypass signal xBYP is H in the single output amplification mode or the split output amplification mode, and the bypass signal BYP is H in the single output bypass mode.

As stated above, in the LNA 1 of FIG. 25, since the transistor SW41 is provided between the drain of the transistor FET21 within the first amplifier 13 and the first node node1 and the transistor SW42 is provided between the drain of the transistor FET22 within the second amplifier 14 and the second node node2, even though the high-frequency input signal having the large amplitude is input to the input node LNAin in the single output bypass mode, there is no concern that the transistors FET11, FET21, FET12, and FET22 are erroneously operated.

Eighth Embodiment

Figure 27:
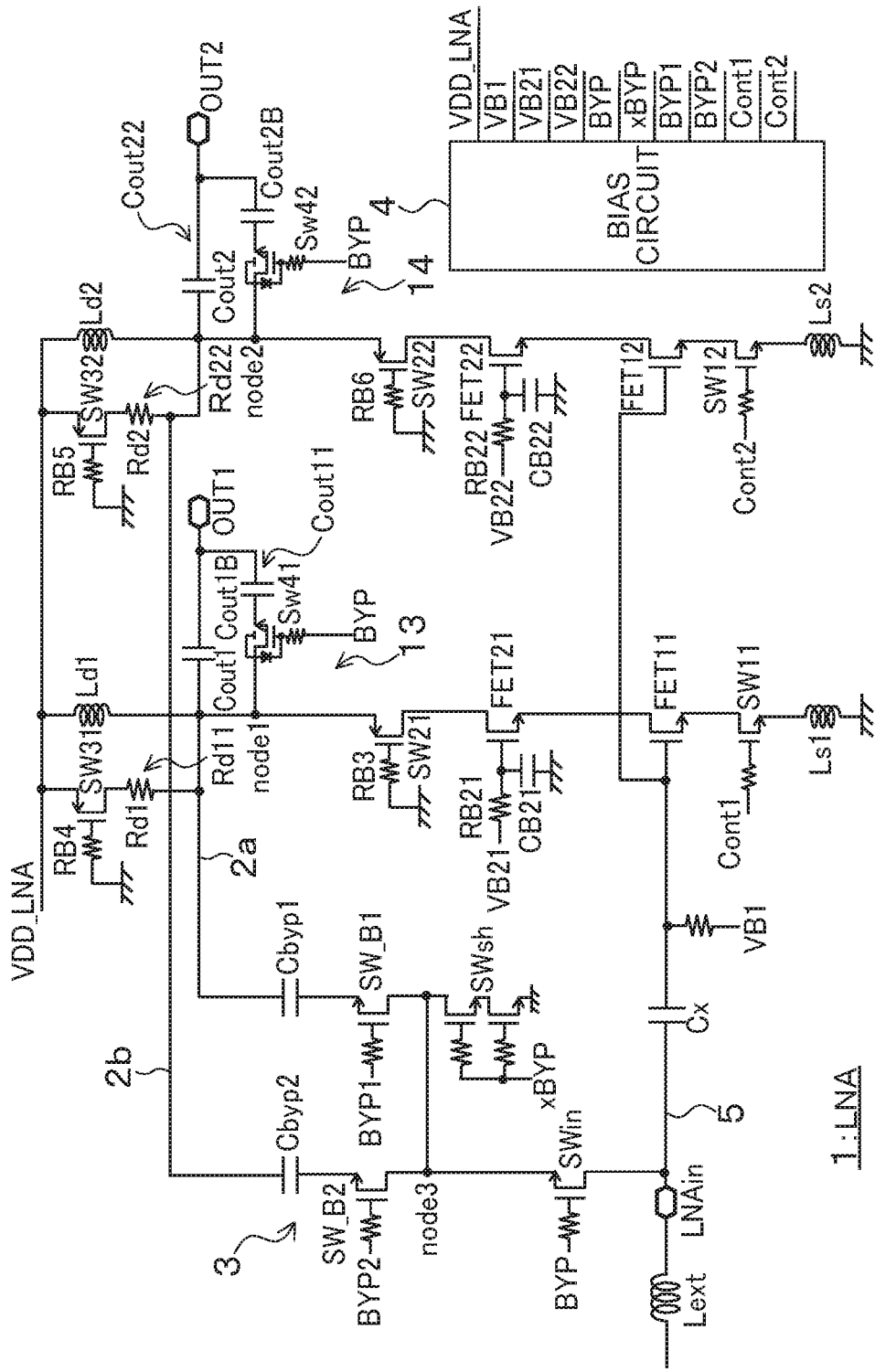
FIG. 27 is a circuit diagram of an LNA according to an eighth embodiment.

FIG. 27 is a circuit diagram of an LNA 1 according to an eighth embodiment. The LNA 1 of FIG. 27 is different from the LNA of FIG. 25 in that the second reference voltage VDD_LNA is supplied instead of VDD and the circuit configurations of the output matching capacitors Cout11 and Cout22 within the first amplifier 13 and the second amplifier 14 are different from those of FIG. 25, and is the same as the LNA 1 of FIG. 25 except that transistors SW21 and SW22 as PMOSFETs are provided instead of the transistors SW41 and SW42 as NMOSFETs. Gates of the transistors SW21 and SW22 are connected to the first reference voltage node GND via resistive elements RB3 and RB6.

The output matching capacitor Cout11 within the first amplifier 13 includes a capacitor Cout1 connected between a first node node1 and an output node OUT1, and a transistor SW41 and a capacitor Cout1B connected in series between the first node node1 and the output node OUT1. A diode is connected between a body and a gate of the transistor SW41. Similar to the transistor SW31 of FIG. 23, this diode is provided for extracting holes in the body when the gate has a negative potential.

FIG. 28 is a diagram illustrating bias voltages and voltage values of the bias signals in modes of the LNA 1 of FIG. 27. In the single output amplification mode and the split output amplification mode, the second reference voltage VDD_LNA=1.8 V is satisfied, and in the single output bypass mode, the second reference voltage VDD_LNA=0 V is satisfied.

An operation of the LNA 1 of FIG. 27 is the same as that of the LNA 1 of FIG. 25, and the obtained effects are also the same.

Ninth Embodiment

Figure 29:
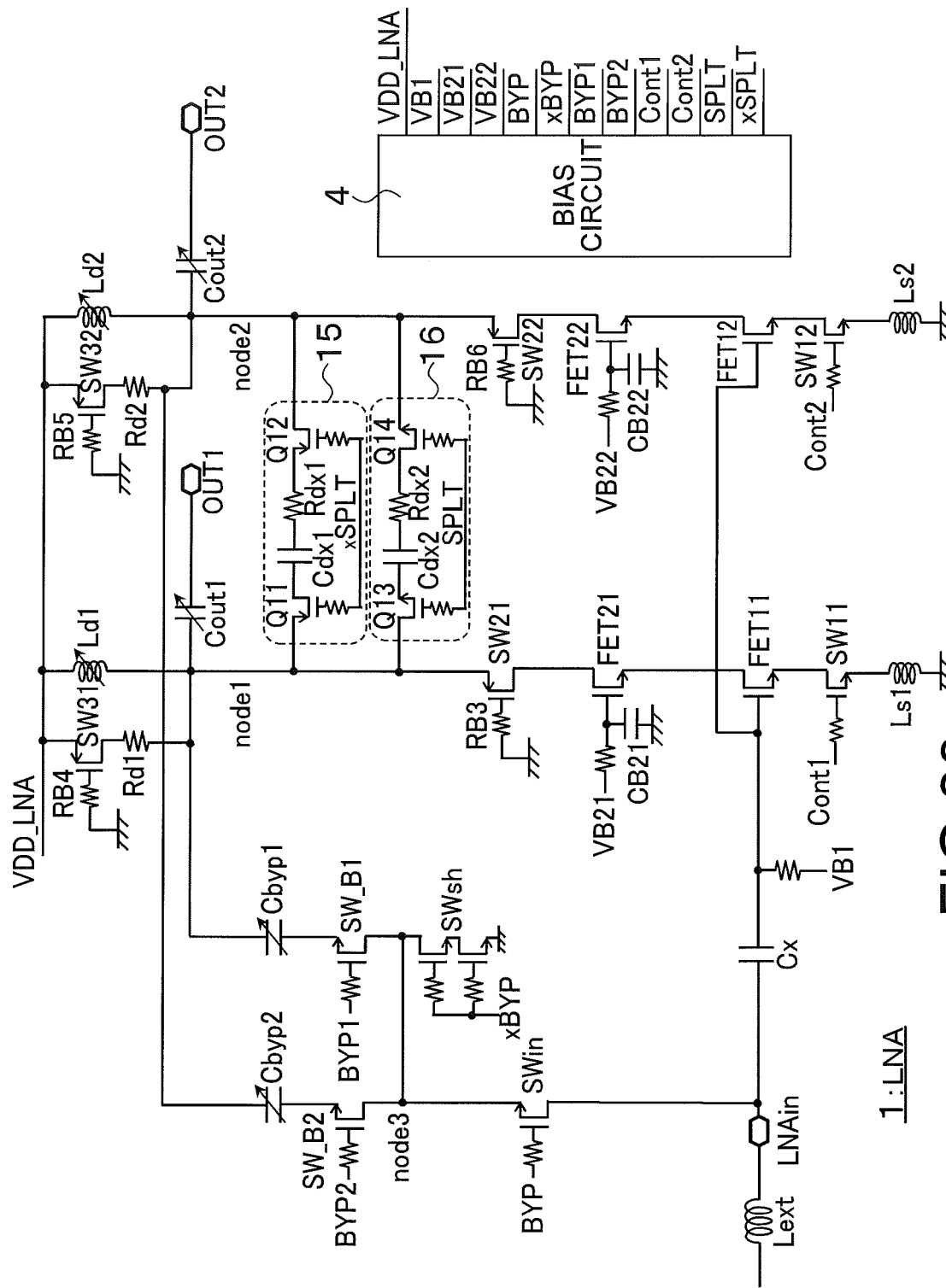
FIG. 29 is a circuit diagram of an LNA according to the ninth embodiment.

FIG. 29 is a circuit diagram of an LNA 1 according to a ninth embodiment. The LNA 1 of FIG. 29 has a split output bypass mode in addition to the single output amplification mode, the split output amplification mode, and the single output bypass mode.

The LNA 1 of FIG. 23, FIG. 25, or FIG. 27 has the split output amplification mode. In the split output amplification mode, the high-frequency signals are output from both the first amplifier 13 and the second amplifier 14. In this case, the isolation between the output node OUT1 of the first amplifier 13 and the output node OUT2 of the second amplifier 14 becomes a problem. Isolation characteristics are represented by S23. In order to improve the isolation, that is, S23, the resistive element and the capacitor may be connected in series between the first node node1 and the second node node2, and the resistance value and the capacitance may be optimized. In the split output amplification mode, the potentials of the first node node1 and the second node node2 are the same at any timing. Thus, even though an impedance is provided between the first node node1 and the second node node2, amplification characteristics are not affected at all, S23 represents transfer characteristics of a path from the output node OUT2 to the output node OUT1. The resistive element and the capacitor are connected in series between the first node node1 and the second node node2, and thus, reverse characteristics of the transfer characteristics of the path causing deterioration of S23 are given. These characteristics cancel each other, and thus, S23 Can be improved.

Such an S23 improvement circuit is provided, the high-frequency signals can be output from the two output nodes OUT1 and OUT2 even in the bypass mode. Therefore, in the present embodiment, the split output bypass mode is provided.

The LNA 1 of FIG. 29 includes a first S23 improvement circuit 15 and a second S23 improvement circuit 16 connected in parallel between the first node node1 of the first amplifier 13 and the second node node2 of the second amplifier 14 in addition to the configuration of the LNA 1 of FIG. 23, FIG. 25 or FIG. 27. The first S23 improvement circuit is for the split output amplification mode, whereas the second S23 improvement circuit is for the split output bypass mode.

The capacitances of capacitors Cout1, Cout2, Cbyp1, and Cbyp2 in the LNA 1 of FIG. 29 are variable, and the inductances of the inductors Ld1 and Ld2 are also variable. Values thereof are optimum values in each mode.

The first S23 improvement circuit 15 is a circuit in which a transistor Q11, a capacitor (fifth capacitor) Cdx1, a resistive element (first resistive element) Rdx1, and a transistor Q12 are connected in series, and a split signal xSPLT is input to gates of the transistors Q11 and Q12. The split signal xSPLT becomes 0 V in the split output amplification mode, and the transistor is turned on. Accordingly, in the split output amplification mode, the capacitor Cdx1 and the resistive element Rdx1 are connected in series between the first node node1 and the second node node2.

The second S23 improvement circuit 16 is a circuit in which a transistor Q13, a capacitor (sixth capacitor) Cdx2, a resistive element (second resistive element) Rdx2, and a transistor Q14 are connected in series, and a split signal SPLT is input to gates of the transistors Q13 and Q14. The split signal SPLT becomes 1.8 V in the split output bypass mode, and the transistor is turned on. Accordingly, in the split output bypass mode, the capacitor Cdx2 and the resistive element Rdx2 are connected in series between the first node node1 and the second node node2.

Thus, in the split output amplification mode, S23 can be improved by enabling the first S23 improvement circuit 15, connecting the resistive element Rdx1 and the capacitor Cdx1 in series between the first node node1 and the second node node2, and optimizing the resistance value of the resistive element Rdx1 and the capacitance of the capacitor Cdx1. In the split output bypass mode, S23 can be improved by enabling the second S23 improvement circuit 16, connecting the resistive element Rdx2 and the capacitor Cdx2 in series between the first node node1 and the second node node2, and optimizing the resistance value of the resistive element Rdx2 and the capacitance of the capacitor Cdx2.

FIG. 30 is a diagram illustrating bias voltages and voltage values of the bias signals in modes of the LNA 1 of FIG. 29. As can be seen by comparing FIG. 30 with FIG. 28, the split output bypass mode which is not provided in the LNA 1 according to the eighth embodiment is added with the provision of the second S23 improvement circuit 16.

Figure 31:
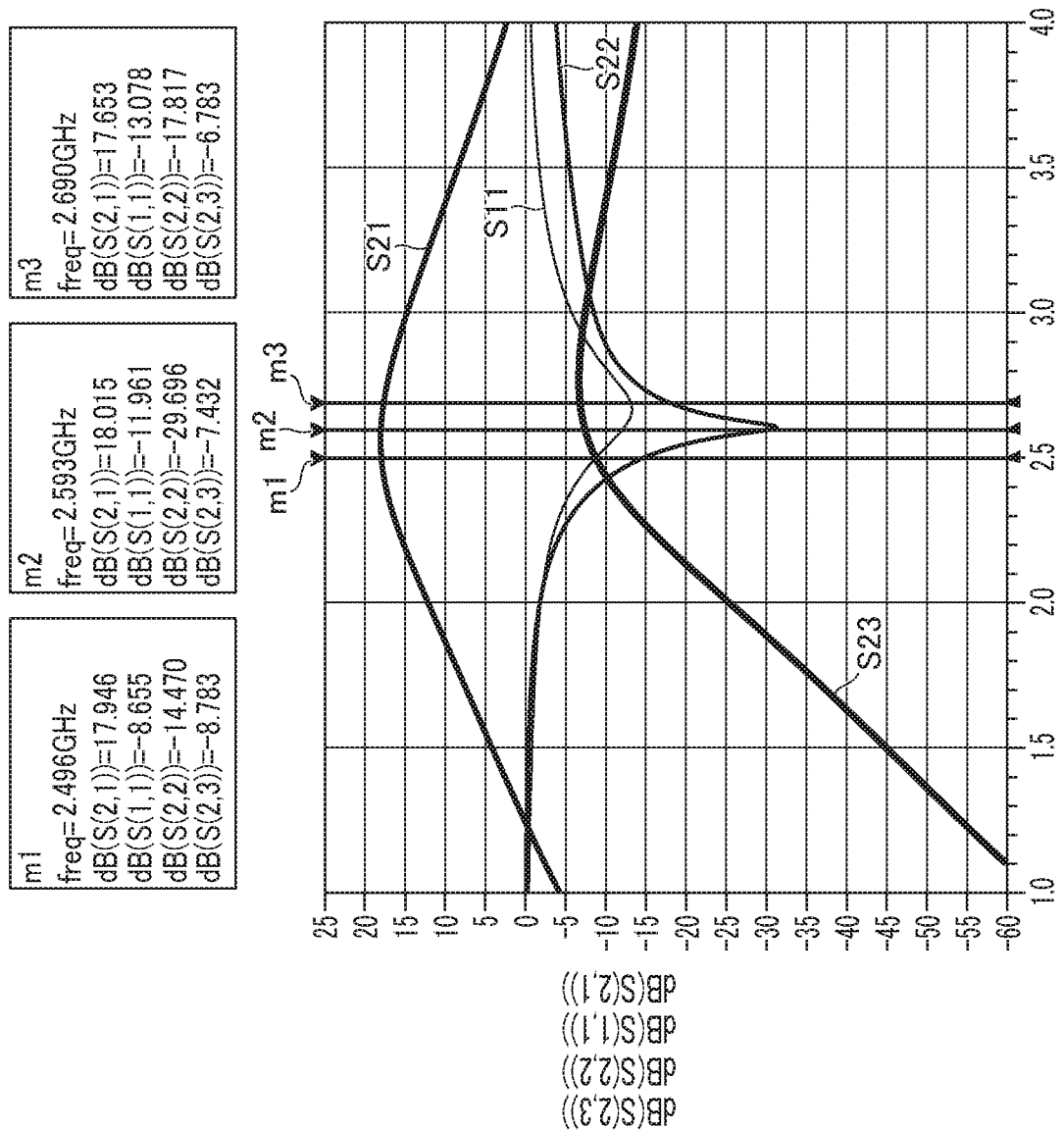
FIG. 31 is a diagram illustrating frequency characteristics of the S parameters in a single output amplification mode.
Figure 32:
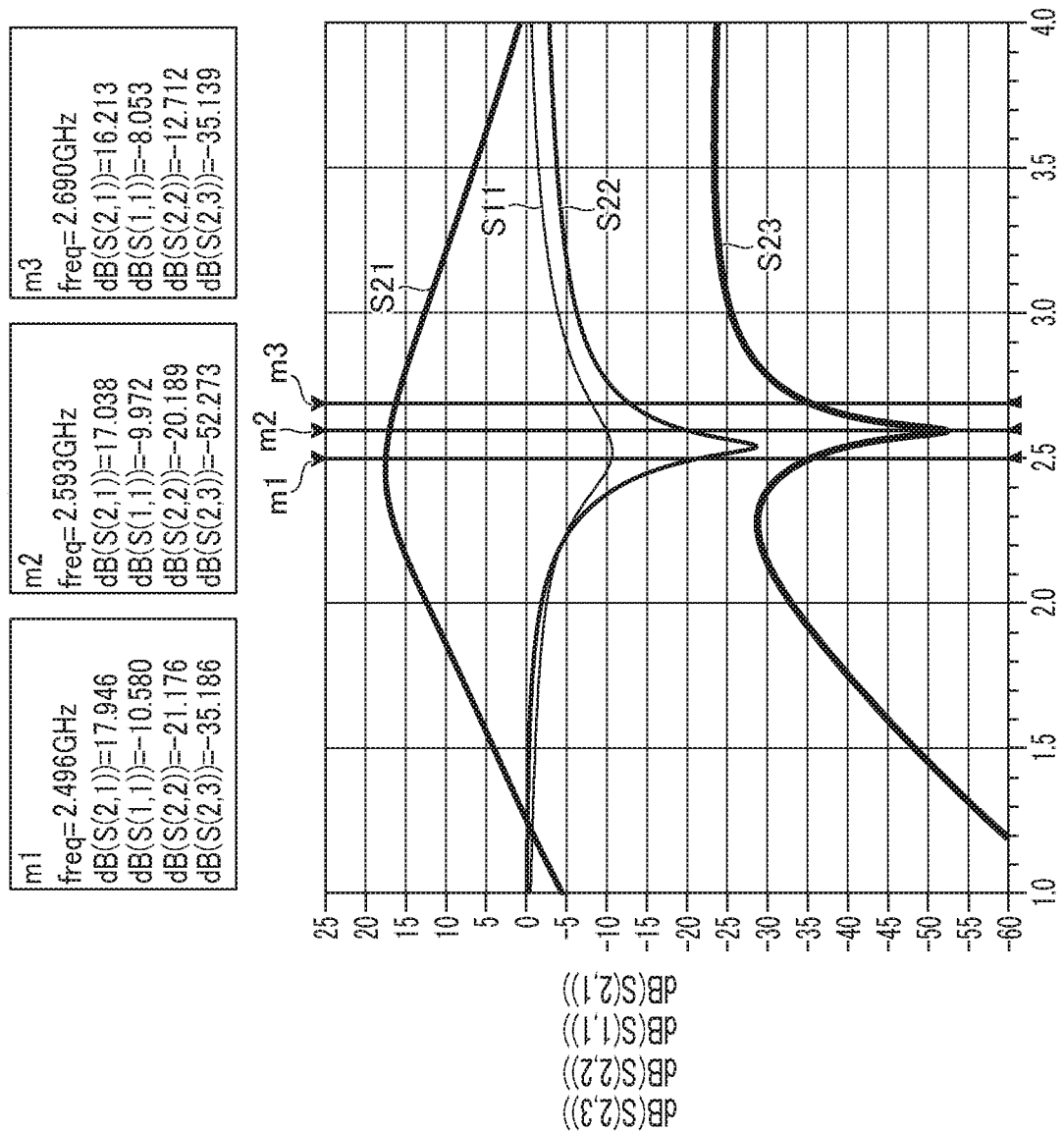
FIG. 32 illustrates frequency characteristics of the S parameters in a split output amplification mode.
Figure 33:
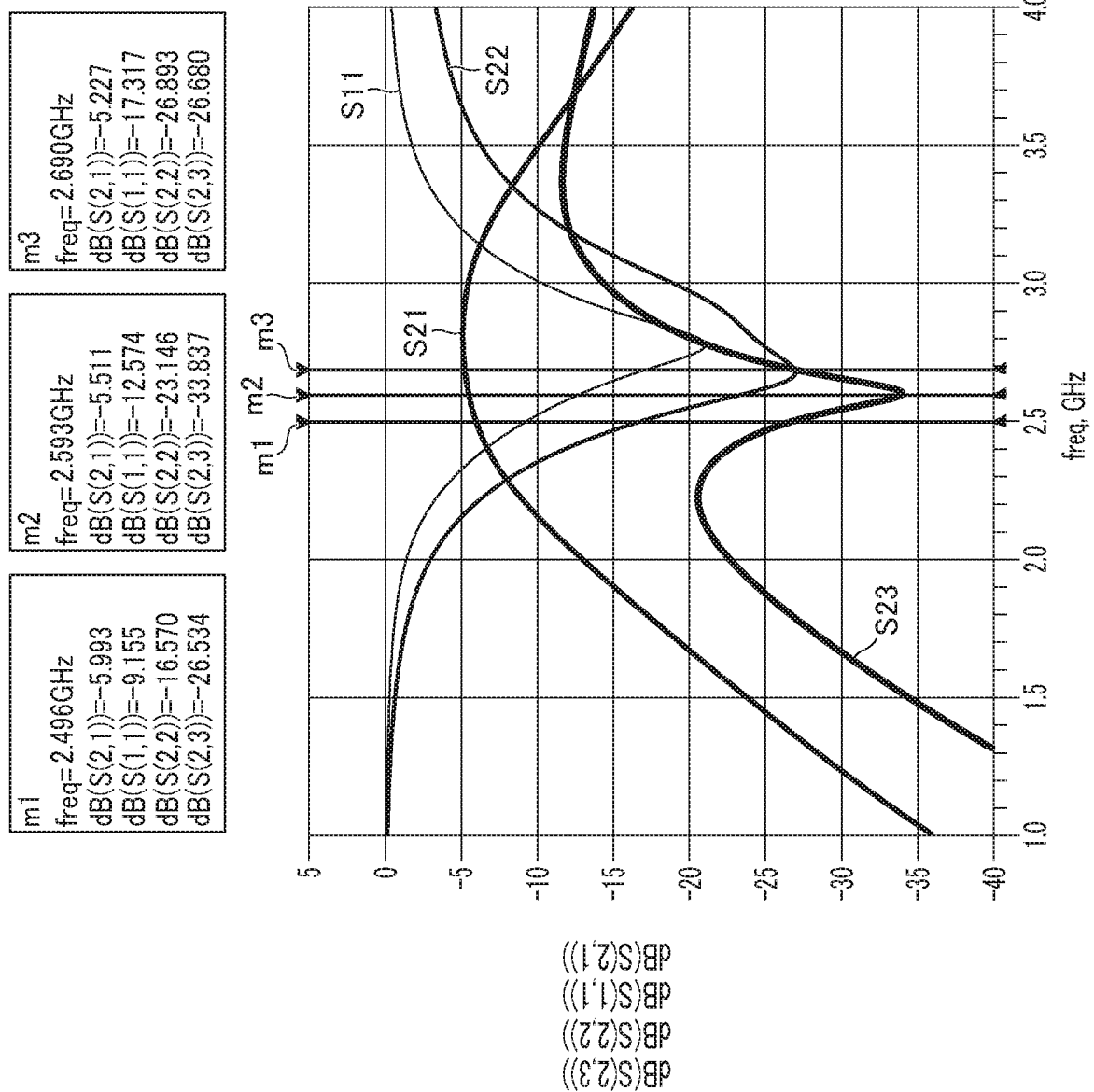
FIG. 33 illustrates frequency characteristics of the S-parameters in a split output bypass mode.

FIGS. 31 to 33 are diagrams illustrating frequency characteristics of the S parameters in the single output amplification mode, the split output amplification mode, and the split output bypass mode in the LNA 1 of FIG. 29. In these diagrams, a horizontal axis represents a frequency [GHz], and a vertical axis represents an S parameter value [dB]. FIG. 31 illustrates simulation results when the current Idd flowing through the amplified signal path 6 is 6.3 mA, and FIG. 32 illustrates simulation results when the current Idd is 12.6 mA. Since FIG. 33 is in the bypass mode, the current Idd is inevitably 0 mA.

As illustrated in FIG. 31, in the single output amplification mode, a gain of 18 dB is obtained at the center of the band. As an input and output return loss, S11 is −8.6 dB or less, and S22 is −14.4 dB or less. These values are favorable. As illustrated in FIG. 32, in the split output amplification mode, a gain of 17 dB is obtained at the center of the band. As an input and output return loss, S11 is −8.0 dB or less, and S22 is −12.7 dB or less. These values are favorable. S23 which becomes a problem during split output is −35.1 dB or less, and satisfies the general requirement value of −25 dB or less. As illustrated in FIG. 33, an insertion loss in the split output bypass mode is about 5.5 dB. Since an input signal branches into two, since a loss of 3 dB is generated in principle, the loss is substantially 2.5 dB, and is favorable. As an Input and output return loss, S11 is −9.1 dB or less, and S22 is −16.5 dB or less. These values are favorable. S23 also satisfies the general requirement of −26.5 dB or less.

The design of the first S23 improvement circuit 15 and the second S23 improvement circuit 16 can be performed by, for example, the following procedure. Initially, the LNA 1 in which the first S23 improvement circuit 15 and the second S23 improvement circuit 16 are omitted is designed, the drain of the transistor FET21 is port 1, the drain of the transistor FET22 is port 2, and a circuit configuration in a state in which an input side node of the externally connected inductor Lext is terminated by 50Ω is circuit A. When an admittance matrix element Y21 of the circuit A is Y21A and the admittance matrix element Y21 of the first or second S23 improvement circuit 16 is Y21 (B), the resistance value of each of the resistive elements Rdx1 and Rdx2 and the capacitance of each of the capacitors Cdx1 and Cdx2 of the first S23 improvement circuit 15 and the second S23 improvement circuit 16 may be set such that Y21 (B)=−Y21A is satisfied at the band center frequency.

As stated above, in the ninth embodiment, since the first S23 improvement circuit 15 for the split output amplification mode and the second S23 improvement circuit 16 for the split output bypass mode are provided, the isolation between the output nodes OUT1 and OUT2 can be improved in the split output amplification mode and the split output bypass modes.

Tenth Embodiment

Figure 34:
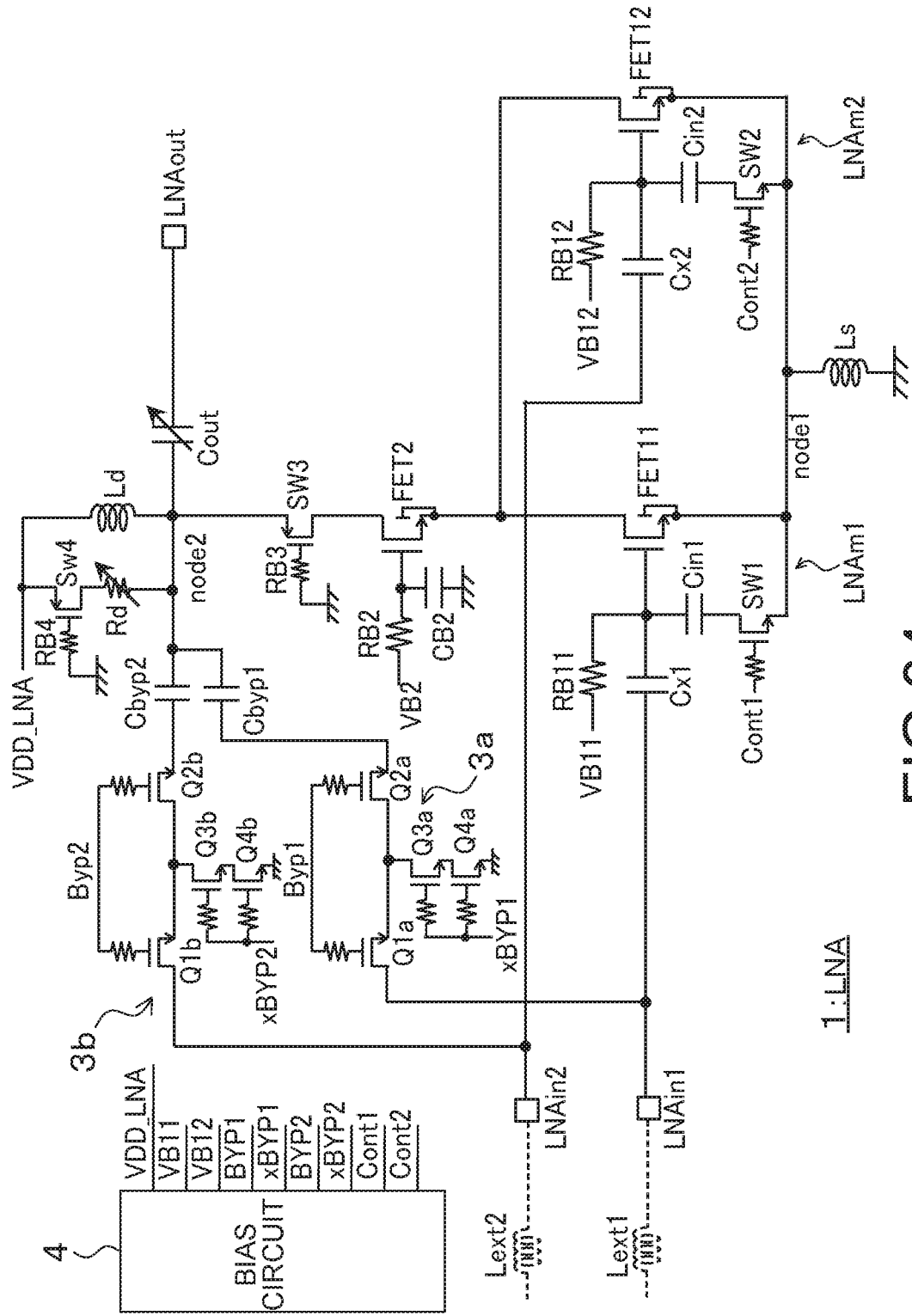
FIG. 34 is a circuit diagram of an LNA according to a tenth embodiment.

FIG. 34 is a circuit diagram of an LNA 1 according to a tenth embodiment. The LNA 1 of FIG. 34 has one output for two inputs. Generally, the LNA 1 has narrow band frequency characteristics, and a plurality of LNAs 1 is required to realize multiband compatibility. The LNA 1 according to the present embodiment is characterized in that the LNA has wideband characteristics requiring two LNAs 1 in the related art.

The LNA 1 of FIG. 34 has two built-in LNAm1 of 617 MHz to 800 MHz and LNAm2 of 746 MHz to 960 MHz. In the LNAm1 and the LNAm2, a transistor (third transistor) FET2, a transistor (fourth transistor) SW3, an inductor (first inductor) Ld, an inductor (second inductor) Ls, an output matching resistor Rd, and an output matching capacitor Cout are commonly used.

The LNAm1 includes a transistor (first transistor) FET11, a resistive element RB11, capacitors Cx1 and Cin1, and a transistor SW1. The transistor FET11 is connected between a source of the transistor FET2 and one end of the inductor Ls. A bias voltage VB11 is supplied to a gate of the transistor FET11 via the resistive element RB11. The capacitor Cin1 and the transistor SW1 are connected in series between the gate of the transistor FET11 and one end of the inductor Ls. A control signal Cont1 is input to the gate of the transistor SW1.

The LNAm2 includes a transistor (second transistor) FET12, a resistive element RB12, capacitors Cx2 and Cin2, and a transistor SW2. The transistor FET12 is connected between a source of the transistor FET2 and one end of the inductor Ls. A bias voltage VB12 is supplied to a gate of the transistor FET12 via the resistive element RB12. The capacitor Cin2 and the transistor SW2 are connected in series between the gate of the transistor FET12 and one end of the inductor Ls. A control signal Cont2 is input to the gate of the transistor SW2.

The LNAm1 and the LNAm2 include separate bypass switching circuits 3a and 3b, respectively. The bypass switching circuit (first bypass switching circuit) 3a includes transistors (fifth to seventh transistors) Q1a to Q4a constituting a T-type switch, and the bypass switching circuit (second bypass switching circuit) 3b includes transistors (eighth to tenth transistors) Q1b to Q4b constituting a T-type switch. The specific configurations of the bypass switching circuits 3a and 3b are the same as that of the bypass switching circuit 3 of FIG. 1, and thus, the detailed description thereof is omitted. The bypass switching circuit 3a transmits the high-frequency input signal input to the input node LNAin1 when a bypass signal BYP1 is high (H). The bypass switching circuit 3b transmits the high-frequency input signal input to the input node LNAin2 when a bypass signal BYP2 is high (H).

The output matching resistor Rd and the output matching capacitor Cout are set to values according to the selected frequency band. The output matching capacitor Cout is also changed depending on the values of the amplification mode and the bypass mode.

FIG. 35 is a diagram illustrating bias voltages and voltage values of the bias signals in modes of the LNA 1 of FIG. 34. As illustrated in FIG. 35, the LNA 1 of FIG. 34 has the amplification mode and the bypass mode, and has a mode for amplifying the high-frequency input signal input to the input node LNAin 1 and a mode for amplifying the high-frequency input signal input to the input node LNAin 2 in each mode.

Figure 36:
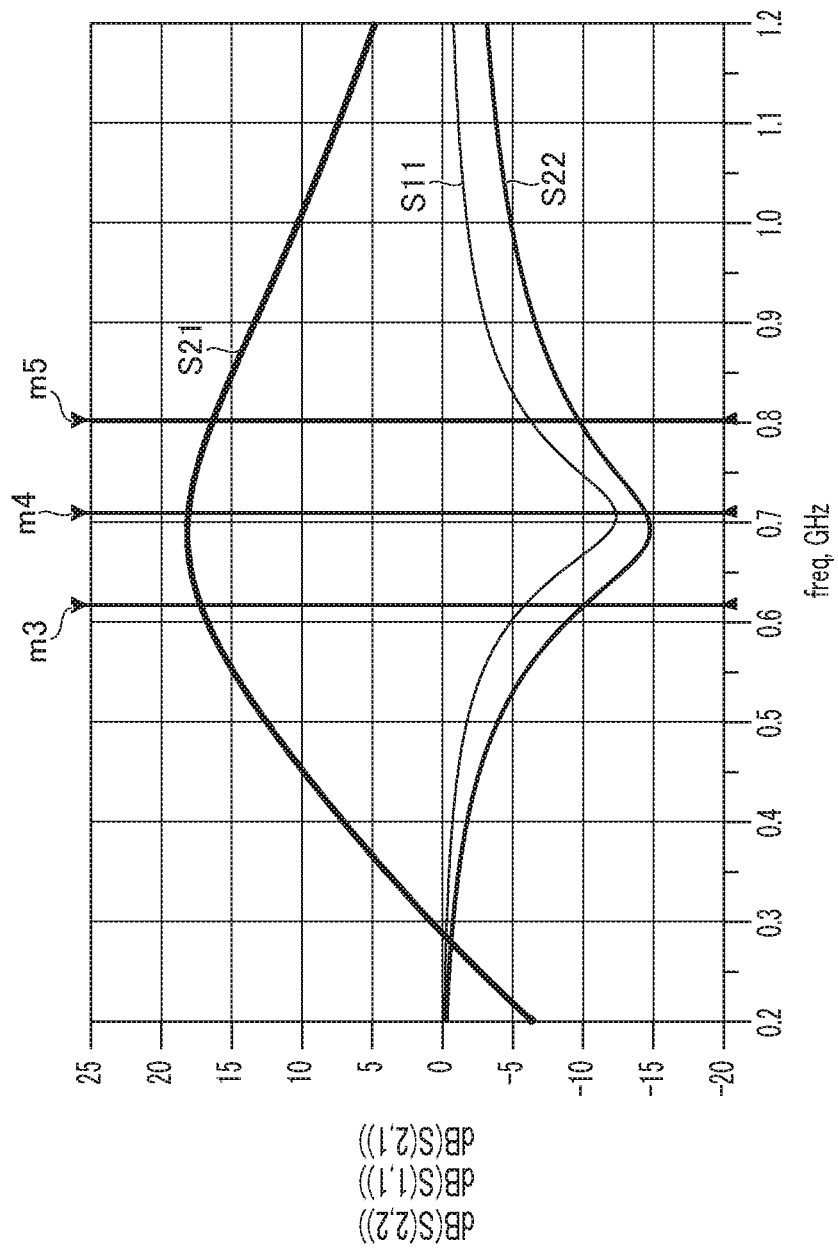
FIG. 36 is a diagram illustrating transfer characteristics in an amplification mode for amplifying a high-frequency input signal input to an input node LNAin1.
Figure 37:
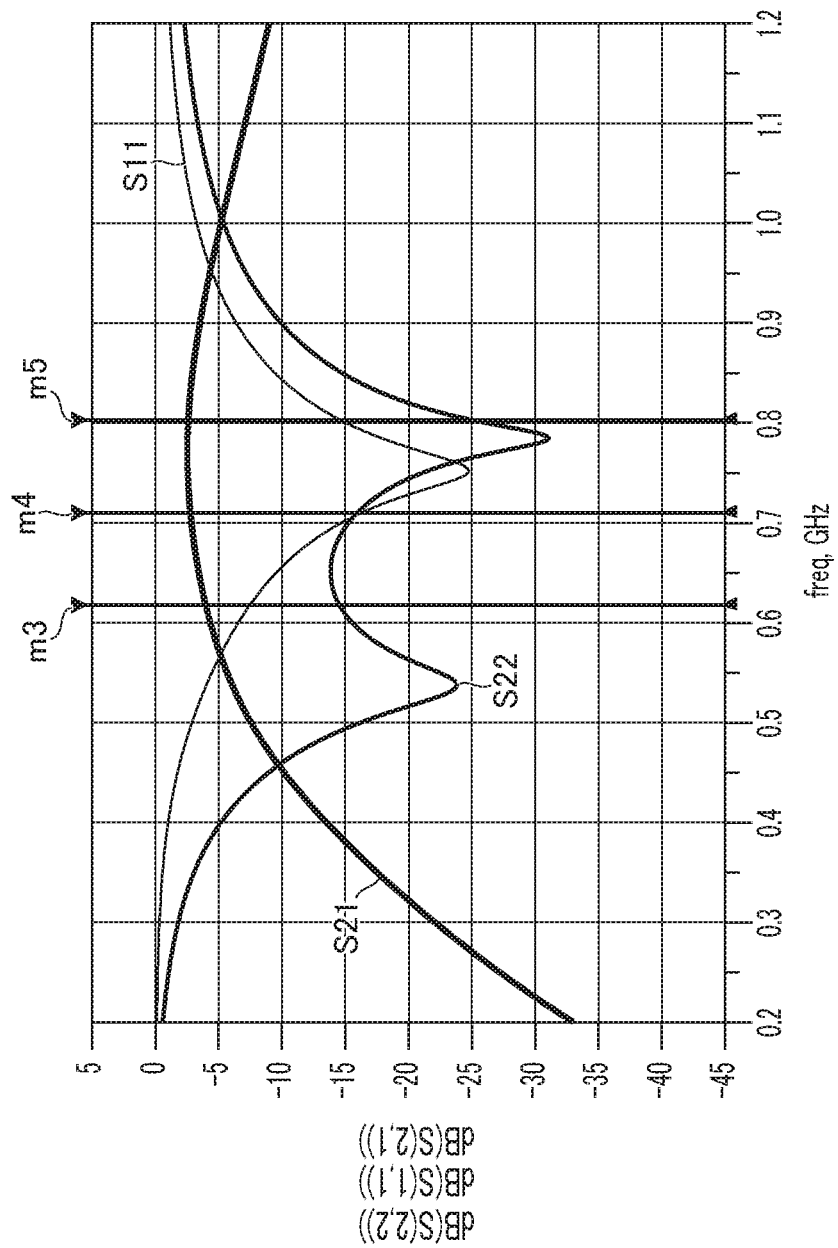
FIG. 37 is a diagram illustrating transfer characteristics in a bypass mode for bypassing the high-frequency input signal input to the input node LNAin1.
Figure 38:
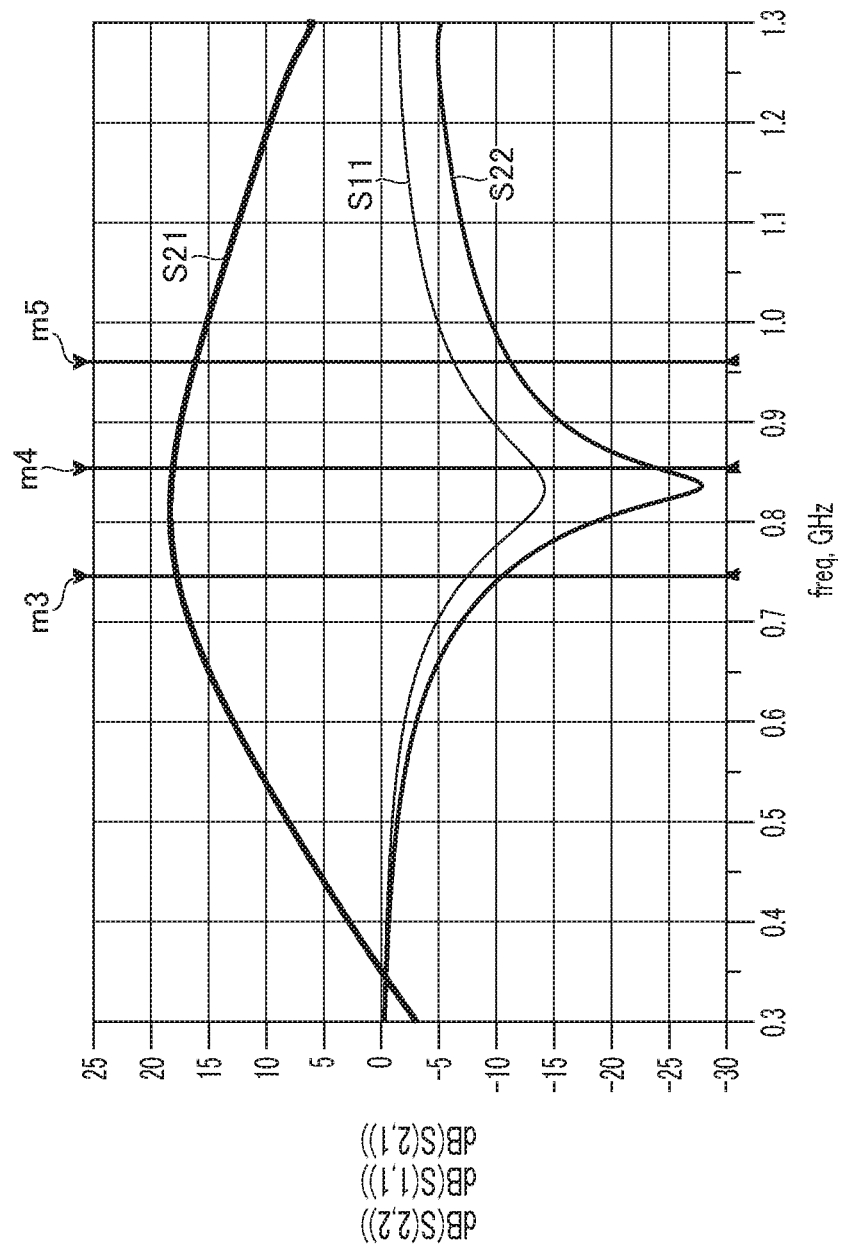
FIG. 38 is a diagram illustrating transfer characteristics in an amplification mode for amplifying a high-frequency input signal input to an input node LNAin2.
Figure 39:
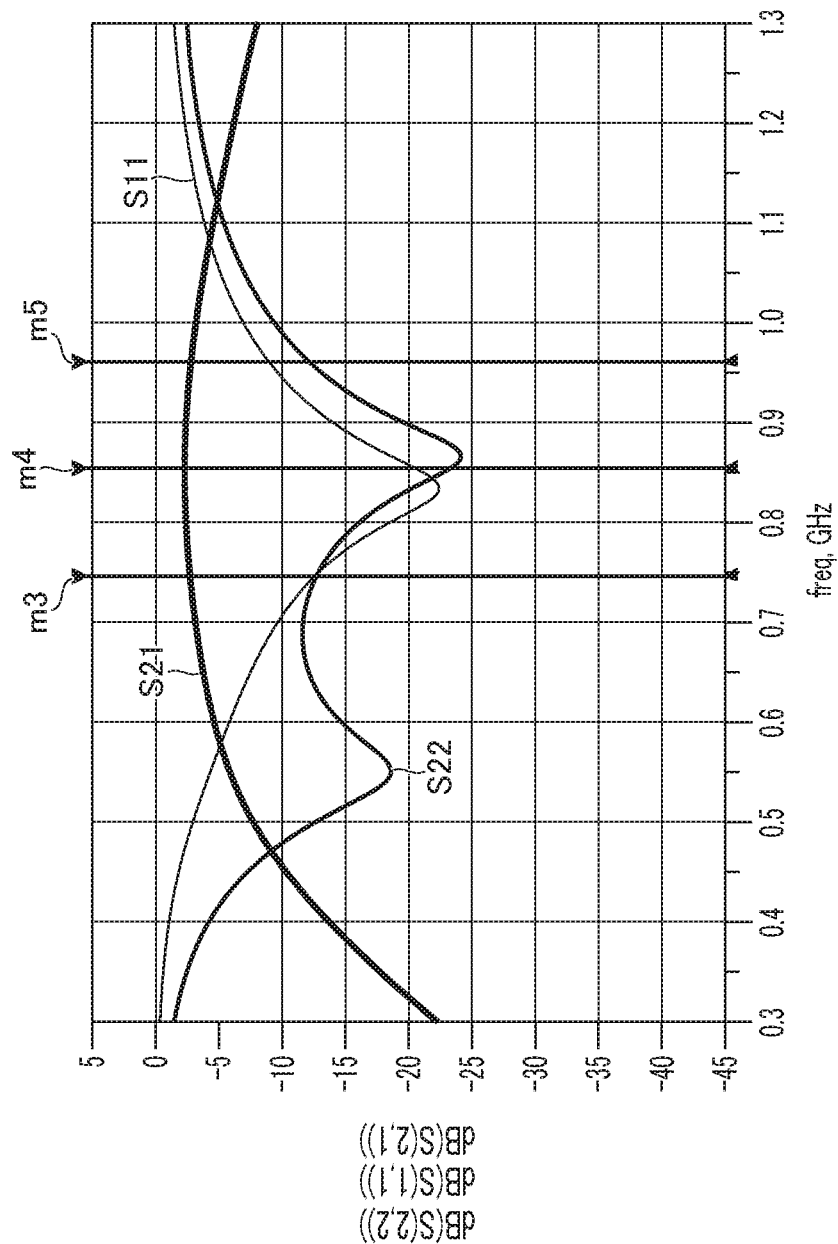
FIG. 39 is a diagram illustrating transfer characteristics in a bypass mode for bypassing the high-frequency input signal input to the input node LNAin2.

FIG. 36 is a diagram illustrating transfer characteristics of the amplification mode for amplifying the high-frequency input signal input to the input node LNAin1. FIG. 37 is a diagram illustrating transfer characteristics of the bypass mode for bypassing the high-frequency input signal input to the input node LNAin1. FIG. 38 is a diagram illustrating transfer characteristics of the amplification mode for amplifying the high-frequency input signal input to the input node LNAin2. FIG. 39 is a diagram illustrating transfer characteristics of the bypass mode for bypassing the high-frequency input signal input to the input node LNAin2. In FIGS. 36 to 39, a horizontal axis represents a frequency [GHz], and a vertical axis represents an S parameter value [dB].

The gain at the center of the band in FIG. 36 is 18 dB, and S22 is −9.6 dB or less within the band. These values are favorable. The loss at the center of the band in FIG. 37 is 2.8 dB, and S22 is −14 dB or less in the band. These values are favorable. The gain at the center of the band in FIG. 38 is 18.1 dB, and S22 is −10.5 dB or less in the band. These values are favorable. The loss at the center of the band in FIG. 39 is 2.3 dB, and S22 is −12.2 dB or less in the band. These values are favorable.

As described above, in the tenth embodiment, the LNA 1 compatible with a multiband with a simple circuit configuration can be provided, and the high-frequency input signal can be bypassed by providing the bypass switching circuit 3 for each band.

Eleventh Embodiment

Figure 40:
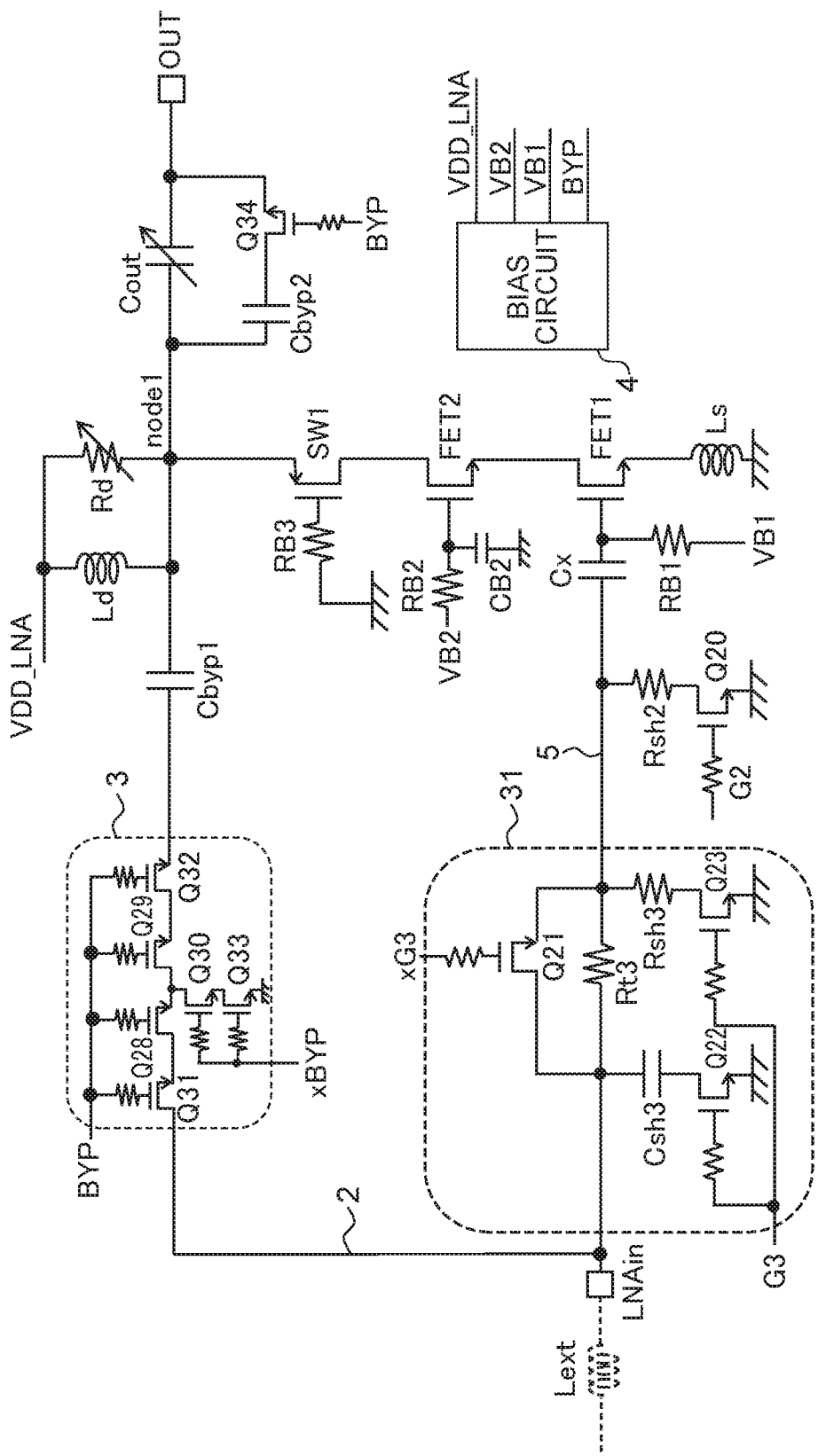
FIG. 40 is a circuit diagram of a high-frequency low-noise amplifier circuit according to an eleventh embodiment.

FIG. 40 is a circuit diagram of a high-frequency low-noise amplifier circuit (hereinafter, referred to as an LNA) 1 according to an eleventh embodiment. The LNA 1 of FIG. 40 can be disposed on, for example, an SOI substrate. A peripheral circuit of the LNA 1, for example, an antenna switch and the LNA 1 may be arranged on the same SOI substrate. For example, the LNA 1 of FIG. 40 is used in a wireless device such as a mobile phone or a smartphone, but is used regardless of the purpose of use and the implementation location. The LNA 1 of FIG. 40 can switch the gain in a plurality of modes. Hereinafter, an example in which the gain can be switched in four modes by switching the gain mode will be described, but the number of gain modes to be switched is not necessarily limited to four, and may be two or more. In the present specification, a first gain G0 mode is a maximum gain mode, a second gain G1 mode is a second largest gain mode, a third gain G2 mode is a second smallest gain mode, and a fourth gain G3 mode is a minimum gain mode. The LNA 1 of FIG. 40 has a bypass BYP mode for outputting the high-frequency input signal as it is without adjusting the gain.

The LNA 1 of FIG. 40 includes a source-grounded transistor (first transistor) FET1, a gate-grounded transistor (second transistor) FET2, a first inductor Ls, a second inductor Ld, a variable resistive element Rd, and a transistor (sixth transistor) SW1, a variable capacitor (first capacitor) Cout, an attenuator 31, a shunt resistor Rsh2, a bypass switching circuit 3, and a bias circuit 4.

The transistor SW1 is a P-type MOS transistor, and all other transistors are N-type MOS transistors. As will be described below, the variable resistive element Rd can be constituted by using a P-type MOS transistor.

An input signal path 5 is connected to a gate of the transistor FET1. An input node LNAin to which the high-frequency input signal is input, the attenuator 31, and a capacitor Cx are connected on the input signal path 5. An external inductor Lext is connected to the input node LNAin, and the high-frequency input signal is input to an input node LNAin via the external inductor Lext. In the present embodiment, it is assumed that the LNA 1 of FIG. 40 is formed on an SOI substrate so as to be formed into a chip, and since there is no space enough to form the external inductor Lext within the chip, the external inductor is externally attached. When there is a sufficient space within the chip, the external inductor Lext may be built in the chip.

The input signal path 5 is connected to the gate of the transistor FET1 via the capacitor Cx. A first bias voltage VB1 via a resistive element RB1 is supplied to the input signal path 5. The first bias voltage VB1 is generated by the bias circuit 4.

The shunt resistor Rsh2 and a transistor Q20 are connected between the input signal path 5 and a first reference potential node. The transistor Q20 is turned on in the third gain G2 mode, and the shunt resistor Rsh2 is connected between the input signal path 5 and the first reference potential node. Accordingly, the gain of the high-frequency input signal can be lowered in the third gain G2 mode. The first reference potential node is, for example, a ground node. Hereinafter, the first reference potential node is expressed as GND.

A source of the transistor FET1 is grounded, and the first inductor Ls is connected between the source of the transistor FET1 and the first reference potential node GND.

The transistor FET2 is cascode-connected to the transistor FET1. More specifically, a drain of the transistor FET1 is connected to a source of the transistor FET2. A bias voltage VB2 is supplied to a gate of the transistor FET2 via a resistive element RB2. A capacitor CB2 is connected between the gate of the transistor FET2 and the first reference potential node GND. Since both a capacitance of the capacitor CB2 and a resistance value of the resistor RB2 are sufficiently large, the transistor FET2 functions as a gate-grounded amplifier. A drain of the transistor SW1 is connected to the drain of the transistor FET2. One ends of the second inductor Ld, the variable resistive element Rd, a capacitor Cbyp1, the variable capacitor Cout, and a capacitor Cbyp2 are connected to a source of the transistor SW1. The other ends of the second inductor Ld and the variable resistive element Rd are connected to a second reference potential node VDD_LNA.

A gate of the transistor SW1 is connected to the first reference potential node GND via a resistive element RB3. The transistor SW1 is turned on in the first to fourth gain G0 to G3 modes, and is turned off in the bypass mode. As stated above, the transistor SW1 disconnects a signal path that extends to the first inductor Ls through the drain and the source of the transistor FET2 and the drain and the source of the transistor FET1 in the bypass mode. Accordingly, even though the high-frequency input signal having the large amplitude propagates on the bypass path 2 in the bypass mode, there is no concern that the transistors FET1 and FET2 are erroneously operated.

The attenuator 31 is connected on the input signal path 5 connected to the gate of the transistor FET1, and attenuates the high-frequency input signal in the fourth gain G3 mode. In the gain modes other than the fourth gain G3 mode, the attenuator 31 transmits the high-frequency input signal without attenuating the high-frequency input signal. The attenuator 31 includes a capacitor (second capacitor) Csh3, a resistive element (first resistive element) Rt3, and a resistive element (second resistive element) Rsh3. The resistive element Rt3 is connected to the input signal path 5 in the fourth gain G3 mode. The capacitor Csh3 is connected between the input signal path 5 between the input node LNAin of the high-frequency input signal and one end of the resistive element Rt3 and the first reference potential node GND in the fourth gain G3 mode. The resistive element Rsh3 is connected between the input signal path 5 between the other end of the resistive element Rt3 and the gate of the transistor FET1 and the first reference potential node GND in the fourth gain G3 mode. The capacitor Csh3 is provided, and thus, S11 which is the S parameter in the fourth gain G3 mode can be improved.

As described above, the attenuator 31 bypasses the resistive element Rt3 and disconnects the capacitor Csh3 and the resistive element Rsh3 from the input signal path 5 in the first to third gain G0 to G2 modes having higher gain than that in the fourth gain G3 mode. In the fourth gain G3 mode, the attenuator 31 connects the resistive element Rt3 on the input signal path 5, connects the capacitor Csh3 between the input signal path 5 and the first reference potential node GND, and connects the resistive element Rsh3 between the input signal path 5 from the resistive element Rt3 to the gate of the transistor FET1 and the first reference potential node GND.

The attenuator 31 may include a transistor (third transistor) Q21, a transistor (fourth transistor) Q22, and a transistor (fifth transistor) Q23. The transistor Q21 switches whether or not to bypass the resistive element Rt3. The transistor Q22 switches whether or not to connect the capacitor Csh3 between the input signal path 5 between the input node LNAin and the resistive element Rt3 and the first reference potential node GND. The transistor Q23 switches whether or not to connect the resistive element Rsh3 between the input signal path 5 from the resistive element Rt3 to the gate of the transistor FET1 and the first reference potential node GND. The transistors Q21 to Q23 are turned on or off depending on whether or not the gain mode is the fourth gain G3 mode. That is, in the fourth gain G3 mode, the transistor Q22 and the transistor Q23 are turned on, and the transistor Q21 is turned off. Accordingly, in the fourth gain G3 mode, the resistor Rt3 is connected on the input signal path 5, and the capacitor Csh3 and the resistive element Rsh3 are connected between the input signal path 5 and the first reference potential node GND. Therefore, the high-frequency input signal is sufficiently attenuated in the fourth gain G3 mode.

The bias circuit 4 generates the bias voltages VB1 and VB2. The resistors RB1 and RB2 connected to the gates of the transistors FET1 and FET2 are provided in order to prevent the high-frequency input signal RFin from being introduced to the bias circuit 4. For example, the bias voltage VB1 is set to, for example, 0.5 V or 0.55 V, the bias voltage VB2 is set to, for example, 1.3 V or 1.34 V, and the second reference potential VDD_LNA is set to, for example, 1.8 V.

The LNA 1 of FIG. 40 includes a bypass path 2 that bypasses the high-frequency input signal in the bypass mode. In the bypass mode, the high-frequency input signal is transmitted to the output node OUT through the bypass path 2 without being amplified by the transistors FET1 and FET2. The bypass path 2 is a path that bypasses the high-frequency input signal from the input node LNAin to the output node OUT via a connection node node1 between the second inductor Ld and the variable capacitor Cout such that the high-frequency input signal is not amplified by the transistors FET1 and FET2 in the bypass mode.

The bypass switching circuit 3 is connected on the bypass path 2. The bypass switching circuit 3 transmits the high-frequency input signal to the output node OUT without amplifying the high-frequency input signal in the bypass mode, and disconnects the bypass path 2 from the output node OUT in the first to fourth gain G0 to G3 modes.

More specifically, the bypass switching circuit 3 can be a T-type bypass switching circuit including at least three transistors Q28 to Q30. The transistor (seventh transistor) Q28 and the transistor (eighth transistor) Q29 are cascode-connected on the bypass path 2. The transistor Q30 (ninth transistor) is connected between a connection node between the transistors Q28 and Q29 and the first reference potential node GND. The transistor Q28 and the transistor Q29 are turned off in the first to fourth gain G0 to G3 modes, and are turned on in the bypass mode. The transistor Q30 is turned on in the first to fourth gain G0 to G3 modes, and is turned off in the bypass mode.

In the LNA 1 of FIG. 40, three transistors Q31 to Q33 are further added in the bypass switching circuit 3. The transistors Q31, Q28, Q29, and Q32 are cascode-connected on the bypass path 2, and the transistors Q30 and Q33 are cascode-connected between the bypass path 2 and the first reference potential node GND. The reason why these three transistors Q31 to Q33 are added is that IP1 dB in the fourth gain G3 mode is further improved, and these three transistors Q31 to Q33 are not essential components.

The capacitor Cbyp1 is connected on the bypass path 2. The capacitor Cbyp2 and a transistor Q34 are connected in parallel with the variable capacitor Cout. The transistor Q34 is turned on in the bypass mode. Therefore, in the bypass mode, the variable capacitor Cout and the capacitor Cbyp2 are connected in parallel. In the first to fourth gain G0 to G3 modes, the transistor Q34 is turned off, and only the variable capacitor Cout is connected to the output node OUT.

The variable resistive element Rd is connected in parallel with the second inductor Ld. In the present embodiment, it is assumed that resistance value and capacitance of the variable resistive element Rd and the variable capacitor Cout are optimized for the first to fourth gain G0 to G3 modes.

Figure 41:
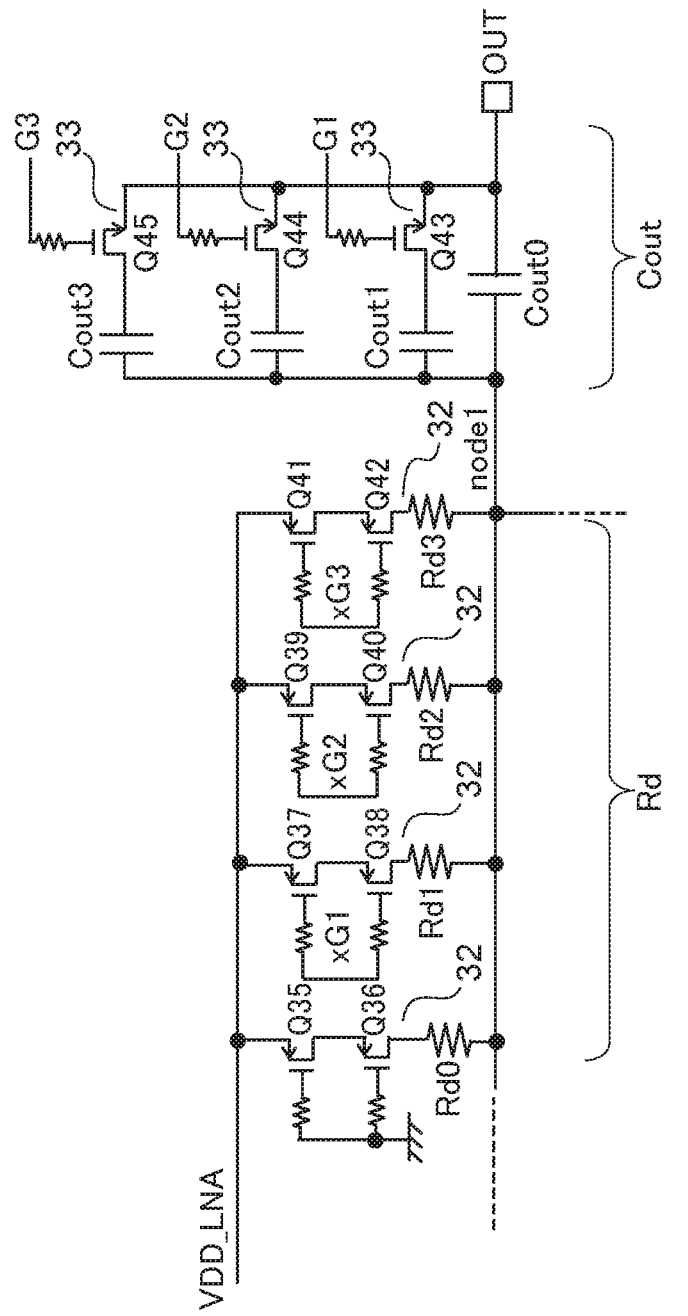
FIG. 41 is a circuit diagram illustrating an example of a specific circuit configuration of a variable resistive element and a variable capacitor of FIG. 40.
Figures 44A, 44B:
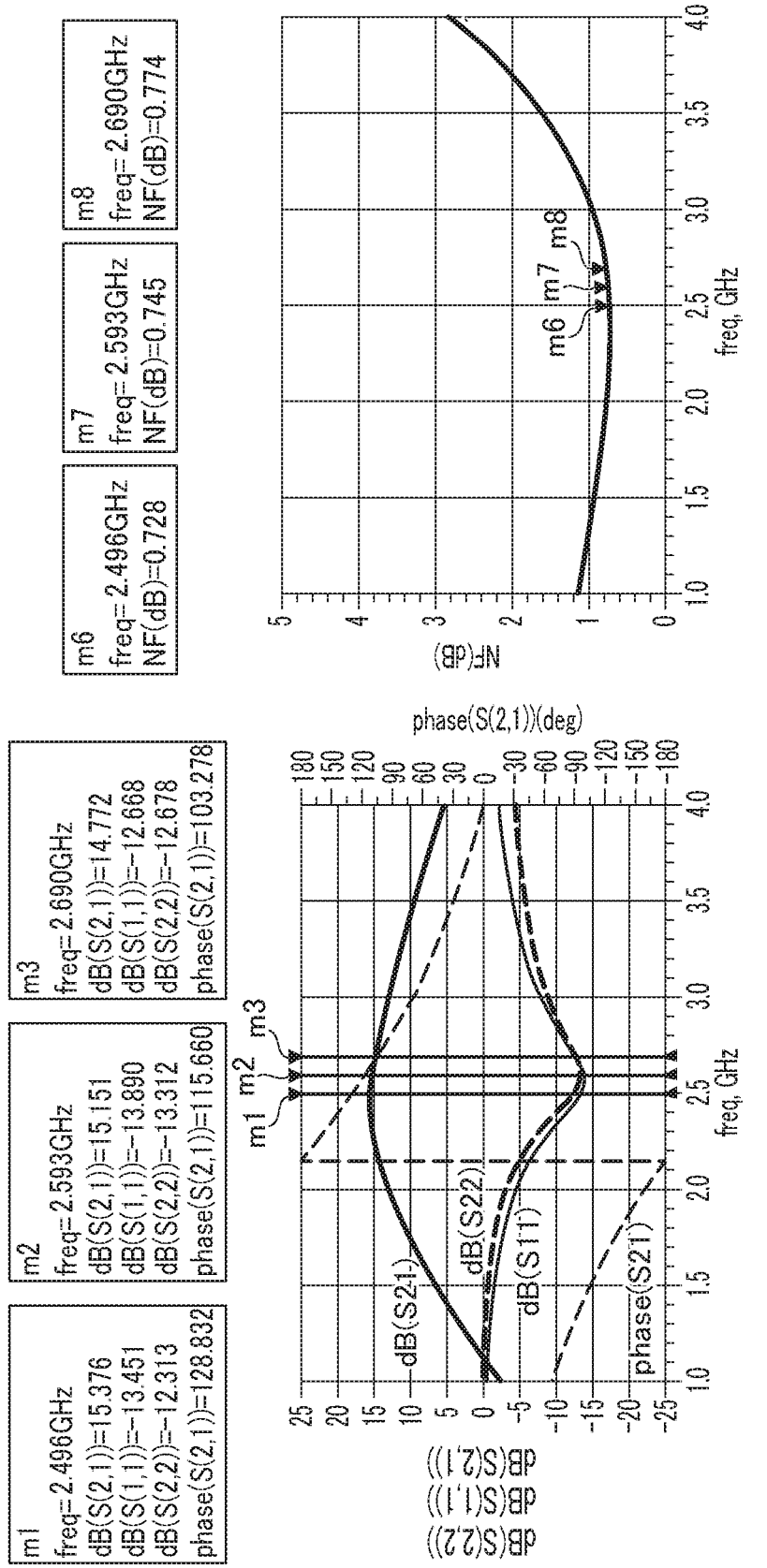
FIGS. 44A and 44B are diagrams illustrating simulation results of S parameters and NFs in a G1 mode.

FIG. 41 is a circuit diagram illustrating an example of a specific circuit configuration of the variable resistive element Rd and the variable capacitor Cout of FIG. 40. The variable resistive element Rd of FIG. 41 includes four variable resistor circuits 32 for the first to fourth gain G0 to G3 modes, and these variable resistor circuits 32 are connected in parallel. These variable resistor circuits 32 are connected between the second reference potential node VDD_LNA and the internal output node node1. The internal output node node1 is the node connected to the source of the transistor SW1 in FIG. 40.

The variable resistor circuit 32 for the first gain G0 mode includes two cascade-connected P-type MOS transistors (first switch circuits) Q35 and Q36, and a resistive element Rd0. Gates of these transistors Q35 and Q36 are connected to the first reference potential node GND via resistive elements. Thus, these transistors are turned on in any of the first to fourth gain G0 to G3 modes, and the resistive element Rd0 is connected between the second reference potential node VDD_LNA and the internal output node node1. The reason why the two transistors Q35 and Q36 are cascade-connected is that IP1 dB in the bypass mode is not deteriorated, and three or more transistors may be cascode-connected as necessary.

The variable resistor circuit 32 for the second gain G1 mode includes two cascode-connected P-type MOS transistors (first switch circuits) Q37 and Q38, and a resistive element Rd1. An xG1 signal is input to gates of the transistors Q37 and Q38 via resistive elements. The xG1 signal is a signal which is low in the second gain G1 mode. The resistive element Rd1 has a smaller resistance value than the resistive element Rd0. Therefore, in the second gain G1 mode, the resistive elements Rd0 and Rd1 are connected in parallel, The variable resistor circuit 32 for the third gain G2 mode includes two cascade-connected P-type MOS transistors (first switch circuits) Q39 and Q40, and a resistive element Rd2. An xG2 signal is input to gates of the transistors Q39 and Q40 via resistive elements. The xG2 signal is a signal which is low in the third gain G2 mode. The resistive element Rd2 has a smaller resistance value than the resistive element Rd1. Therefore, in the third gain G2 mode, the resistive elements Rd0 and Rd2 are connected in parallel.

The variable resistor circuit 32 for the fourth gain G3 mode includes two cascade-connected P-type MOS transistors (first switch circuits) Q41 and Q42, and a resistive element Rd3. An xG3 signal is input to gates of the transistors Q41 and Q42 via resistive elements. The xG3 signal is a signal which is low in the fourth gain G3 mode. The resistive element Rd3 has a smaller resistance value than the resistive element Rd2. Therefore, in the fourth gain G3 mode, the resistive elements Rd0 and Rd3 are connected in parallel.

As described above, the resistance values of the resistive elements Rd0 to Rd3 of the variable resistor circuits 32 within the variable resistive element Rd have a relationship of Rd0>Rd1>Rd2>Rd3, and as the gain mode has a larger gain, the resistance value of the variable resistive element Rd is set to a larger value.

In the variable capacitor Cout of FIG. 41, a capacitor Cout0 and three variable capacitor circuits 33 are connected in parallel between the internal output node node1 and the output node OUT.

The variable capacitor circuit 33 for the second gain G1 mode includes a capacitor Cout1 and a transistor (second switch circuit) Q43 connected in series. The capacitor Cout1 has a smaller capacitance than the capacitor Cout0. The transistor Q43 is turned on when the second gain G1 mode is high, and the capacitors Cout0 and Cout1 are connected in parallel.

The variable capacitor circuit 33 for the third gain G2 mode includes a capacitor Cout2 and a transistor (second switch circuit) Q44 connected in series. The capacitor Cout2 has a larger capacitance than the capacitor Cout1. The transistor Q44 is turned on when the third gain G2 mode is high, and the capacitors Cout0 and Cout2 are connected in parallel.

The variable capacitor circuit 33 for the fourth gain G3 mode includes a capacitor Cout3 and a transistor (second switch circuit) Q45 connected in series. The capacitor Cout3 has a larger capacitance than the capacitor Cout2. The transistor Q45 is turned on when the fourth gain G3 mode is high, and the capacitors Cout0 and Cout3 are connected in parallel.

As stated above, the capacitors Cout1 to Cout3 of the variable capacitor circuits 33 within the variable capacitor have a relationship of Cout1<Cout2<Cout3, and as the gain mode has a larger gain, the capacitance of the variable capacitor is set to a smaller value.

FIG. 42 is a diagram illustrating voltage values input to the gates of the transistors of FIGS. 40 and 41 in the first to fourth gain G0 to G3 modes and the bypass mode. FIG. 42 illustrates voltage values when the configuration of FIG. 41 is applied as the variable resistive element Rd and the variable capacitor of FIG. 40. The voltage values of FIG. 42 are examples, and can be arbitrarily changed according to the semiconductor process and usage environment of the LNA 1 of FIG. 40. In the example of FIG. 42, the second reference potential node VDD_LNA is set to 1.8 V in the first to fourth gain G0 to G3 modes, and is set to 0 V in the bypass mode. The bias voltages VB1 and VB2 generated by the bias circuit 4 are different in the first and second gain G0 and G1 modes, the third and fourth gain G2 and G3 modes, and the bypass mode.

Next, simulation results of simulation of the circuit of the LNA 1 of FIG. 40 are illustrated. FIGS. 43A, 44A, 45A, 46A, and 47A are S parameters in the first to fourth gain G0 to G3 modes and the bypass mode. A horizontal axis is a frequency [GHz], and a vertical axis is an S parameter value. In these diagrams, a curve of reflection characteristics S11 on the input side, a curve of reflection characteristics S22 on the output side, and a curve of passage characteristics S21 from the input side to the output side are illustrated.

FIGS. 43B, 44B, 45B, 46B, and 47B are diagrams illustrating noise figures NF in the first to fourth gain G0 to G3 modes and the bypass mode. A horizontal axis is a frequency [GHz], and a vertical axis is a noise figure NF [dB].

Figure 47B:
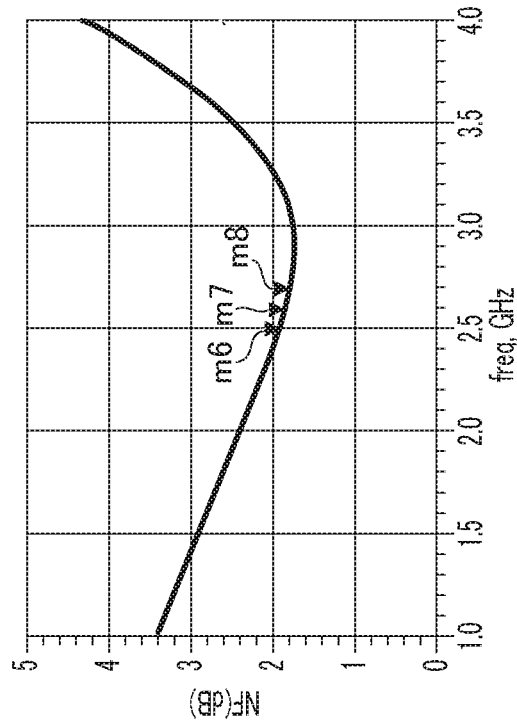
FIGS. 47A and 47B are diagrams illustrating simulation results of S parameters and NFs in a bypass mode.
Figure 47A:
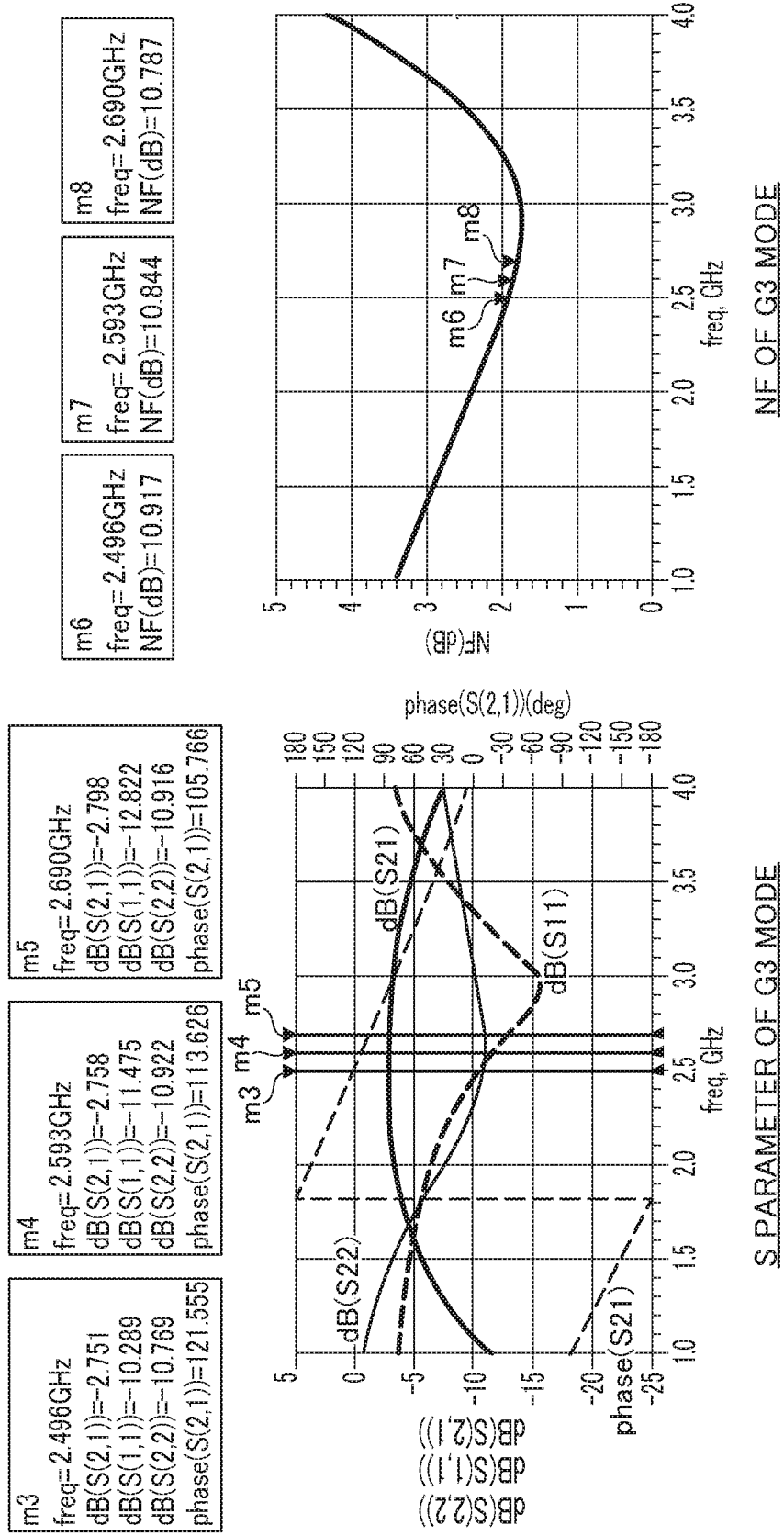

In these diagrams, marks are attached to 2.496 GHz, 2.593 GHz, and 2.690 GHz which are frequency bands of band 41 which is one of Long Term Evolution (LTE) bands. The LNA 1 according to the present embodiment is designed on the assumption that the LNA is used in the frequency band of the band 41. As can be seen from FIG. 47A illustrating the simulation result of the bypass mode, the S parameter within the frequency band of the band 41 is favorable. Both the insertion loss (−S21) and the noise figure NF are 3 dB or less, and S11 is −10 dB or less and S22 is −14 dB or less which satisfy the general requirements.

Figure 48:
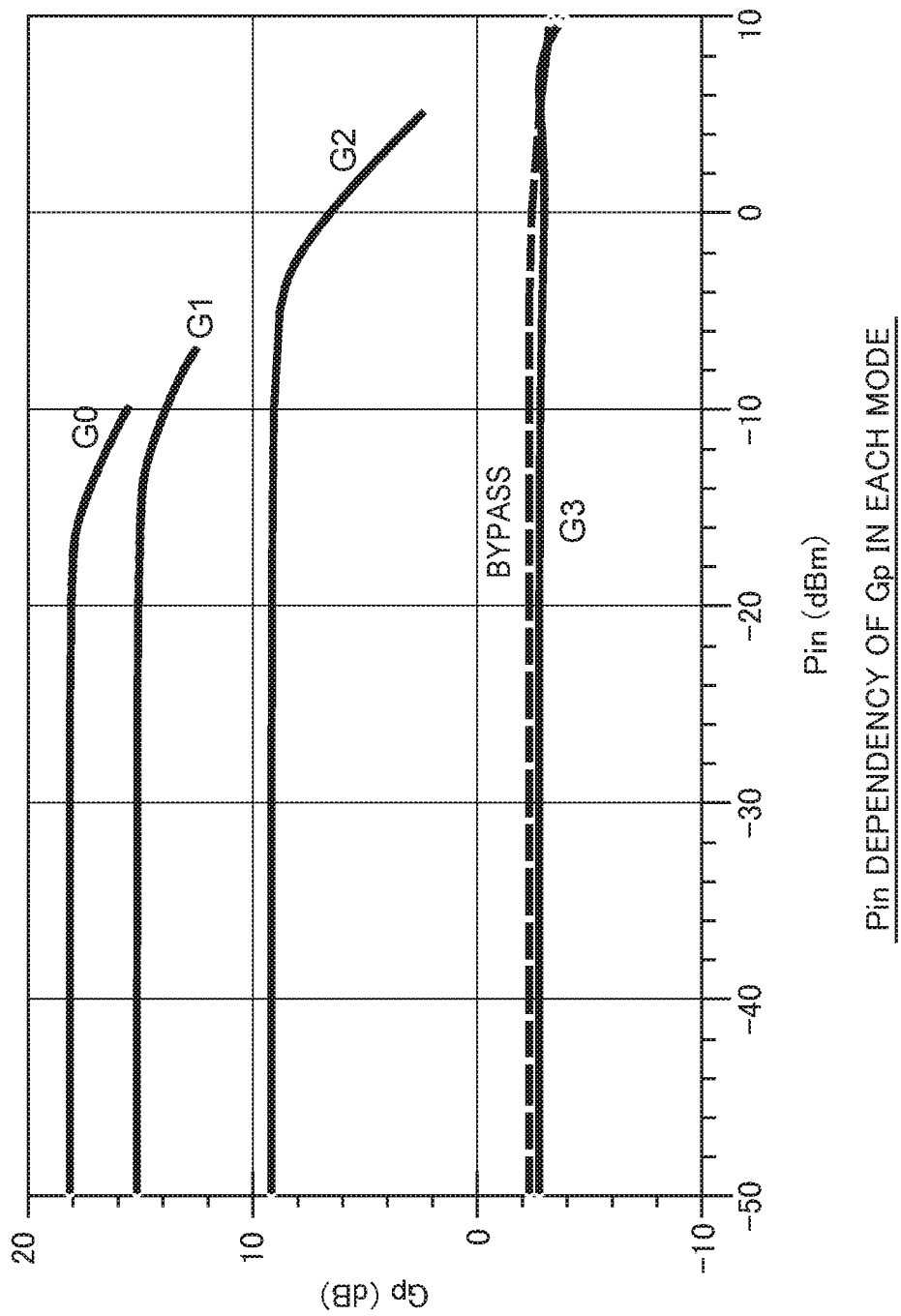
FIG. 48 is a diagram illustrating simulation results of dependency of a gain on an input signal power.

FIG. 48 is a diagram illustrating the dependency of a gain Gp on an input signal power Pin in the first to fourth gain G0 to G3 modes and the bypass mode. From FIG. 48, IP1 dB in the bypass mode is 9.2 dBm, and satisfies the general requirement of 8 dBm.

Figure 49:
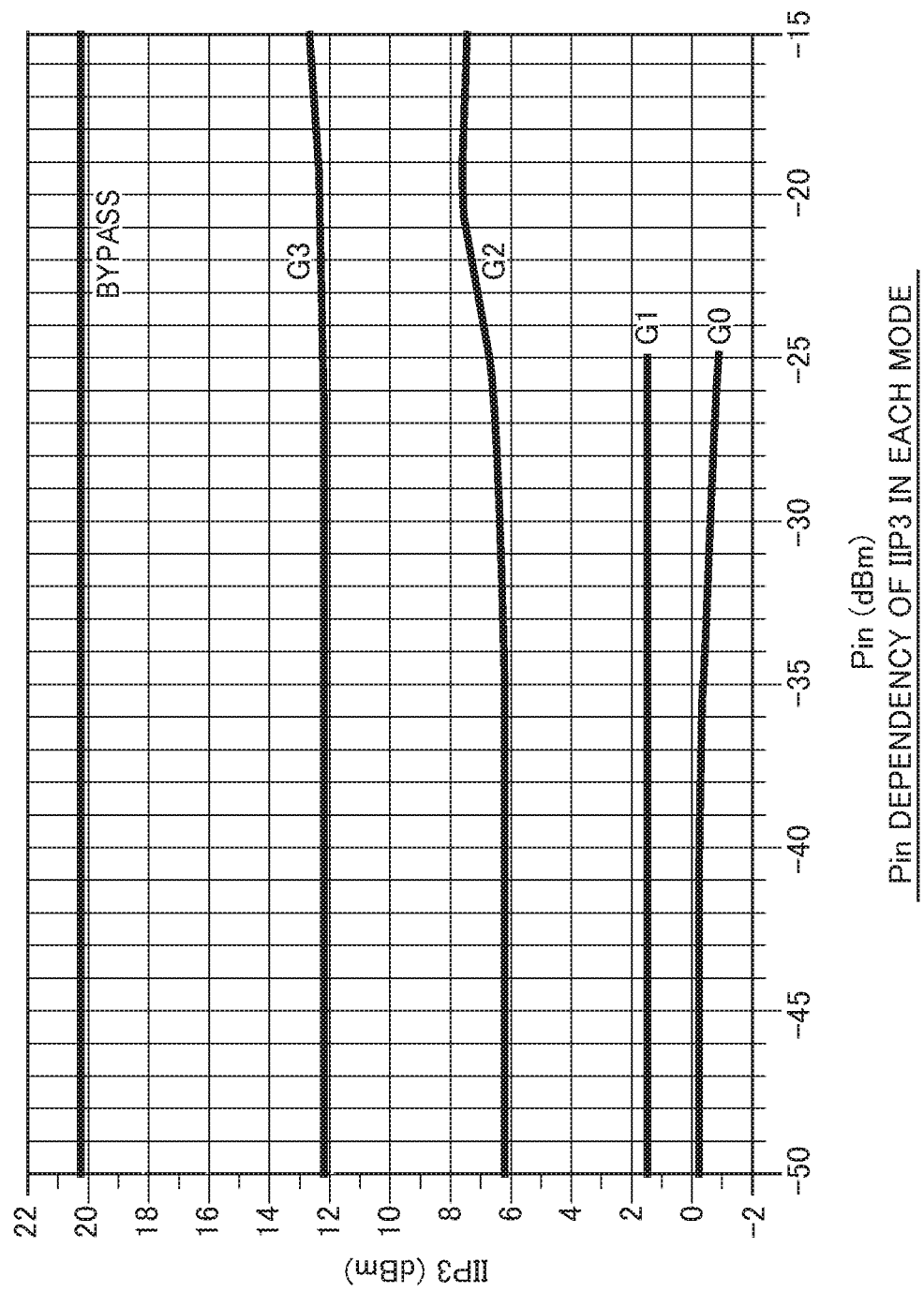
FIG. 49 is a diagram illustrating simulation results of dependency of IIP3 on an input signal power.

FIG. 49 is a diagram illustrating the dependency of IIP3 on the input signal power Pin in the first to fourth gain G0 to G3 modes and the bypass mode. As illustrated in the diagram, IIP3 in the fourth gain G3 mode is as large as about 12 [dBm], and is favorable characteristics.

FIG. 50 is a diagram representing general requirement specifications in the first to fourth gain G0 to G3 modes and the bypass mode. FIG. 51 is a diagram representing the simulation results of FIGS. 43 to 49. As illustrated in FIG. 51, it can be seen that the simulation results according to the present embodiment satisfy the requirement specifications of FIG. 50.

Figure 52:
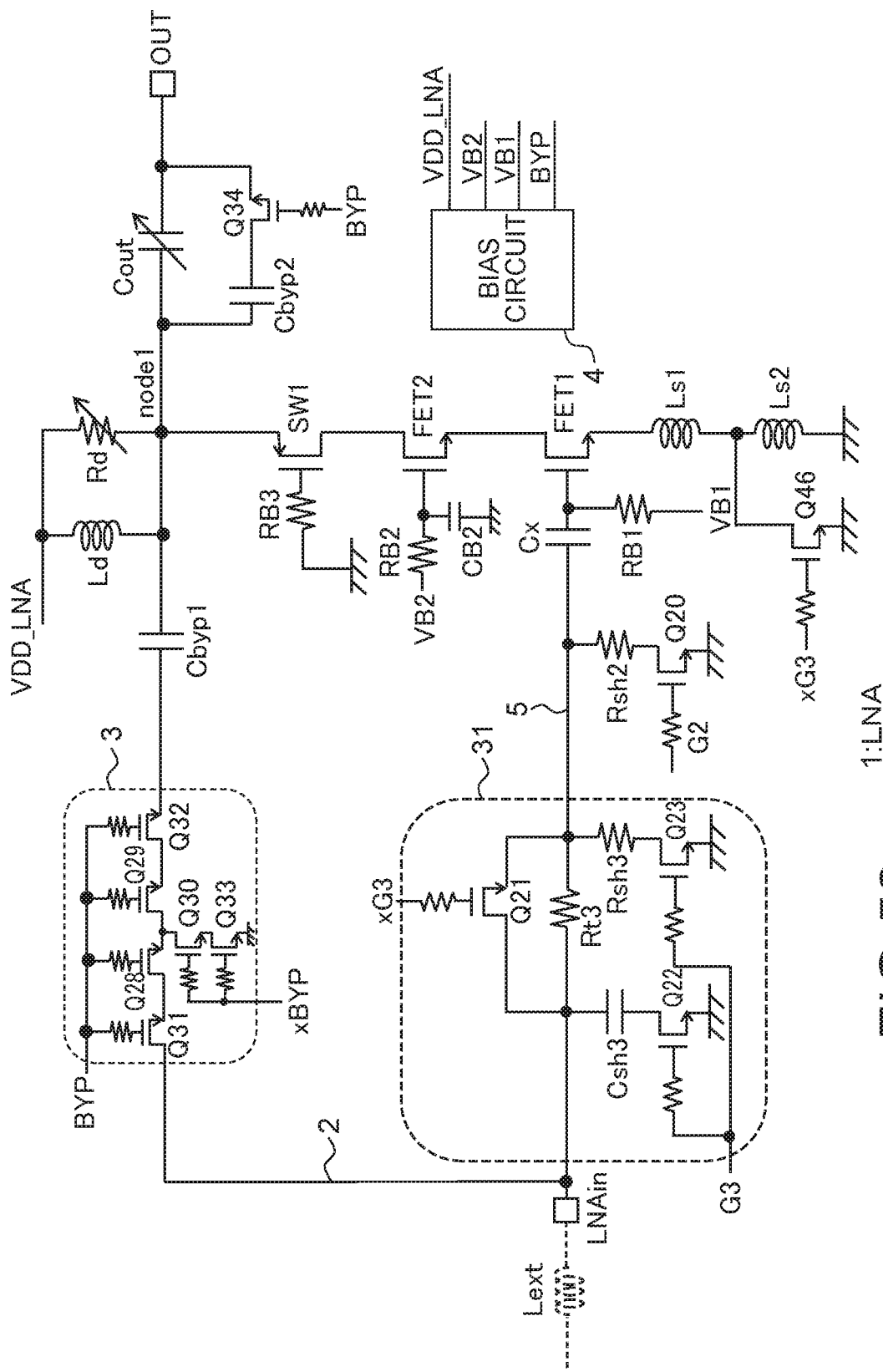
FIG. 52 is a circuit diagram of an LNA according to a first modification example.

The LNA 1 of FIG. 40 can be variously changed. FIG. 52 is a circuit diagram of an LNA 1 according to a first modification example. The LNA 1 of FIG. 52 is obtained by dividing the first inductor Ls into a third inductor Ls1 and a fourth inductor Ls2. One end of the third inductor Ls1 is connected to the source of the transistor FET1. The fourth inductor Ls2 is connected between the other end of the third inductor Ls1 and the first reference potential node GND. The LNA 1 of FIG. 52 includes a transistor (tenth transistor) Q46 for switching whether or not to bypass the fourth inductor Ls2. The transistor Q46 is turned on in modes other than the fourth gain G3 mode, and is turned off in the fourth gain G3 mode. In the modes other than the fourth gain G3 mode, since the fourth inductor Ls2 is bypassed, only the third inductor Ls1 is connected between the source of the transistor FET1 and the first reference potential node GND. In the fourth gain G3 mode, the third inductor Ls1 and the fourth inductor Ls2 are connected between the source of the transistor FET1 and the first reference potential node GND. As described above, in the LNA 1 of FIG. 52, the inductance of the first inductor Ls in the fourth gain G3 mode is larger than those in the other modes. Accordingly, the gain in the fourth gain G3 mode can be sufficiently reduced without lowering the IIP3 and the noise figure NF in the fourth gain G3 mode.

The variable resistive element Rd and the variable capacitor Cout in the LNA 1 of FIG. 52 can be the variable resistive element Rd and the variable capacitor of FIG. 41.

Figure 53:
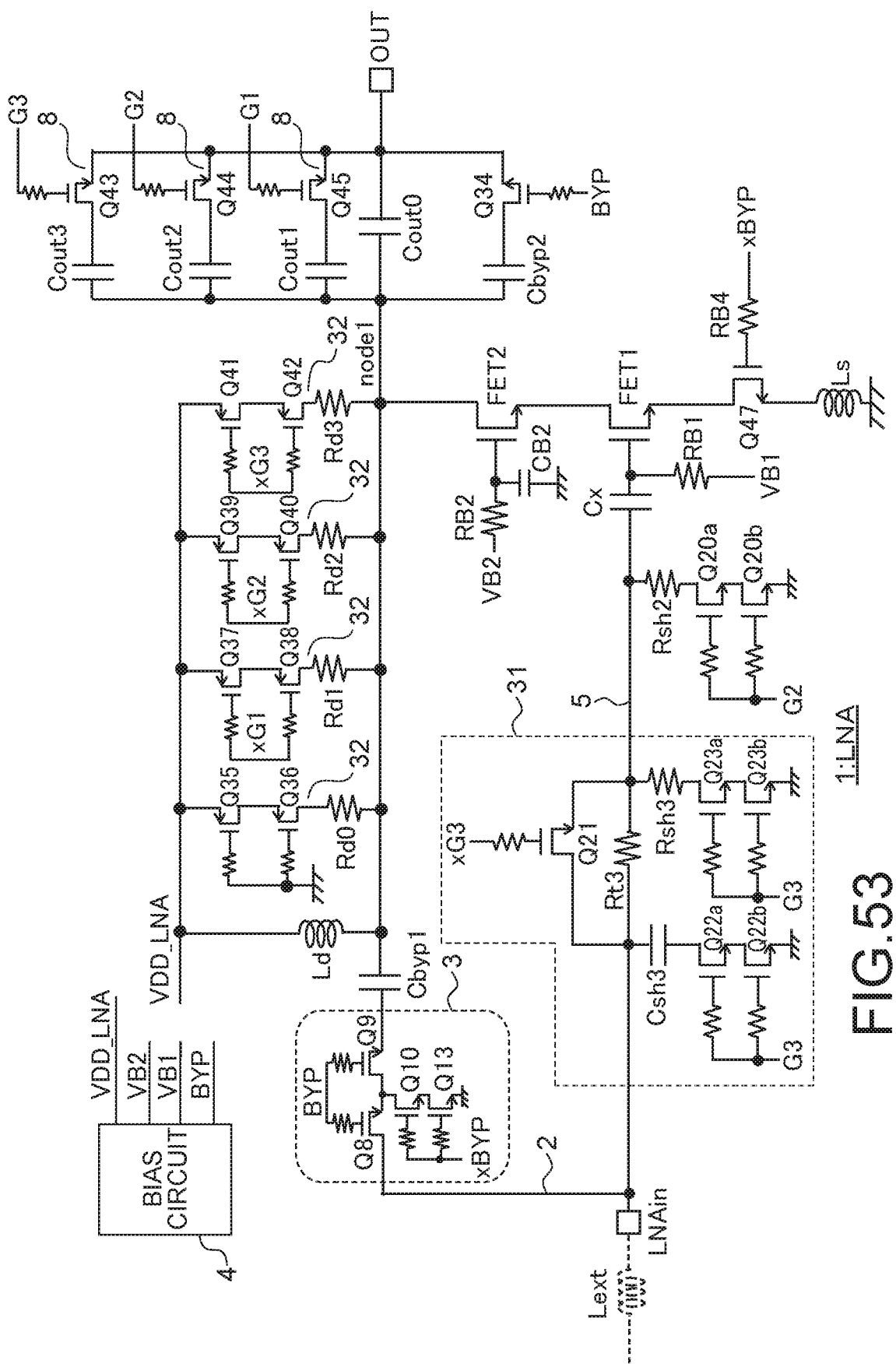
FIG. 53 is a circuit diagram of an LNA according to a second modification example.

FIG. 53 is a circuit diagram of an LNA 1 according to a second modification example. The LNA 1 of FIG. 53 includes an N-type MOS transistor (sixth transistor) Q47 instead of the transistor SW1 in the LNA 1 of FIG. 40. The transistor Q47 is connected between the source of the transistor FET1 and the first inductor Ls. The xBYP signal is input to the gate of the transistor Q47 via the resistive element RB4. The xBYP signal is a signal which is at a high level in the modes other than the bypass mode. Thus, in the first to fourth gain G0 to G3 modes other than the bypass mode, the transistor Q47 is turned on, and the source of the transistor FET1 and one end of the first inductor Ls are connected. Meanwhile, in the bypass mode, the transistor Q47 is turned off, and the source of the transistor FET1 and the first inductor Ls are disconnected. Accordingly, in the bypass mode, the signal path from the transistor FET2 to the first reference potential node GND through the transistor FET1 and the first inductor Ls is disconnected. Therefore, according to the LNA 1 of FIG. 53, IP1 dB in the bypass mode can be improved.

The attenuator 31 of FIG. 53 is configured such that the transistors Q22 and Q23 of the attenuator 31 of FIG. 40 are replaced with two-stage transistors Q22a and Q22b and two-stage transistors Q23a and Q23b, respectively. Similarly, in the LNA 1 of FIG. 53, the shunt resistor Q20 of FIG. 40 is replaced with two-stage shunt resistors Q20a and Q20b. The reason why these transistors are at two stages is that IP1 dB is improved. When it is not necessary to improve IP1 dB, the attenuator 31 and the shunt resistor Q4 may have the same configurations as those of FIG. 40. In the LNA 1 of FIG. 53, the variable resistor Rd has the same configuration as that of FIG. 41. The bypass switching circuit 3 of FIG. 53 has a configuration in which the transistors Q31 and Q32 are omitted from the bypass switching circuit 3 of FIG. 40, but these transistors Q31 and Q32 may be added.

As stated above, since the LNA 1 according to the eleventh embodiment connects the attenuator 31 on the input signal path 5 of the high-frequency input signal and the attenuator 31 attenuates the high-frequency input signal in the fourth gain G3 mode, the gain in the fourth gain G3 mode can be sufficiently reduced without deteriorating electrical characteristics such as S11, IIP3, and noise figure NF, and the signal having the gain satisfying the specification in the fourth gain G3 mode can be output. In particular, the capacitor Csh3 is connected between the input signal path 5 between the input node LNAin and the resistive element Rt3 and the first reference potential node GND within the attenuator 31 in the fourth gain G3 mode, and thus, S11 in the fourth gain G3 mode can be improved.

The first inductor Ls is divided into the third inductor Ls1 and the fourth inductor Ls2, and the fourth inductor Ls2 is connected to the third inductor Ls1 only in the fourth gain G3 mode. Thus, the inductance of the first inductor Ls in the fourth gain G3 mode can be sufficiently increased, and the gain can be further reduced.

The transistor SW1 or the transistor Q47 is provided, and thus, the signal path from the transistor FET2 to the first inductor Ls through the transistor FET1 can be disconnected in the bypass mode. Even though the high-frequency input signal having the large amplitude is input in the bypass mode, there is no concern that the transistors FET1 and FET2 perform an amplification operation, and thus, IP1 dB can be improved.

Since the bypass switching circuit 3 that propagates the high-frequency input signal to the output node OUT as it is in the bypass mode and disconnects the high-frequency input signal in the first to fourth gain G0 to G3 modes is provided on the bypass path 2, the high-frequency input signal is not affected by the bypass path 2 in the first to fourth gain G0 to G3 modes.

Since the plurality of variable resistor circuits 32 corresponding to the gain modes is connected in parallel with the second inductor Ld, an optimum resistance value can be set for each gain mode. Similarly, since the plurality of variable capacitor circuits 33 corresponding to the gain modes is connected in parallel with the capacitor Cout0, an optimum capacity can be set for each gain mode.

Twelfth Embodiment

Although the LNA 1 according to the eleventh embodiment has the bypass mode, an LNA 1 that does not have the bypass mode is also considered.

Figure 54:
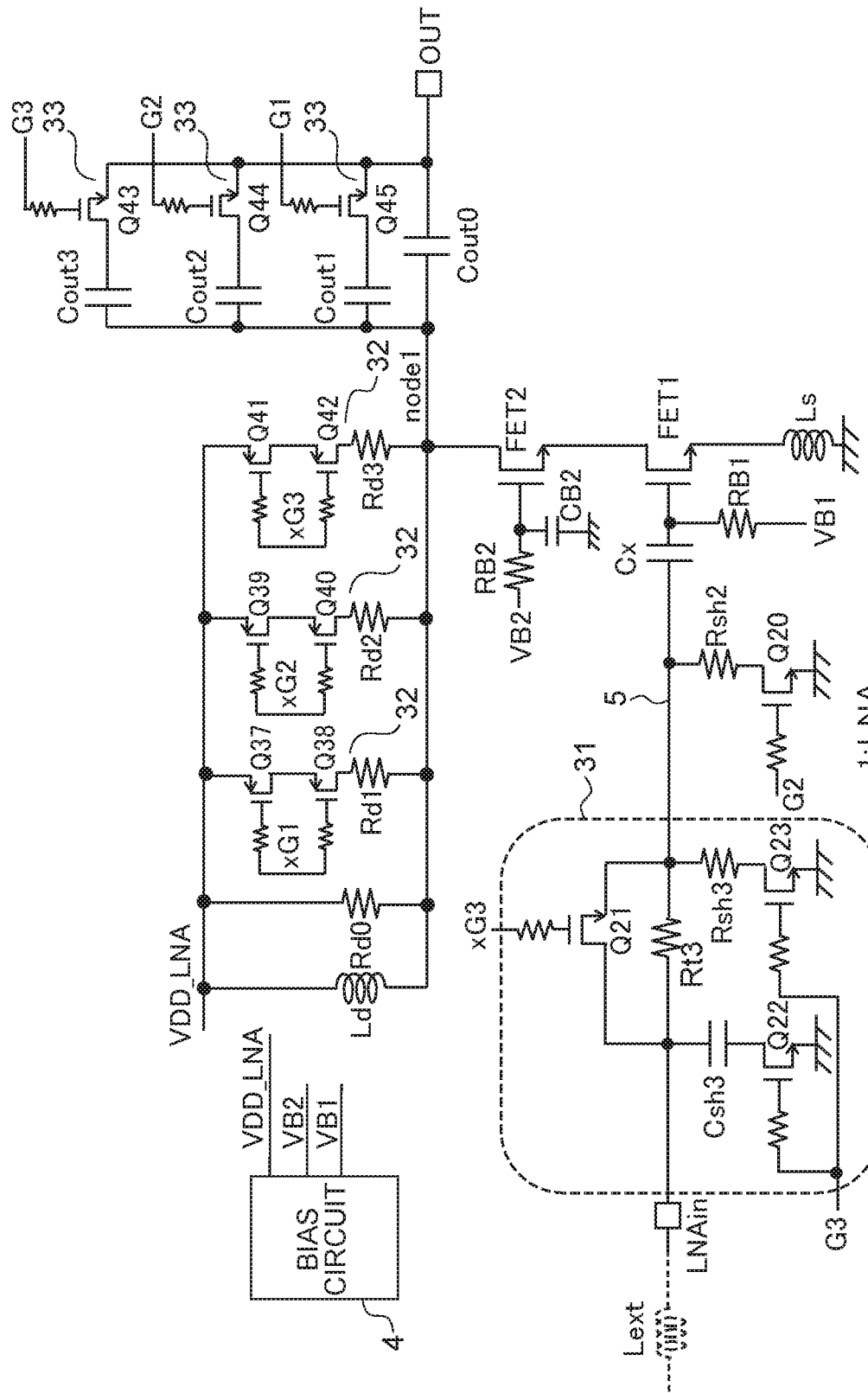
FIG. 54 is a circuit diagram of an LNA according to a twelfth embodiment.

FIG. 54 is a circuit diagram of the LNA 1 according to a twelfth embodiment. The LNA 1 of FIG. 54 does not have the bypass mode and the bypass path. In FIG. 54, the same reference numerals will be assigned to the components common to those in FIGS. 1 and 41, and differences will be mainly described below.

The LNA 1 of FIG. 54 has a circuit configuration in which the bypass path 2, the bypass switching circuit 3, and the capacitors Cbyp1 and Cbyp2 in the LNA 1 of FIGS. 40 and 41 are omitted. The LNA 1 of FIG. 54 does not have the bypass mode, but has the first to fourth gain G0 to G3 modes. The gate voltages of the transistors in the gain modes are the same as those of FIG. 42.

The LNA 1 of FIG. 54 includes the same attenuator 31 as that of the LNA 1 of FIG. 40, and the high-frequency input signal is attenuated by the attenuator 31 and then input to the gate of the transistor FET1 in the fourth gain G3 mode. Accordingly, the gain in the fourth gain G3 mode can be sufficiently reduced without deteriorating the electrical characteristics such as S11, IIP3, and noise figure.

Figure 55:
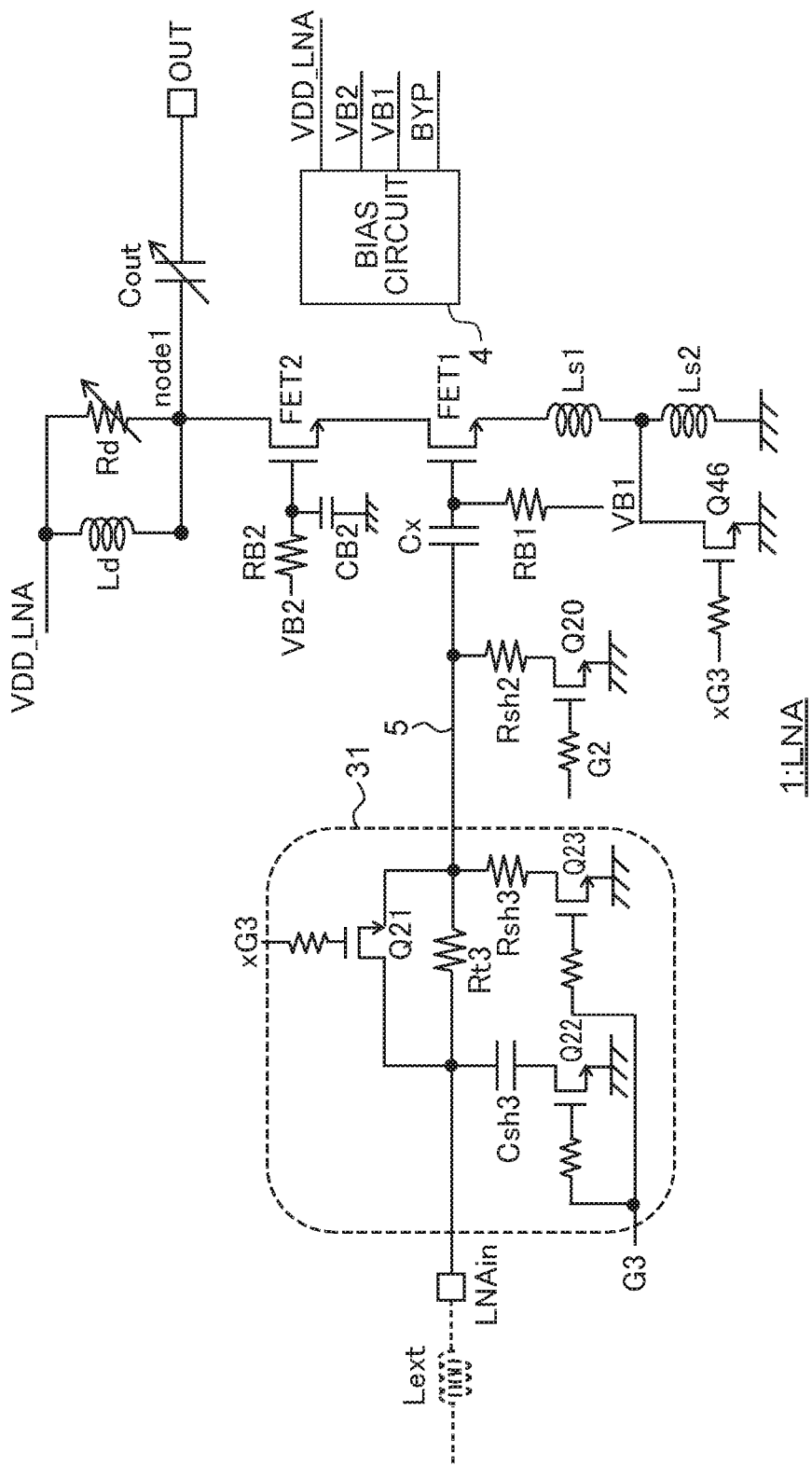
FIG. 55 is a circuit diagram of an LNA according to a modification example of FIG. 54.

FIG. 55 is a circuit diagram of an LNA 1 according to a modification example of FIG. 54. As in FIG. 52, the LNA 1 of FIG. 55 divides the first inductor Ls into the third inductor Ls1 and the fourth inductor Ls2, and the fourth inductor Ls2 is enabled only in the fourth gain G3 mode. Accordingly, the inductance of the first inductor Ls in the fourth gain G3 mode can be increased, and the gain in the fourth gain G3 mode can be further reduced.

The transistors Q22 and Q23 within the attenuator 31 of FIGS. 54 and 55 and the transistor Q20 connected to the shunt resistor Rsh2 may have a two-stage configuration as that in FIG. 53, and IP1 dB may be improved. The variable resistor Rd and the variable capacitor Cout of FIG. 55 may have the same configurations as those of FIG. 41.

FIG. 56 is a diagram illustrating various values set to the LNA 1 of FIG. 55 in the first to fourth gain G0 to G3 modes. In FIG. 56, the capacitance of the variable capacitor Cout in the first and second gain G0 and G1 modes is 0.65 [pF], and the capacitance of the variable capacitor Cout in the third and fourth gain G2 and G3 modes is 0.80 [pF]. The resistance value of the variable resistive element Rd is set to different values in the first to fourth gain G0 to G3 modes. Values illustrated in FIG. 56 are examples, and can be arbitrarily changed.

As described above, since the LNA 1 according to the twelfth embodiment does not have the bypass mode but includes the attenuator 31 connected to the input signal path 5 as in the eleventh embodiment, the gain can be sufficiently reduced in the fourth gain G3 mode without lowering IIP3.

Thirteenth Embodiment

Figure 57:
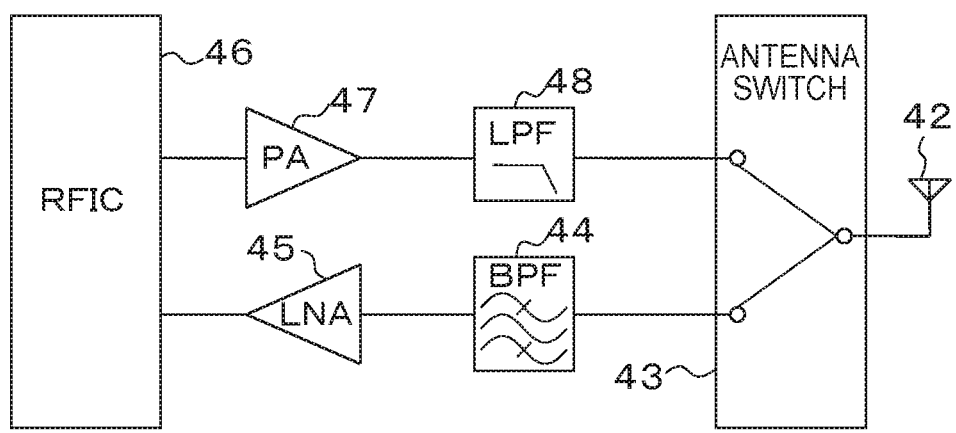
FIG. 57 is a block diagram illustrating a schematic configuration of a wireless device having the LNA according to the first to twelfth embodiments built therein.

The LNA 1 according to the first to twelfth embodiments can be built in the wireless device. FIG. 57 is a block diagram illustrating a schematic configuration of a wireless device 41 having the LNA 1 according to the first to twelfth embodiments built therein. The wireless device 41 of FIG. 57 includes an antenna 42, an antenna switch 43, a band pass filter (BPF) 44, an LNA 45, a radio IC (RFIC) 46, a power amplifier (PA) 47, and a low pass filter (LPF) 48.

The LNA 45 of FIG. 57 has the same circuit configuration as that of the LNA 1 according to the first to twelfth embodiments.

The antenna switch 43 is a switch for switching between transmission and reception. Although an example in which the transmission side and the reception side each have one system is illustrated in FIG. 57, the transmission side and the reception side may each have a plurality of systems that transmit and receive signals in a plurality of frequency bands. The antenna switch 43 and the LNA 45 of FIG. 57 can be arranged on the same SOI substrate, and can be made into one chip. The antenna switch 43 and the LNA 45 are arranged on the SOI substrate, and thus, the power consumption can be reduced and the size can be reduced.

As described above, the LNA 1 according to the first or second embodiment is formed on the SOI substrate, and thus, the parasitic capacitance of the MOS transistor can be reduced. Accordingly, the power loss of the high-frequency signal can be reduced. Since not only the LNA 45 but also the antenna switch 43 can be formed on the SOI substrate, the LNA 45 and the antenna switch 43 can be integrated into one chip, and the size of the wireless device can be reduced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A high-frequency amplifier circuit comprising:
a source-grounded first transistor that amplifies a high-frequency input signal at the time of selecting a first mode;

a gate-grounded second transistor that further amplifies the signal amplified by the first transistor;

a first inductor that is connected between a source of the first transistor and a first reference voltage node;

a second inductor that is connected between a first node through which the signal amplified by the second transistor passes and a second reference voltage node at the time of selecting the first mode;

a third transistor that is connected between the first node and a drain of the second transistor, is turned on at the time of selecting the first mode to transmit the signal amplified by the second transistor to the first node, and is turned off at the time of selecting a second mode to disconnect the first node from the drain of the second transistor;

a bypass path that bypasses the high-frequency input signal from an input node of the high-frequency input signal to the first node at the time of selecting the second mode; and a bypass switching circuit that is connected on the bypass path, blocks the high-frequency input signal from the bypass path at the time of selecting the first mode, and conducts the high-frequency input signal onto the bypass path at the time of selecting the second mode, wherein the bypass switching circuit comprises a fourth transistor and a fifth transistor that are cascode-connected on the bypass path, and a sixth transistor that is connected between a connection node between the fourth transistor and the fifth transistor, and the first reference voltage node, the fourth transistor and the fifth transistor are turned off at the time of selecting the first mode, and are turned on at the time of selecting the second mode, and the sixth transistor is turned on at the time of selecting the first mode, and is turned off at the time of selecting the second mode.

2. The high-frequency amplifier circuit according to claim 1, further comprising:

a first capacitor that is connected between the first node and an output node;

a second capacitor that is connected in parallel with the first capacitor at the time of selecting the second mode, and is disconnected from the first capacitor at the time of selecting the first mode; and a third capacitor that is connected on the bypass path, wherein capacitances of the first, second, and third capacitors are set such that a value obtained by dividing the capacitance of the third capacitor by a total capacitance of the first capacitor and the second capacitor falls within a predetermined range.

3. The high-frequency amplifier circuit according to claim 1, wherein the fourth transistor is connected between the input node of the high-frequency input signal and a connection node between the fifth transistor and the sixth transistor, and a gate width of the fourth transistor is larger than a gate width of the fifth transistor.

4. The high-frequency amplifier circuit according to claim 3, further comprising:

an ESD protection circuit of which one end is connected to an input signal path between the input node of the high-frequency input signal and a gate of the first transistor and the other end is connected to a connection node between the source of the first transistor and one end of the first inductor.

5. The high-frequency amplifier circuit according to claim 1, wherein the first transistor, the second transistor, and an attenuator are arranged on a silicon on insulator (SOI) substrate.

6. A high-frequency amplifier circuit comprising:

a first amplifier that amplifies a high-frequency input signal to output the amplified high-frequency input signal from a first output node via a first node at the time of selecting a first mode;

a second amplifier that amplifies the high-frequency input signal to output the amplified high-frequency input signal from a second output node via a second node at the time of selecting the first mode;

a bypass path that bypasses the high-frequency input signal from an input node of the high-frequency input signal to the first node and the second node at the time of selecting a second node; and a bypass switching circuit that is connected on the bypass path, blocks the high-frequency input signal at the time of selecting the first mode, and conducts the high-frequency input signal onto the bypass path at the time of selecting the second mode, wherein the first amplifier comprises a source-grounded first transistor that amplifies the high-frequency input signal, a gate-grounded second transistor that further amplifies the signal amplified by the first transistor, a first inductor that is connected between a source of the first transistor and a first reference voltage node, a second inductor that is connected between a drain of the second transistor and a second reference voltage node, and a third transistor that is connected on a signal path from the first node to the first reference voltage node, is turned on at the time of selecting the first mode, and is turned off at the time of selecting the second mode, the second amplifier comprises a source-grounded fourth transistor that amplifies the high-frequency input signal, a gate-grounded fifth transistor that further amplifies the signal amplified by the third transistor, a third inductor that is connected between a source of the third transistor and the first reference voltage node, a fourth inductor that is connected between a drain of the fourth transistor and the second reference voltage node, and a sixth transistor that is connected on a signal path from the second node to the first reference voltage node, is turned on at the time of selecting the first mode, and is turned off at the time of selecting the second mode, and the bypass switching circuit comprises a seventh transistor that is connected between the input node of the high-frequency input signal and a third node, is turned off at the time of selecting the first mode, and is turned on at the time of selecting the second mode, an eighth transistor that is connected between the third node and the first node, is turned off at the time of selecting the first mode, and is turned on at the time of selecting the second mode, a ninth transistor that is connected between the third node and the second node, is turned off at the time of selecting the first mode, and is turned on at the time of selecting the second mode, and a tenth transistor that is connected between the third node and the first reference voltage node, is turned on at the time of selecting the first mode, and is turned off at the time of selecting the second mode.

7. The high-frequency amplifier circuit according to claim 6, further comprising:
a first capacitor that is connected between the first node and the first output node;
a second capacitor that is connected in parallel with the first capacitor at the time of selecting the second mode;
a third capacitor that is connected between the second node and the second output node;
a fourth capacitor that is connected in parallel with the third capacitor at the time of selecting the second mode;
an eleventh transistor that connects the second capacitor with the first capacitor in parallel at the time of selecting the second mode, and disconnects the second capacitor from the first capacitor at the time of selecting the first mode; and
a twelfth transistor that connects the fourth capacitor with the third capacitor in parallel at the time of selecting the second mode, and disconnects the fourth capacitor from the third capacitor at the time of selecting the first mode,
wherein the first mode comprises a single output gain mode for outputting the high-frequency amplified signal from the first output node or the second output node, and a split gain mode for outputting the high-frequency amplified signal from the first output node and the second output node, and
in the second mode, the high-frequency input signal that has passed through the bypass path is output from the first output node or the second output node.

8. The high-frequency amplifier circuit according to claim 7,
wherein the second mode comprises a single output bypass mode for outputting the high-frequency input signal that has passed through the bypass path from the first output node or the second output node, and a split output bypass mode for outputting the high-frequency input signal that has passed through the bypass path from the first output node and the second output node, and
the high-frequency amplifier circuit further comprises
a first resistive element and a fifth capacitor connected in series between the first node and the second node at the time of selecting the split gain mode, and
a second resistive element and a sixth capacitor connected in series between the first node and the second node at the time of selecting the split output bypass mode.

9. The high-frequency amplifier circuit according to claim 6,
wherein the first amplifier comprises a thirteenth transistor that is connected on the signal path from the first node to the first reference voltage node, is turned on at the time of selecting the first mode, and is turned off at the time of selecting the second mode,
the second amplifier comprises a fourteenth transistor that is connected on the signal path from the first node to the first reference voltage node, is turned on at the time of selecting the first mode, and is turned off at the time of selecting the second mode,
the third transistor is connected between the source of the first transistor and the first inductor,
the thirteenth transistor is connected between the drain of the second transistor and the first node,
the sixth transistor is connected between a source of the fourth transistor and the first inductor, and
the fourteenth transistor is connected between a drain of the fifth transistor and the first node.

10. A high-frequency amplifier circuit comprising:
a source-grounded first transistor that amplifies a high-frequency input signal;
a gate-grounded second transistor that further amplifies the signal amplified by the first transistor;
a first inductor that is connected between a source of the first transistor and a first reference potential node;
a second inductor that is connected between a drain of the second transistor and a second reference potential node;
a first capacitor that is connected between the drain of the second transistor and an output node of the high-frequency amplifier circuit; and
an attenuator that is connected on an input signal path connected to a gate of the first transistor, attenuates the high-frequency input signal in a predetermined gain mode, and transmits the high-frequency input signal in a gain mode other than the predetermined gain mode without attenuating the high-frequency input signal,
wherein the attenuator comprises
a first resistive element that is connected on the input signal path in the predetermined gain mode,
a second capacitor that is connected between the input signal path between an input node of the high-frequency input signal and one end of the first resistive element and the first reference potential node in the predetermined gain mode, and
a second resistive element that is connected between the input signal path between the other end of the first resistive element and the gate of the first transistor and the first reference potential node in the predetermined gain mode.

11. The high-frequency amplifier circuit according to claim 10,
wherein the attenuator bypasses the first resistive element and disconnects the second capacitor and the second resistive element from the input signal path in a gain mode having a gain higher than a gain of the predetermined gain mode.

12. The high-frequency amplifier circuit according to claim 10,
wherein the attenuator comprises
a third transistor that switches whether or not to bypass the first resistive element,
a fourth transistor that switches whether or not to connect the second capacitor between the input signal path and the first reference potential node, and
a fifth transistor that switches whether or not to connect the second resistive element between an input signal path from the first resistive element to the gate of the first transistor and the first reference potential node, and
the third to fifth transistors are turned on or off depending on whether the mode is the predetermined gain mode.

13. The high-frequency amplifier circuit according to claim 10, further comprising:
a bypass path that bypasses the high-frequency input signal from the input node to the output node via a connection node between the second inductor and the first capacitor such that the high-frequency input signal is not amplified by the first transistor and the second transistor in a bypass mode, and
a sixth transistor that disconnects a signal path that extends to the first reference potential node through the drain and a source of the second transistor and a drain and the source of the first transistor in the bypass mode.

14. The high-frequency amplifier circuit according to claim 13,
  wherein the sixth transistor is connected between the second inductor and the drain of the second transistor, disconnects a connection path between the second inductor and the drain of the second transistor in the bypass mode, and conducts the connection path in a gain mode other than the bypass mode.

15. The high-frequency amplifier circuit according to claim 13,
  wherein the sixth transistor is connected between the source of the first transistor and the first reference potential node, disconnects a connection path between the source of the first transistor and the first reference potential node in the bypass mode, and conducts the connection path in a mode other than the bypass mode.

16. The high-frequency amplifier circuit according to claim 13, further comprising:
  a bypass switching circuit that bypasses the high-frequency input signal from the input node to a connection node between the second inductor and the first capacitor without amplifying the high-frequency input signal in the bypass mode, and disconnects the bypass path from the output node in a gain mode other than the bypass mode.

17. The high-frequency amplifier circuit according to claim 16,
  wherein the bypass switching circuit comprises
  a seventh transistor and an eighth transistor that are cascode-connected on the bypass path, and
  a ninth transistor that is connected between a connection node between the seventh transistor and the eighth transistor and the first reference potential node,
  the seventh transistor and the eighth transistor are turned off in the gain mode other than the bypass mode, and are turned on in the bypass mode, and
  the ninth transistor is turned on in the gain mode other than the bypass mode, and is turned off in the bypass mode.

18. The high-frequency amplifier circuit according to claim 13,
  wherein the first inductor comprises
  a third inductor of which one end is connected to the source of the first transistor, and
  a fourth inductor that is connected between the other end of the third inductor and the first reference potential node, and
  the high-frequency amplifier circuit further comprises
  a tenth transistor that connects the third inductor and the fourth inductor between the source of the first transistor and the first reference potential node in series in the predetermined gain mode, and bypasses both ends of the fourth inductor in gain modes other than the predetermined gain mode.

19. The high-frequency amplifier circuit according to claim 10, further comprising:
  a plurality of resistive elements that is capable of being connected with the second inductor in parallel and has different resistance values; and
  a plurality of first switch circuits that is connected with the plurality of resistive elements in series, and each switches whether or not to connect the corresponding resistive element with the second inductor in parallel,
  wherein the plurality of first switch circuits is switched according to a gain mode to be selected.

20. The high-frequency amplifier circuit according to claim 10, further comprising:
  a plurality of capacitors that is capable of being connected with the first capacitor in parallel, and has different capacitance; and
  a plurality of second switch circuits that is connected with the plurality of capacitors in series, and each switches whether or not to connect the corresponding capacitor with the first capacitor in parallel,
  wherein the plurality of second switch circuits are switched according to a gain mode to be selected.

* * * * *